(12) United States Patent
Matsumura et al.

(10) Patent No.: US 9,633,755 B2
(45) Date of Patent: Apr. 25, 2017

(54) CONDUCTIVE COMPOSITION, CONDUCTIVE MEMBER, CONDUCTIVE MEMBER PRODUCTION METHOD, TOUCH PANEL, AND SOLAR CELL

(71) Applicant: FUJIFILM Corporation, Minato-ku, Tokyo (JP)

(72) Inventors: Tokihiko Matsumura, Ashigarakami-gun (JP); Toyohisa Oya, Ashigarakami-gun (JP); Kazushi Furukawa, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 102 days.

(21) Appl. No.: 14/492,881

(22) Filed: Sep. 22, 2014

(65) Prior Publication Data
US 2015/0013764 A1 Jan. 15, 2015

Related U.S. Application Data

(63) Continuation of application No. PCT/JP2013/057992, filed on Mar. 21, 2013.

(30) Foreign Application Priority Data

Mar. 23, 2012 (JP) ................................. 2012-068272

(51) Int. Cl.
*H01B 1/22* (2006.01)
*C09D 7/12* (2006.01)
(Continued)

(52) U.S. Cl.
CPC ............... *H01B 1/22* (2013.01); *C08J 7/042* (2013.01); *C09D 5/24* (2013.01); *C09D 7/1216* (2013.01); *C09D 7/1291* (2013.01); *C23F 1/02* (2013.01); *H01B 13/0026* (2013.01); *H01B 13/0036* (2013.01); *H01L 31/022466* (2013.01); *H01L 31/1884* (2013.01); *C08J 7/123* (2013.01); *C08J 2367/02* (2013.01); *C08J 2400/14* (2013.01); *C08J 2429/04* (2013.01);
(Continued)

(58) Field of Classification Search
CPC .. H01B 1/22; H01B 13/0036; H01B 13/0026; H01L 31/022466; C23F 1/02
USPC ................. 252/514, 512; 136/256; 427/123; 216/13; 428/323, 208
See application file for complete search history.

(56) References Cited

U.S. PATENT DOCUMENTS 5,593,618 A * 1/1997 Okoniewski ........ D06M 10/025
252/512
7,955,656 B2 * 6/2011 Murayama ............... B05D 5/04
427/385.5
(Continued)

FOREIGN PATENT DOCUMENTS

CN 101233239 A 7/2008
JP 2006-035771 A 2/2006
(Continued)

OTHER PUBLICATIONS

Translation of JP20122-009383, Jan. 12, 2012.*
(Continued)

*Primary Examiner* — Douglas McGinty
(74) *Attorney, Agent, or Firm* — Sughrue Mion, PLLC

(57) ABSTRACT

The conductive composition contains at least (a) conductive metal fibers, and (b) at least one compound selected from a compound represented by the following Formula (1), a compound represented by the following Formula (2), and a compound having a partial structure represented by the following Formula (3). Each of $R^1$ and $R^2$ independently represents a hydrogen atom, an alkyl group, an alkenyl group, an aryl group, an acyl group, an aryloxycarbonyl group, an alkoxycarbonyl group, or a carbamoyl group. Each of $R^3$, $R^4$, $R^5$, $R^6$, $R^8$, $R^9$, $R^{10}$, and $R^{11}$ independently represents an alkyl group having 1 to 4 carbon atoms, and $R^7$ represents a hydrogen atom or a substituent. $R^{12}$ represents an alkyl group, an alkoxy group, an acyl group, or a hydrogen atom. * represents a bond.

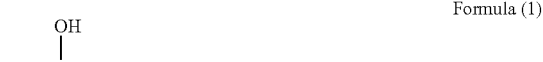

Formula (1)

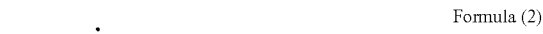

Formula (2)

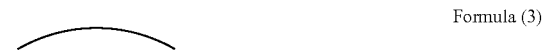

Formula (3)

27 Claims, 8 Drawing Sheets

(51) Int. Cl.

| | |
|---|---|
| *H01L 31/0224* | (2006.01) |
| *H01L 31/18* | (2006.01) |
| *C09D 5/24* | (2006.01) |
| *C23F 1/02* | (2006.01) |
| *H01B 13/00* | (2006.01) |
| *C08J 7/04* | (2006.01) |
| *C08K 5/32* | (2006.01) |
| *C08K 5/3435* | (2006.01) |
| *C08K 7/06* | (2006.01) |
| *C08K 5/1535* | (2006.01) |
| *C08K 5/3445* | (2006.01) |
| *C08K 5/51* | (2006.01) |
| *C08J 7/12* | (2006.01) |

(52) U.S. Cl.
CPC ......... *C08J 2483/04* (2013.01); *C08K 5/1535* (2013.01); *C08K 5/32* (2013.01); *C08K 5/3435* (2013.01); *C08K 5/3445* (2013.01); *C08K 5/51* (2013.01); *C08K 7/06* (2013.01); *C08K 2201/001* (2013.01); *Y02E 10/50* (2013.01); *Y02P 70/521* (2015.11); *Y10T 428/24909* (2015.01); *Y10T 428/25* (2015.01)

(56) References Cited

U.S. PATENT DOCUMENTS

| | | | | |
|---|---|---|---|---|
| 9,070,488 | B2 * | 6/2015 | Ikada | B32B 15/08 |
| 9,343,594 | B2 * | 5/2016 | Oya | H01B 1/22 |
| 2003/0153535 | A1 * | 8/2003 | Ames | A61K 31/13 |
| | | | | 514/114 |
| 2004/0102420 | A1 * | 5/2004 | Ames | A61K 31/13 |
| | | | | 514/150 |
| 2004/0110729 | A1 * | 6/2004 | Ames | A61K 31/13 |
| | | | | 514/150 |
| 2004/0134873 | A1 * | 7/2004 | Yao | C09G 1/02 |
| | | | | 216/2 |
| 2008/0200631 | A1 | 8/2008 | Haring et al. | |
| 2008/0292800 | A1 * | 11/2008 | Murayama | B05D 5/04 |
| | | | | 427/385.5 |
| 2010/0078197 | A1 | 4/2010 | Miyagishima et al. | |
| 2011/0088770 | A1 | 4/2011 | Allemand et al. | |
| 2011/0195877 | A1 * | 8/2011 | Adderson | C04B 35/10 |
| | | | | 507/269 |
| 2011/0285019 | A1 | 11/2011 | Alden et al. | |
| 2014/0202531 | A1 * | 7/2014 | Oya | H01B 1/22 |
| | | | | 136/256 |
| 2014/0203223 | A1 * | 7/2014 | Ikada | B32B 15/08 |
| | | | | 252/514 |
| 2015/0009432 | A1 * | 1/2015 | Katagiri | G06F 3/041 |
| | | | | 349/12 |

FOREIGN PATENT DOCUMENTS

| | | | |
|---|---|---|---|
| JP | 2009-505358 A | 2/2009 | |
| JP | 2009-146678 A | 7/2009 | |
| JP | 2009-251186 A | 10/2009 | |
| JP | 2010-044968 A | 2/2010 | |
| JP | 2010-507199 A | 3/2010 | |
| JP | 2010-084173 A | 4/2010 | |
| JP | 2011198642 A | 10/2011 | |
| JP | 2011216468 A | 10/2011 | |
| JP | 2012-009383 A | 1/2012 | |
| JP | 2012022844 A | 2/2012 | |
| JP | WO 2013141277 A1 * | 9/2013 | ........... C09D 201/00 |

OTHER PUBLICATIONS

Notice of First Office Action, dated Jun. 23, 2015, issued in corresponding CN Application No. 201380015734.0, 29 pages in English and Chinese.
Communication dated Jan. 17, 2016, issued by the Korean Intellectual Property Office in corresponding Korean Application No. 10-2014-7026072.
Notice of Reasons for Rejection, mailed Apr. 14, 2015, issued in related foreign case JP Application No. 2013-053304, 8 pages in English and Japanese.
Notice of Reasons for Rejection, dated Jan. 6, 2015, issued in corresponding JP Application No. 2013-053304, 9 pages in English and Japanese.
International Preliminary Report on Patentability and Written Opinion, mailed Sep. 23, 2014, issued in corresponding International Application No. PCT/JP2013/057992, 7 pages in English.
International Search Report for PCT/JP2013/057992 dated Jun. 25, 2013, 5 pages in Japanese and English.
Written Opinion for PCT/JP2013/057992 dated Jun. 25, 2013, 6 pages.

* cited by examiner

CONDUCTIVE COMPOSITION, CONDUCTIVE MEMBER, CONDUCTIVE MEMBER PRODUCTION METHOD, TOUCH PANEL, AND SOLAR CELL

CROSS-REFERENCE TO RELATED APPLICATIONS

This application is a Continuation of PCT International Application No. PCT/JP2013/057992 filed on Mar. 21, 2013, which claims priority under 35 U.S.C §119(a) to Japanese Patent Application No. 2012-068272 filed on Mar. 23, 2012. Each of the above application(s) is hereby expressly incorporated by reference, in its entirety, into the present application.

BACKGROUND OF THE INVENTION

1. Field of the Invention

The present invention relates to a conductive composition, a conductive member, a conductive member production method, a touch panel, and a solar cell.

2. Description of the Related Art

In recent years, as an input device, a touch panel has been mounted on display devices such as a liquid crystal panel and electronic paper. The touch panel is known to be constituted by various systems such as a resistive film system, a surface acoustic wave system, and a capacitive system. Among these, the capacitive system is known as a system that facilitates multipoint touch and makes it easy to produce a large-area touch panel. For example, there is a disclosure regarding a capacitive touch panel using indium tin oxide (ITO) as a transparent conductive material.

However, indium as a raw material of ITO is expensive, and stable supply thereof is limited. Moreover, in order to be made into a thin film, indium requires a vacuum process, and accordingly, the production cost increases. Furthermore, the ITO film has problems in that it is brittle and exhibits poor bending resistance. Therefore, alternative substances such as a metal nanowire, a carbon nanotube, PEDOT, and polyaniline are being suggested.

For example, a conductive member having a conductive layer containing conductive fiber, such as a metal nanowire, a carbon nanotube, and a complex consisting of a carbon nanotube and a metal, has been suggested (for example, see JP2009-505358A). In the conductive member, a conductive layer containing plural metal nanowires is placed on a substrate, and the conductive layer contains a photocurable composition as a matrix. Accordingly, by being subjected to pattern exposure and then development, the conductive member can be easily processed into a conductive member having a conductive layer including an intended conductive region and a non-conductive region.

As another system of the conductive fiber-containing conductive member, it is possible to use a method in which a non-photocurable composition as a matrix is added to a conductive layer, the resultant is dried and/or crosslinked if necessary by a condensation reaction or a polymerization reaction to form a conductive layer, a resist layer is then formed image-wise on the conductive layer by using an etching resist or the like, and then an etching step is performed; a method in which a conductive network in a uniformly formed transparent conductive layer is irradiated with laser beams such that a portion of the network is cut; or the like. By such a method, the conductive member can be easily processed into a conductive member having a conductive layer including an intended conductive region and a non-conductive region (for example, see JP2010-507199A and JP2010-44968A).

Moreover, as another system of the conductive fiber-containing conductive member, a conductive layer transfer-type conductive layer formed in a manner in which a conductive fiber-containing conductive member is formed on a temporary support, transferred to a glass substrate or the like, and subjected to patterning if necessary by a method such as photolithography has been suggested (for example, see JP2006-35771A and JP2009-251186A).

As the conductive fiber preferably used for the conductive member, various materials including a nanowire and a nanorod of metals such as silver, gold, and copper, a carbon nanotube, a carbon nanorod, and a complex of a carbon nanotube and a metal are known. Among these, conductive metal fiber formed of metals such as silver, gold, and copper is known to more preferably form an excellent conductive member having low resistance and a high degree of optical transparency. Particularly, a silver nanowire excellent in the balance among low resistance, durability, and cost is preferably used.

However, when these conductive members using the conductive metal fiber are exposed to harsh conditions such as a high temperature, a high humidity, and the presence of ozone for a long time, increase in resistivity, which is assumed to result from oxidation or deformation of metal, occurs in some cases. Therefore, depending on the purpose, the conductive members are required to be improved in terms of weather resistance in some cases.

As a method for improving weather resistance of a conductive metal fiber-containing transparent conductive material, a method of using a metal-adsorbent compound having a specific structure is known (for example, see JP2009-505358A and JP2009-146678A). This method is effective when the compound is stored under specific conditions. However, since the metal-adsorbent compound exhibits strong absorptivity with respect to the conductive metal fiber, the conductive metal fibers are aggregated during the production of the transparent conductive material, and homogeneity of the conductive layer deteriorates. Consequentially, conductivity or transparency of the conductive layer deteriorates, or contact resistance between the conductive metal fibers increases, and this leads to a problem in that conductivity of the conductive layer deteriorates in some cases.

As a method for producing an aqueous dispersion containing metal nanowires, a method of adding a metal complex solution or metal ion solution to an aqueous solvent containing a halogen compound and a reductant is known (for example, see JP2010-84173A). In the production method, in order to improve purity of the metal nanowires, desalting treatment is preferably performed. Presumably, when the desalting (washing) treatment described in examples of JP2010-84173A is performed, most of the reductant that does not make contribution to formation of the metal nanowires may be removed. In JP2010-84173A, neither a method of intentionally leaving a reductant added for reducing a metal complex nor an effect of such a method is described.

As described above, it cannot be mentioned that the conductivity of the conductive metal fiber-containing transparent conductive material is stably kept to a sufficient degree by the technique in the related art even under harsh conditions such as a high temperature, irradiation of actinic radiation, or the presence of ozone. Therefore, improvement of weather resistance thereof is required.

SUMMARY OF THE INVENTION

An object of the present invention is to provide a conductive metal fiber-containing conductive composition of which the conductivity can be maintained over time even if the composition is exposed to harsh conditions such as a high temperature, irradiation of actinic radiation, or the presence of ozone, a conductive member having a conductive layer containing the conductive composition, a conductive member production method, and a touch panel and a solar cell using the conductive member.

The conductive composition, the conductive member, the touch panel, the solar cell, and the conductive member production method of the present invention for achieving the object are as follows.

The conductive composition of the present invention contains at least (a) conductive metal fibers having an average minor-axis length from 1 nm to 150 nm, and (b) at least one compound selected from a compound represented by the following Formula (1), a compound represented by the following Formula (2), and a compound having a partial structure represented by the following Formula (3).

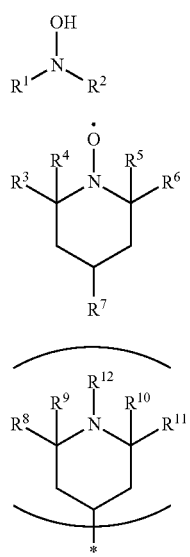

In Formula (1), each of $R^1$ and $R^2$ independently represents a hydrogen atom, an alkyl group, an alkenyl group, an aryl group, an acyl group an aryloxycarbonyl group, an alkoxycarbonyl group, or a carbamoyl group. In Formula (2), each of $R^3$, $R^4$, $R^5$, and $R^6$ independently represents an alkyl group having 1 to 4 carbon atoms, and $R^7$ represents a hydrogen atom or a substituent. In Formula (3), each of $R^8$, $R^9$, $R^{10}$, and independently represents an alkyl group having 1 to 4 carbon atoms, and $R^{12}$ represents an alkyl group, an alkoxy group, an acyl group, or a hydrogen atom. In Formula (3), * represents a bond.

The conductive composition preferably further contains (c) a polymerizable compound that can form a matrix.

The (c) polymerizable compound that can form a matrix is preferably a non-photosensitive compound.

The (c) polymerizable compound that can form a matrix is preferably a compound that can form a cured sol-gel substance.

A ratio of content of the (c) polymerizable compound that can form a matrix to the (a) conductive metal fibers ((c)/(a)) is preferably 0.001/1 to 100/1 in terms of a mass ratio.

A content of (b) at least one compound selected from a compound represented by Formula (1), a compound represented by Formula (2), and a compound having a partial structure represented by Formula (3) is preferably from 0.005 mmol to 50 mmol per 1 g of the (a) conductive metal fibers.

In the conductive composition, a molecular weight of the (b) at least one compound selected from a compound represented by Formula (1), a compound represented by Formula (2), and a compound having a partial structure represented by Formula (3) is preferably from 140 to 5,000.

In the conductive composition, at least one of $R^1$ and $R^2$ in Formula (1) is preferably an alkyl group, an alkenyl group, an aryl group, an acyl group, an aryloxycarbonyl group, an alkoxycarbonyl group, or a carbamoyl group.

In the conductive composition, at least one of $R^1$ and $R^2$ in Formula (1) is preferably an alkyl group, an alkenyl group, or an aryl group substituted with at least one group selected from a carboxyl group and an alkali metal salt thereof, a sulfo group and an alkali metal salt thereof, a hydroxyl group, an alkoxy group, an alkoxycarbonyl group, and a carbamoyl group.

The conductive composition preferably further contains at least one kind of the compound represented by the following Formulae (4) to (9).

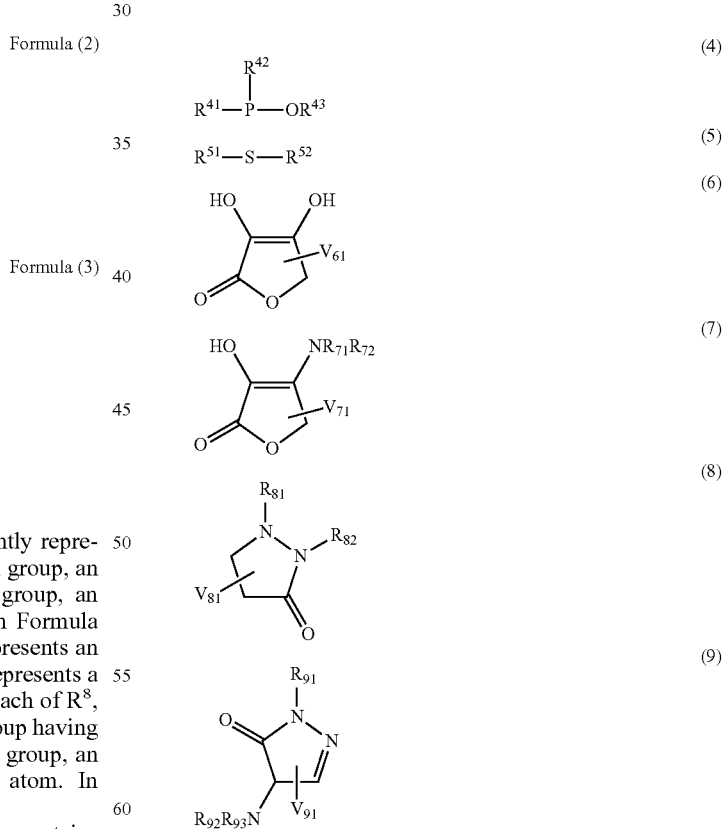

In Formula (4), each of $R^{41}$ and $R^{42}$ independently represents an alkyl group, an aryl group, an alkoxy group, an aryloxy group, or a halogen atom, and $R^{43}$ represents an alkyl group or an aryl group. At least two of the $R^{41}$, $R^{42}$, and $R^{43}$ may be linked to each other through an organic group having a valency of 2 or higher or through a single bond. Moreover, the Formula (4) may include a structure that plural compounds represented by Formula (4) are linked to each other through an organic group having a valency of 2 or higher or through a single bond.

In Formula (5), each of $R^{51}$ and $R^{52}$ independently represents an alkyl group. $R^{51}$ and $R^{52}$ may be linked to each other through an organic group having a valency of 2 or higher or through a single bond. Moreover, the Formula (5) may include a structure that plural compounds represented by Formula (5) are linked to each other through an organic group having a valency of 2 or higher or through a single bond.

In Formula (6), $V_{61}$ represents a hydrogen atom or a substituent.

In Formula (7), $V_{71}$ represents a hydrogen atom or a substituent, and each of $R_{71}$ and $R_{72}$ independently represents a hydrogen atom or a group which can be substituted with a nitrogen atom.

In Formula (8), $V_{81}$ represents a hydrogen atom or a substituent, and each of $R_{81}$ and $R_{82}$ independently represents a hydrogen atom or a group which can be substituted with a nitrogen atom.

In Formula (9), $V_{91}$ represents a hydrogen atom or a substituent. Each of $R_{91}$, $R_{92}$, and $R_{93}$ independently represents a hydrogen atom or a group which can be substituted with a nitrogen atom.

In the conductive composition, the conductive metal fibers preferably contain silver in an amount from 50 mol % to 100 mol %.

In the conductive composition, an average minor-axis length of the conductive metal fibers is from 1 nm to 30 nm.

A conductive member of the present invention has a substrate and a conductive layer which is disposed on the substrate and formed of the conductive composition of the present invention.

The conductive member preferably further has, on the conductive layer, a soluble protective layer containing at least a water-soluble polymer.

In the conductive member, a surface resistivity of the conductive layer is preferably from 1 Ω/square to 1,000 Ω/square.

In the conductive member, the conductive layer preferably has a conductive region and a non-conductive region.

The conductive member preferably further has, between the substrate and the conductive layer, at least one intermediate layer.

A touch panel of the present invention has the conductive member of the present invention.

A solar cell of the present invention has the conductive member of the present invention.

A conductive member production method of the present invention includes a conductive layer formation step of forming a conductive layer by using the conductive composition of the present invention on a substrate, in which the conductive composition contains at least (a) conductive metal fibers having an average minor-axis length from 1 nm to 150 nm and (b) at least one compound selected from a compound represented by the following Formula (1), a compound represented by the following Formula (2), and a compound having a partial structure represented by the following Formula (3).

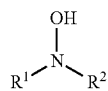

Formula (1)

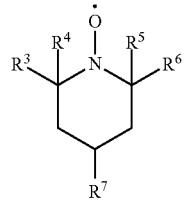

Formula (2)

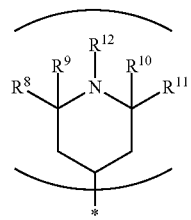

Formula (3)

In Formula (1), each of $R^1$ and $R^2$ independently represents a hydrogen atom, an alkyl group, an alkenyl group, an aryl group, an acyl group an aryloxycarbonyl group, an alkoxycarbonyl group, or a carbamoyl group. In Formula (2), each of $R^3$, $R^4$, $R^5$, and $R^6$ independently represents an alkyl group having 1 to 4 carbon atoms, and $R^7$ represents a hydrogen atom or a substituent. In Formula (3), each of $R^8$, $R^9$, $R^{10}$, and $R^{11}$ independently represents an alkyl group having 1 to 4 carbon atoms, and $R^{12}$ represents an alkyl group, an alkoxy group, an acyl group, or a hydrogen atom. In Formula (3), * represents a bond.

In the conductive layer formation step of the conductive member production method, preferably, the conductive composition, which contains the (a) conductive metal fibers having an average minor-axis length from 1 nm to 150 nm and the (b) at least one compound selected from a compound represented by Formula (1), a compound represented by Formula (2), and a compound having a partial structure represented by Formula (3), is applied onto the substrate, and then (c) a matrix is applied onto the substrate so as to form a conductive layer containing the component (a), the component (b), and the component (c).

In the conductive layer formation step of the conductive member production method, preferably, a conductive composition, which contains the (a) conductive metal fibers having an average minor-axis length from 1 nm to 150 nm, the (b) at least one compound selected from a compound represented by Formula (1), a compound represented by Formula (2), and a compound having a partial structure represented by Formula (3), and the (c) matrix, is applied onto the substrate so as to form a conductive layer containing the component (a), the component (b), and the component (c).

In a conductive member production method of the present invention, (a) conductive metal fibers having an average minor-axis length from 1 nm to 150 nm are applied onto a substrate, and then a composition, which contains (b) at least one compound selected from a compound represented by the following Formula (1), a compound represented by the following Formula (2), and a compound having a partial structure represented by Formula (3), and (c) a matrix, is applied onto the substrate so as to form a conductive layer containing the component (a), the component (b), and the component (c).

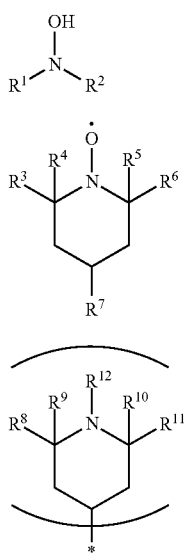

Formula (1)

Formula (2)

Formula (3)

In Formula (1), each of $R^1$ and $R^2$ independently represents a hydrogen atom, an alkyl group, an alkenyl group, an aryl group, an acyl group an aryloxycarbonyl group, an alkoxycarbonyl group, or a carbamoyl group. In Formula (2), each of $R^3$, $R^4$, $R^5$, and $R^6$ independently represents an alkyl group having 1 to 4 carbon atoms, and $R^7$ represents a hydrogen atom or a substituent. In Formula (3), each of $R^5$, $R^9$, $R^{10}$, and independently represents an alkyl group having 1 to 4 carbon atoms, and $R^{12}$ represents an alkyl group, an alkoxy group, an acyl group, or a hydrogen atom. In Formula (3), * represents a bond.

Preferably, a conductive member production method for producing a conductive member having a patterned conductive layer includes at least a step of providing a photoresist layer to the conductive member of the present invention that has the substrate and the conductive layer, a step of forming a photoresist layer in the form of a pattern by exposing the photoresist layer to light in the form of a pattern and developing the photoresist layer, and a step of etching the conductive layer through the photoresist layer in the form of a pattern.

According to the present invention, there are provided a conductive metal fiber-containing conductive composition which can maintain conductivity over time even when the composition is exposed to harsh conditions such as a high-temperature, irradiation of actinic radiation, and the presence of ozone, a conductive member having a conductive layer formed of the conductive composition, a conductive member production method, and a touch panel and a solar cell using the conductive member.

DESCRIPTION OF THE PREFERRED EMBODIMENTS

Figure 1:
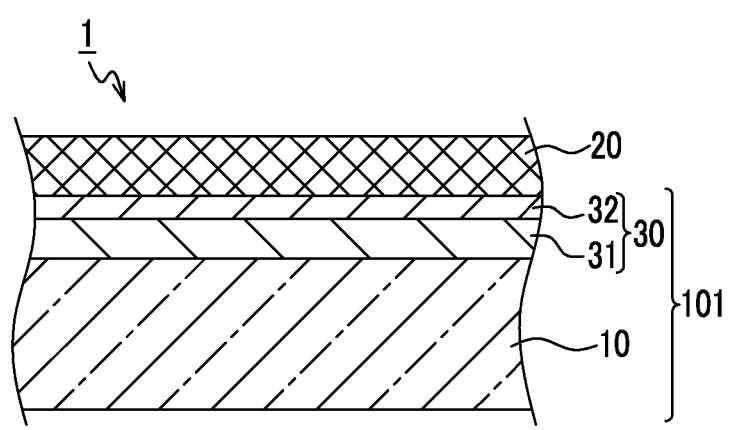
FIG. 1 is a schematic cross-sectional view of a conductive member according to a first embodiment of the present invention.

Hereinafter, the conductive composition of the present invention will be described in detail.

The following description will be made based on typical embodiments of the present invention. However, the present invention is not limited to the described embodiments, within a range that does not depart from the gist of the present invention.

Moreover, in the present specification, a range of numerical values described using "to" means a range that has numerical values listed before and after "to" as a lower limit and an upper limit respectively.

In the present specification, the term "light" is used under a concept including not only visible rays but also high-energy rays such as UV rays, X-rays, and γ-rays, particle beams such as electron beams, and the like.

In the present specification, in some cases, "(meth)acrylic acid" indicates either or both of acrylic acid and methacrylic acid, and "(meth)acrylate" indicates either or both of acrylate and methacrylate.

Furthermore, unless otherwise specified, a content is expressed in terms of mass. Moreover, unless otherwise specified, "% by mass" indicates a ratio of a component to a total amount of a composition, and "solid content" indicates components contained in the composition excluding a solvent.

<Conductive Composition>

The conductive composition of the present invention contains at least (a) conductive metal fibers (hereinafter, referred to as "(a) conductive metal fibers" in some cases) having an average minor-axis length (hereinafter, referred to as "average minor-axis length" or "average diameter" in some cases) from 1 nm to 150 nm, and (b) at least one compound (hereinafter, referred to as "(b) component compound" in some cases) selected from a compound represented by the following Formula (1), a compound represented by the following Formula (2), and a compound having a partial structure represented by the following Formula (3).

Formula (1)

-continued

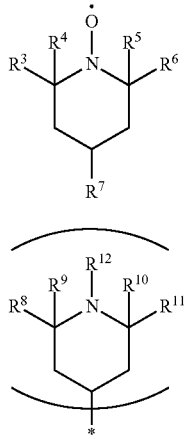

Formula (2)

Formula (3)

In Formula (1), each of $R^1$ and $R^2$ independently represents a hydrogen atom, an alkyl group, an alkenyl group, an aryl group, an acyl group an aryloxycarbonyl group, an alkoxycarbonyl group, or a carbamoyl group. In Formula (2), each of $R^3$, $R^4$, $R^5$, and $R^6$ independently represents an alkyl group having 1 to 4 carbon atoms, and $R^7$ represents a hydrogen atom or a substituent. In Formula (3), each of $R^8$, $R^9$, $R^{10}$, and $R^{11}$ independently represents an alkyl group having 1 to 4 carbon atoms, and $R^{12}$ represents an alkyl group, an alkoxy group, an acyl group, or a hydrogen atom. In Formula (3), * represents a bond.

If the conductive composition of the present invention is constituted as above, deterioration of conductivity is inhibited even when the composition is exposed to harsh conditions such as a high temperature, irradiation of actinic radiation, or the presence of ozone. The following can be assumed to be as the reason, though it is not a definite reason.

Under the conditions such as a high temperature, irradiation of actinic radiation, or the presence of ozone, a radical species is generated in the conductive metal fiber-containing conductive layer, layers in the vicinity of the conductive layers, and the like. The radical species reacts with oxygen and generates peroxide and the like. At this time, at least one compound ((b) component compound) selected from the compound represented by Formula (1), the compound represented by Formula (2), and the compound having a partial structure represented by Formula (3) is considered to function to deactivate the generated peroxide and the like. Therefore, presumably, if the (b) component compound is added to the conductive layer or to a layer coming into contact with the conductive layer such that the compound is present in the vicinity of the conductive metal fiber, the amount of peroxide, which is generated by a reaction between the radical species and oxygen, may be reduced, oxidation of the conductive metal fiber may be inhibited, and consequentially, deterioration of conductivity may be inhibited.

Hereinafter, components of the conductive composition of the present invention will be described in detail.

(a) Conductive Metal Fiber

The conductive composition of the present invention contains conductive metal fibers having an average minor-axis length from 1 nm to 150 nm. The average minor-axis length of the conductive metal fibers is 1 nm to 150 nm. From the viewpoint of durability and optical characteristics, the average minor-axis length is preferably 1 nm to 70 nm, more preferably 1 nm to 50 nm, even more preferably 1 nm to 35 nm, and particularly preferably 10 nm to 30 nm.

Herein, the average minor-axis length (average diameter) and average major-axis length (average major-axis length) of the conductive metal fibers can be measured by observing a TEM image or an optical microscope image by using, for example, a transmission electron microscope (TEM) or an optical microscope. In the present invention, 300 strands of conductive metal fibers are observed using a transmission electron microscope (TEM; manufactured by JEOL Ltd., JEM-2000FX) to measure the average minor-axis length (average diameter) and average major-axis length of the conductive metal fibers, and an average thereof is taken as an average minor-axis length and a average major-axis length.

When a cross-section of the conductive metal fiber in the minor-axis direction is not circular, a length of a site that is confirmed to be the longest when being measured in the minor-axis direction is taken as the average minor-axis length. Moreover, when the conductive metal fiber is curved, a circle having the fiber as an arc is conceived, and a value calculated from the diameter and curvature is taken as the average major-axis length.

An aspect ratio of the conductive metal fiber is preferably from 50 or higher. The aspect ratio generally refers to a ratio between a long side and a short side (ratio of average major-axis length/average minor-axis length) of a fibrous substance.

A method of measuring the aspect ratio is not particularly limited and can be appropriately selected according to the purpose. For example, a measurement method using an electron microscope or the like can be used.

When the aspect ratio of the conductive metal fiber is measured using an electron microscope, whether or not the aspect ratio of the conductive metal fiber is 50 or higher is preferably able to be confirmed in one field of view of the electron microscope. Moreover, if each of the average major-axis length and average minor-axis length of the conductive metal fibers is separately measured, the aspect ratio of all of the conductive metal fibers can be estimated.

Furthermore, when the conductive metal fiber is tubular, the outer diameter of the tube is used as a diameter for calculating the aspect ratio.

The aspect ratio of the conductive metal fiber can be appropriately set according to the purpose. However, it is preferably 50 to 1,000,000, and more preferably 100 to 1,000,000. If the aspect ratio is set to be equal to or higher than 50, it is easy for the conductive metal fibers to form a network, and sufficient conductivity is easily obtained. Moreover, if the aspect ratio is set to be equal to or lower than 1,000,000, at the time when the conductive metal fibers are formed or when the formed conductive metal fibers are handled, the conductive metal fibers are not entangled with each other, and a composition excellent in stability and production suitability is easily obtained.

Examples of conductive metal material forming the fiber include metal oxides such as ITO, zinc oxide, and tin oxide, metallic carbon, a single metal element, a composite structure consisting of plural metal elements, an alloy consisting of plural metals, and the like. Moreover, the material may be shaped into fiber and then subjected to surface treatment. For example, plated metal fiber can be used.

The conductive metal fiber may be in any form including a solid structure, a porous structure, and a hollow structure, but among these, a solid structure and a hollow structure are preferable. In the present invention, in some cases, the fiber having a solid structure is referred to as "wire", and the fiber having a hollow structure is referred to as "tube".

(Metal Nanowire)

From the viewpoint of making it easy to form a transparent conductive film, it is preferable to use a metal nanowire as the conductive metal fiber. In the present invention, it is preferable to use a metal nanowire having an average minor-axis length of 1 nm to 150 nm and an average major-axis length of 1 μm to 100 μm.

The average minor-axis length (average diameter) of the metal nanowire is preferably 1 nm to 150 nm. From the viewpoint of durability and optical characteristics, the average minor-axis length is preferably 1 nm to 70 nm, more preferably 1 nm to 50 nm, even more preferably 1 nm to 35 nm, and particularly preferably 10 nm to 30 nm. If the average minor-axis length is equal to or longer than 1 nm, the metal nanowire tends to exhibit excellent oxidation resistance, and durability thereof tends to be improved. When the average minor-axis length is equal to or shorter than 150 nm, deterioration of optical characteristics such as increase in haze resulting from light scattering and the like is inhibited.

The average major-axis length (also referred to as "average length" in some cases) of the metal nanowire is preferably 1 μm to 40 μm, more preferably 3 μm to 35 μm, and particularly preferably 5 μm to 30 μm. If the average major-axis length of the metal nanowire is equal to or shorter than 40 μm, generation of aggregates at the time of producing the metal nanowire is inhibited. If the average major-axis length is equal to or longer than 1 lam, sufficient conductivity tends to be obtained.

A coefficient of variation of the average minor-axis length (diameter) of the metal nanowire used for the conductive layer according to the present invention is preferably equal to or less than 40%, more preferably equal to or less than 35%, and particularly preferably equal to or less than 30%.

If the coefficient of variation is controlled to be equal to or less than 40%, it is easy to secure conductivity with excellent durability.

The coefficient of variation of the average minor-axis length (diameter) of the metal nanowire can be determined by measuring the average minor-axis length (diameter) of 300 strands of metal nanowires from, for example, a transmission electron microscope (TEM) image and calculating a standard deviation and average thereof.

The metal nanowire may be in any form such as the form of a cylinder, a cuboid, a column which has a polyogonal cross-section, and the like. However, when a high degree of transparency is required for the metal nanowire, a metal nanowire in the form of a cylinder or a metal nanowire which is in the form of a polygon having 5 or more sides and has a cross-sectional shape having no acute angle is preferable.

The cross-sectional shape of the metal nanowire can be detected by coating a substrate with an aqueous dispersion of the metal nanowire and observing the cross-section with a transmission electron microscope (TEM).

The metal in the metal nanowire is not particularly limited, and any metal may be used. One kind of metal may be used, or two or more kinds of metals may be used in combination. Moreover, the metal can be used in the form of an alloy.

As the metal, at least one kind of metal selected from a group consisting of metals of the fourth period, the fifth period, and the sixth period of the long periodic table (IUPAC 1991) is preferable; at least one kind of metal selected from group 2 to group 14 is more preferable; and at least one kind of metal selected from group 2, group 8, group 9, group 10, group 11, group 12, group 13, and group 14 is even more preferable. It is particularly preferable for the metal nanowire to contain such a metal as a main component.

Specific examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, an alloy of these, and the like. Among these, copper, silver, gold, platinum, palladium, nickel, tin, cobalt, rhodium, iridium, and an alloy of these are preferable; palladium, copper, silver, gold, platinum, tin, and an alloy of these are more preferable. Particularly, silver or a silver-containing alloy in which a content of silver is from 50 mol % to 100 mol % (more preferably 90 mol % to 100 mol %) is preferable.

A method for producing the metal nanowire is not particularly limited, and the metal nanowire may be produced by any method. For example, as described below, it is preferable for the metal nanowire to be produced by reducing metal ions in a solvent in which a halogen compound and a dispersant are dissolved. Moreover, after the metal nanowire is formed, from the viewpoint of dispersity and temporal stability of a photosensitive layer, it is preferable to perform desalting treatment by a common method.

As the method for producing the metal nanowire, it is possible to use the methods described in JP2009-215594A, JP2009-242880A, JP2009-299162A, JP2010-84173A, JP2010-86714A, and the like.

As the solvent used for producing the metal nanowire, a hydrophilic solvent is preferable, and examples thereof include water, an alcohol, an ether, a ketone, and the like. One kind of these may be used singly, or two or more kinds thereof may be used concurrently.

Examples of the alcohol include methanol, ethanol, propanol, 2-propanol, butanol, ethylene glycol, and the like.

Examples of the ether include dioxane, tetrahydrofuran, and the like.

Examples of the ketone include acetone and the like.

When the metal nanowire is heated during the production thereof, the temperature is preferably equal to or lower than 250° C., more preferably from 20° C. to 200° C., even more preferably from 30° C. to 180° C., and particularly preferably from 40° C. to 170° C. If the temperature is controlled to be equal to or lower than 250° C., it preferable from the viewpoint of transparency, since the outer circumference of the cross-section of the metal nanowire has a smooth shape not having an acute angle. If the temperature is controlled to be equal to or higher than 20° C., the length of the formed metal nanowire falls within a range preferable for securing dispersion stability.

If necessary, the temperature may be changed in a process of forming the metal nanowire. In some cases, the change of temperature in the process of forming the metal nanowire is effective for controlling the formation of a nucleus, inhibiting regeneration of a nucleus, and improving monodispersity caused by acceleration of selective growth.

It is preferable to additionally use a reductant during the heating.

The reductant is not particularly limited and can be appropriately selected from reductants that can reducing metal ions. Examples of the reductants include metal borohydride, aluminum hydride, alkanolamine, aliphatic amine, heterocyclic amine, aromatic amine, aralkylamine, an alcohol, an organic acid, reducing sugar, a sugar alcohol, sulfite, a hydrazine compound, dextrin, hydroquinone, hydroxyamine, ethylene glycol, glutathione, and the like. Among these, reducing sugar, a sugar alcohol as a derivative thereof, and ethylene glycol are more preferable, and reducing sugar, a sugar alcohol as a derivative thereof, and ethylene glycol are particularly preferable. Some of the reductants are compounds that function as a dispersant or solvent, and these can also be preferably used.

It is preferable for the reductant used for forming the metal nanowire to be removed by means of ultrafiltration, dialysis, gel filtration, decantation, centrifugation, and the like after the metal nanowire is formed, such that the amount of residue thereof becomes less than 0.1% by mass with respect to silver.

It is preferable to additionally use a dispersant, a halogen compound, and a halogenated fine metal particles during the production of the metal nanowire.

The timing of adding the dispersant and the halogen compound may be before or after the addition of the reductant or may be before or after the addition of the metal ions or the halogenated fine metal particles. However, in order to obtain a metal nanowire having better monodispersity, it is preferable for the halogen compound to be added in two or more stages.

The dispersant may be added to the reaction solution before the metal nanowire is prepared, or alternatively, it may be added after the metal nanowire is prepared. The dispersant may be added in one stage or may be added in two or more stages by being divided into portions.

Examples of the dispersant include an amino group-containing compound, a mercapto group-containing compound, a sulfide-containing compound, an amino acid or derivatives thereof, a peptide compound, a polysaccharide, a natural polymer derived from a polysaccharide, a synthetic polymer, a polymer of gel and the like derived from these, and the like.

Examples of polymer compounds preferably used as the dispersant include hydrophilic polymers such as gelatin as a protective colloidal polymer, polyvinyl alcohol, methyl cellulose, hydroxypropyl cellulose, polyalkylene amine, poly (meth)acrylic acid, a salt thereof or a partial alkyl ester thereof, polyvinyl pyrrolidone, a copolymer having a polyvinyl pyrrolidone structure, and poly(meth)acrylic acid derivatives having an amino group or a mercapto group.

A weight average molecular weight (Mw) of the polymer used as a dispersant that is measured by gel permeation chromatography is preferably from 3,000 to 300,000, and more preferably from 5,000 to 100,000.

Regarding the structure of compounds usable as a dispersant, for example, the disclosure of "Dictionary of Pigment" (edited by Seishiro Ito, published by Asakura Publishing Co., Ltd., 2000) can be referred to. The shape of the obtained metal nanowire can be controlled according to the type of the dispersant used.

As the halogen compound, compounds containing bromide ions, chloride ions, or iodide ions are preferable. For example, metal halides such as sodium bromide, sodium chloride, sodium iodide, potassium iodide, potassium bromide, potassium chloride, and potassium iodide and halide ion salts of onium salts exemplified below that also function as a dispersant are preferable.

Fine silver halide particles may be used instead of the halogen compound, or alternatively, the halogen compound and fine silver halide particles may be used concurrently.

Moreover, a single substance that functions as both the dispersant and halogen compound may be used. That is, a single compound has the function of both the dispersant and halogen compound.

Preferable examples of halogen compounds that function as a dispersant include halide ion salts of onium (preferably ammonium or phosphonium).

Examples thereof include hexadecyl trimethyl ammonium bromide (HTAB), hexadecyl trimethyl ammonium chloride (HTAC), dodecyl trimethyl ammonium bromide, dodecyl trimethyl ammonium chloride, stearyl trimethyl ammonium bromide, stearyl trimethyl ammonium chloride, decyl trimethyl ammonium bromide, decyl trimethyl ammonium chloride, dimethyl distearyl ammonium bromide, dimethyl distearyl ammonium chloride, dilauryl dimethyl ammonium bromide, dilauryl dimethyl ammonium chloride, dimethyl dipalmityl ammonium bromide, dimethyl dipalmityl ammonium chloride, and the like.

If necessary, after the metal nanowire is formed, these compounds may be removed by means of ultrafiltration, dialysis, gel filtration, decantation, centrifugation, and the like.

It is preferable for the metal nanowire not to contain inorganic ions such as alkali metal ions, alkaline earth metal ions, and halide ions as far as possible. When the metal nanowire is dispersed in an aqueous medium, an electric conductivity thereof is preferably equal to or less than 1 mS/cm, more preferably equal to or less than 0.1 mS/cm, and even more preferably equal to or less than 0.05 mS/cm.

When the metal nanowire is dispersed in an aqueous medium, a viscosity thereof at 20° C. is preferably 0.5 mPa·s to 100 mPa·s, and more preferably 1 mPa·s to 50 mPa·s.

(Metal Nanotube)

Examples of preferable conductive metal fiber other than the metal nanowire include a metal nanotube as hollow fiber. The material of the metal nanotube is not particularly limited, and any metal can be used as the material. For example, it is possible to use the aforementioned materials and the like of the metal nanowire.

The metal nanotube may be in the form of a single layer or a multilayer. However, it is preferable for the metal nanotube to be in the form of a single layer since conductivity and thermal conductivity thereof become excellent.

A thickness (a difference between the inner diameter and the outer diameter) of the metal nanotube is preferably 3 nm to 80 nm, and more preferably 3 nm to 30 nm. If the thickness is equal to or greater than 3 nm, sufficient oxidation resistance is obtained. If the thickness is equal to or smaller than 80 nm, light scattering caused by the metal nanotube is inhibited.

In the present invention, the average minor-axis length of the metal nanotubes is 1 nm to 150 nm similarly to the metal nanowires, and a preferable average major-axis length thereof is also the same as that of the metal nanowires. The average minor-axis length is preferably 1 to 40 μm, more preferably 3 μm to 35 μm, and even more preferably 5 μm to 30 μm.

The method for producing the metal nanotube is not particularly limited and can be appropriately selected according to the purpose. For example, the method described in US2005/0056118A can be used.

(b) Component Compound

The conductive composition of the present invention contains at least one compound selected from a compound represented by the following Formula (1), a compound represented by the following Formula (2), and a compound having a partial structure represented by the following Formula (3).

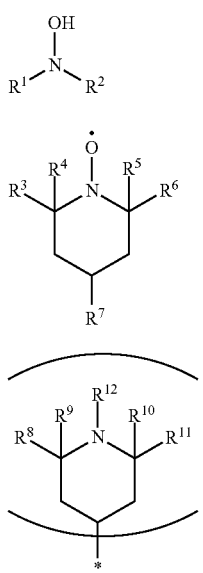

Formula (1)

Formula (2)

Formula (3)

In Formula (1), each of $R^1$ and $R^2$ independently represents a hydrogen atom, an alkyl group, an alkenyl group, an aryl group, an acyl group, an aryloxycarbonyl group, an alkoxycarbonyl group, or a carbamoyl group. In Formula (2), each of $R^3$, $R^4$, $R^5$, and $R^6$ independently represents an alkyl group having 1 to 4 carbon atoms, and $R^7$ represents a hydrogen atom or a substituent. In Formula (3), each of $R^8$, $R^9$, $R^{10}$, and $R^{11}$ independently represents an alkyl group having 1 to 4 carbon atoms, and $R^{12}$ represents an alkyl group, an alkoxy group, an acyl group, or a hydrogen atom. In Formula (3), * represents a bond.

$R^1$ and $R^2$ may form a ring by being bonded to each other.

At least one of the $R^1$ and $R^2$ is preferably an alkyl group, an alkenyl group, an aryl group, an acyl group, an aryloxycarbonyl group, an alkoxycarbonyl group, or a carbamoyl group, more preferably an alkyl group, an alkenyl group, or an aryl group, and even more preferably an alkyl group. It is particularly preferable for both the $R^1$ and $R^2$ to be alkyl groups.

The alkyl group represented by $R^1$ and $R^2$ in the Formula (1) represents a substituted or unsubstituted linear, branched, or cyclic alkyl group, and preferably has 1 to 50 carbon atoms, more preferably has 1 to 30 carbon atoms, and particularly preferably has 1 to 20 carbon atoms. Preferable examples thereof include methyl, ethyl, n-propyl, isopropyl, cyclopropyl, butyl, isobutyl, t-butyl, sec-butyl, pentyl, isopentyl, neopentyl, t-pentyl, hexyl, cyclohexyl, heptyl, cyclopentyl, octyl, 2-ethylhexyl, nonyl, decyl, dodecyl, tetradecyl, hexadecyl, octadecyl, eicosyl, docosyl, triacontyl, and the like. Among these, methyl, ethyl, n-propyl, isopropyl, butyl, isobutyl, t-butyl, sec-butyl, pentyl, isopentyl, neopentyl, hexyl, cyclohexyl, octyl, 2-ethylhexyl, dodecyl, hexadecyl, and octadecyl are more preferable; and methyl, ethyl, n-propyl, isopropyl, butyl, t-butyl, pentyl, isopentyl, hexyl, cyclohexyl, octyl, 2-ethylhexyl, dodecyl, hexadecyl, and octadecyl are even more preferable.

The alkyl group represented by $R^1$, $R^2$, and $R^3$ may further have a substituent. Examples of the substituent include a halogen atom, an alkyl group (including a cycloalkyl group), an alkenyl group (including a cycloalkenyl group and a bicycloalkenyl group), an alkynyl group, an aryl group, a cyano group, a hydroxyl group, a nitro group, a carboxyl group, an alkoxy group, an aryloxy group, an acyloxy group, a carbamoyloxy group, an alkoxy carbonyloxy group, aryloxy carbonyloxy, an amino group (including an anilino group), an acylamino group, an aminocarbonyl amino group, an alkoxycarbonyl amino group, an aryloxycarbonyl amino group, an acyl group, an aryloxycarbonyl group, an alkoxycarbonyl group, a carbamoyl group, and the like.

In view of improving solubility in a coating solution, it is more preferable for the alkyl group to have at least one group selected from a carboxyl group, an alkali metal salt thereof, an sulfo group and an alkali metal salt thereof, a hydroxyl group, an alkoxy group, an alkoxycarbonyl group, and a carbamoyl group among the above substituents.

More specifically, the substituent represents a halogen atom (for example, a chlorine atom, a bromine atom, or an iodine atom), an alkyl group [(the alkyl group represents a substituted or unsubstituted linear, branched, or cyclic alkyl group. These also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, and 2-ethylhexyl), a cycloalkyl group (preferably a substituted or unsubstituted cycloalkyl group having 3 to 30 carbon atoms, for example, cyclohexyl, cyclopentyl, and 4-n-dodecylcyclohexyl), a bicycloalkyl group (preferably a substituted or unsubstituted bicycloalkyl group having 5 to 30 carbon atoms, that is, a monovalent group formed when one hydrogen atom is removed from bicycloalkane having 5 to 30 carbon atoms; for example, bicyclo[1.2.2]heptan-2-yl and bicyclo[2.2.2]octan-3-yl), and a tricyclo structure consisting of many cyclic structures. The alkyl group (for example, an alkyl group in an alkylthio group) in the substituent, which will be described later, also represents the alkyl group under the above concept), an alkenyl group (preferably a substituted or unsubstituted alkenyl group having 2 to 30 carbon atoms, for example, vinyl, allyl, prenyl, geranyl, and oleyl), a cycloalkenyl group (preferably a substituted or unsubstituted cycloalkenyl group having 3 to 30 carbon atoms, that is, a monovalent group formed when one hydrogen atom is removed from cycloalkene having 3 to 30 carbon atoms; for example, 2-cyclopenten-1-yl and 2-cyclohexen-1-yl), a bicycloalkenyl group (a substituted or unsubstituted bicycloalkenyl group, preferably a substituted or unsubstituted bicycloalkenyl group having 5 to 30 carbon atoms, that is, a monovalent group formed when one hydrogen atom is removed from bicycloalkene having one double bond; for example, bicyclo[2.2.1]hepto-2-en-1-yl and bicyclo[2.2.2]octo-2-en-4-yl)], an alkynyl group (preferably a substituted or unsubstituted alkynyl group having 2 to 30 carbon atoms, for example, ethynyl, propargyl, or trimethylsilyl ethynyl group), an aryl group (preferably a substituted or unsubstituted aryl group having 6 to 30 carbon atoms, for example, phenyl, p-tolyl, naphthyl, m-chlorophenyl, or o-hexadecanoyl aminophenyl), a heterocyclic group (preferably a monovalent group formed when one hydrogen atom is removed from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl), a cyano group, a hydroxyl group, a nitro group, a carboxyl group, an alkoxy group (preferably a substituted or unsubstituted alkoxy group having 1 to 32 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butylmethylsilyloxy), a heterocyclic oxy group (preferably a substituted or unsubstituted heterocyclic oxy group having 2 to 30 carbon atoms, for example, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxy carbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxy carbonyloxy), an amino group (preferably an amino group, a substituted or unsubstituted alkylamino group having 1 to 30 carbon atoms, a substituted or unsubstituted anilino group having 6 to 30 carbon atoms, for example, amino, methylamino, dimethylamino, anilino, N-methylanilino, diphenylamino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenyl carbonylamino), an aminocarbonylamino group (preferably a substituted or unsubstituted aminocarbonylamino having 1 to 30 carbon atoms, for example, carbamoylamino, N,N-dimethylaminocarbonylamino, N,N-diethylaminocarbonylamino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino), an alkyl or aryl sulfonylamino group (preferably a substituted or unsubstituted alkyl sulfonylamino having 1 to 30 carbon atoms, or a substituted or unsubstituted aryl sulfonylamino having 6 to 30 carbon atoms, for example, methyl sulfonylamino, butyl sulfonylamino, phenyl sulfonylamino, 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio, or n-hexadecylthio), an arylthio group (preferably substituted or unsubstituted arylthio having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, an alkyl and aryl sulfinyl group (preferably a substituted or unsubstituted alkyl sulfinyl group having 1 to 30 carbon atoms and a substituted or unsubstituted aryl sulfinyl group having 6 to 30 carbon atoms, for example, methyl sulfinyl, ethyl sulfinyl, phenyl sulfinyl, or p-methylphenyl sulfinyl), an alkyl or aryl sulfonyl group (preferably a substituted or unsubstituted alkyl sulfonyl group having 1 to 30 carbon atoms and a substituted or unsubstituted aryl sulfonyl group having 6 to 30 carbon atoms, for example, methyl sulfonyl, ethyl sulfonyl, phenyl sulfonyl, or p-methylphenyl sulfonyl), an acyl group (preferably a formyl group, a substituted or unsubstituted alkyl carbonyl group having 2 to 30 carbon atoms, a substituted or unsubstituted aryl carbonyl group having 7 to 30 carbon atoms, or a substituted or unsubstituted heterocyclic carbonyl group having 4 to 30 carbon atoms that is bonded to a carbonyl group through carbon atoms, for example, acetyl, pivaloyl, 2-chloroacetyl, stearoyl, benzoyl, or p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), an aryl and heterocyclic azo group (preferably a substituted or unsubstituted arylazo group having 6 to 30 carbon atoms and a substituted or unsubstituted heterocyclic azo group having 3 to 30 carbon atoms, for example, phenylazo, p-chlorophenylazo, or 5-ethylthio-1,3,4-thiadiazol-2-ylazo), an imide group (preferably N-succinimide or N-phthalimide), a phosphino group (preferably a substituted or unsubstituted phosphino group having 2 to 30 carbon atoms, for example, dimethylphosphino, diphenylphosphino, or methyl phenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), and a silyl group (preferably a substituted or unsubstituted silyl group having 3 to 30 carbon atoms, for example, trimethyl silyl, t-butyl dimethyl silyl, or phenyl dimethyl silyl).

Among the above functional groups, from the functional groups having hydrogen atoms, the hydrogen atoms may be removed, and then the functional groups may be substituted with the above groups. Examples of such functional groups include an alkylcarbonylaminosulfonyl group, an arylcarbonylaminosulfonyl group, an alkyl sulfonyl aminocarbonyl group, an aryl sulfonylaminocarbonyl group, methylsulfonylaminocarbonyl, p-methylphenylsulfonylaminocarbonyl, acetylaminosulfonyl, a benzoylaminosulfonyl group, a —(OCH$_2$CH$_2$O)$_n$CH$_3$ group (n=1 to 15), a —(OCH$_2$CH$_2$O)$_n$H group (n=1 to 15), a —CO—(OCH$_2$CH$_2$O)—CH$_3$ group (n=1 to 15), and a CO—(OCH$_2$CH$_2$O)$_n$H group (n=1 to 15).

The alkenyl group represented by $R^1$ and $R^2$ represents a substituted or unsubstituted linear, branched or cyclic alkenyl group which preferably has 2 to 50 carbon atoms, more preferably has 2 to 30 carbon atoms, and particularly preferably has 2 to 20 carbon atoms. Preferable examples of the alkenyl group include vinyl, allyl, prenyl, geranyl, oleyl, 2-cyclopenten-1-yl, 2-cyclohexen-1-yl, bicyclo[2.2.1]hepto-2-en-1-yl, bicyclo[2.2.2]octo-2-en-4-yl, and the like. Among these, vinyl, allyl, prenyl, geranyl, oleyl, 2-cyclopenten-1-yl, and 2-cyclohexen-1-yl are more preferable, and vinyl allyl, prenyl, geranyl, oleyl, 2-cyclopenten-1-yl, and 2-cyclohexen-1-yl are more preferable.

The alkenyl group represented by $R^1$ and $R^2$ may further have a substituent. Examples of the substituent include the substituents of the alkyl group represented by R' and $R^2$.

The aryl group represented by and $R^2$ represents a substituted or unsubstituted aryl group. The aryl group preferably has 6 to 50 carbon atoms, more preferably has 6 to 30 carbon atoms, and particularly preferably has 6 to 20 carbon atoms. Preferable examples thereof include phenyl, 2-methylphenyl, 3-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 3-chlorophenyl, 4-chlorophenyl, 2-methoxyphenyl, 3-methoxyphenyl, 4-methoxyphenyl, 2-benzylphenyl, 4-benzylphenyl, 2-methylcarbonylphenyl, 4-methylcarbonylphenyl, and the like.

Among these, phenyl, 2-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 3-methoxyphenyl, 4-methoxyphenyl, 2-benzylphenyl, 4-benzylphenyl, and the like are more preferable; and phenyl, 2-methylphenyl, 4-methylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 4-methoxyphenyl, 2-benzylphenyl, 4-benzylphenyl, and the like are even more preferable.

The aryl group represented by $R^1$ and $R^2$ may further have a substituent, and examples of the substituent include the substituents of the alkyl group represented by the $R^1$ and $R^2$.

The acyl group represented by $R^1$ and $R^2$ is preferably a formyl group, a substituted or unsubstituted alkylcarbonyl group having 2 to 30 carbon atoms, or a substituted or unsubstituted arylcarbonyl group having 7 to 30 carbon atoms. Examples of the acyl group include acetyl, pivaloyl, 2-chloroacetyl, stearoyl, benzoyl, a p-n-octyloxyphenylcarbonyl group, and the like.

The acyl group represented by $R^1$ and $R^2$ may further have a substituent, and examples of the substituent include the substituents of the alkyl group represented by $R^1$ and $R^2$.

The aryloxycarbonyl group represented by $R^1$ and $R^2$ is preferably a substituted or unsubstituted aryloxycarbonyl group having 7 to 30 carbon atoms. Examples of the aryloxycarbonyl group include phenoxycarbonyl, o-chlorophenoxycarbonyl, m-nitrophenoxycarbonyl, p-t-butylphenoxycarbonyl, and the like.

The aryloxycarbonyl group represented by $R^1$ and $R^2$ may further have a substituent, and examples of the substituent include the substituents of the alkyl group represented by $R^1$ and $R^2$.

The alkoxycarbonyl group represented by $R^1$ and $R^2$ is preferably a substituted or unsubstituted alkoxycarbonyl group having 2 to 30 carbon atoms. Examples of the alkoxycarbonyl group include methoxycarbonyl, ethoxycarbonyl, t-butoxycarbonyl, n-octadecyloxycarbonyl, and the like.

The alkoxycarbonyl group represented by $R^1$ and $R^2$ may further have a substituent, and examples of the substituent include the substituents of the alkyl group represented by $R^1$ and $R^2$.

The carbamoyl group represented by $R^1$ and $R^2$ is preferably a substituted or unsubstituted carbamoyl group having 1 to 30 carbon atoms. Examples of the carbamoyl group include carbamoyl, N-methylcarbamoyl, N,N-dimethylcarbamoyl, N,N-di-n-octylcarbamoyl, N-(methylsulfonyl)carbamoyl, and the like.

The carbamoyl group represented by $R^1$ and $R^2$ may further have a substituent, and examples of the substituent include the substituents exemplified for the alkyl group represented by $R^1$ and $R^2$.

From the viewpoint of storage stability and improving solubility in a coating solution, at least one of the $R^1$ and $R^2$ in the Formula (1) is preferably an alkyl group, an alkenyl group or an aryl group that is substituted with at least one group selected from a carboxyl group and an alkali metal salt thereof, a sulfo group and an alkali metal salt thereof, a hydroxyl group, an alkoxy group, an alkoxycarbonyl group, and a carbamoyl group, and more preferably an alkyl group substituted with at least one group selected from a carboxyl group and an alkali metal salt thereof, a sulfo group and an alkali metal salt thereof, a hydroxyl group, an alkoxy group, an alkoxycarbonyl group, and a carbamoyl group.

Moreover, from the viewpoint of storage stability and improving solubility in a coating solution, it is more preferable for the compound to have an alkylene chain having 2 to 30 carbon atoms and at least one group selected from a carboxyl group and an alkali metal salt thereof, a sulfo group and an alkali metal salt thereof, a hydroxyl group, an alkoxy group, an alkoxycarbonyl group, and a carbamoyl group, among the groups represented by the $R^1$ and $R^2$.

The alkylene chain preferably has 2 to 20 carbon atoms, and more preferably has 2 to 10 carbon atoms.

Specific examples of the compound represented by Formula (1) will be shown below, but the present invention is not limited thereto.

1-1

1-2

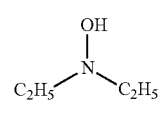

1-3

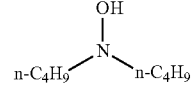

1-4

-continued
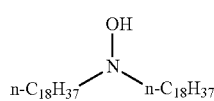 1-5
 1-6
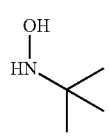 1-7
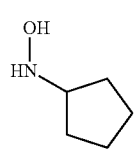 1-8
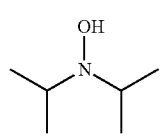 1-9
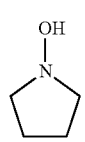 1-10
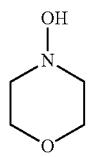 1-11
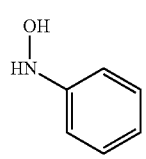 1-12
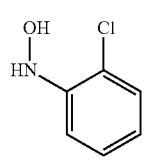 1-13
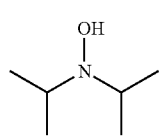 1-13
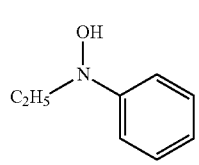 1-14
-continued
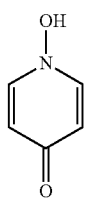 1-15
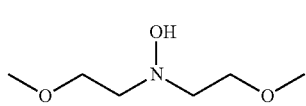 1-16
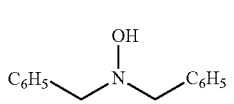 1-17
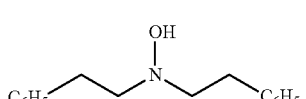 1-18
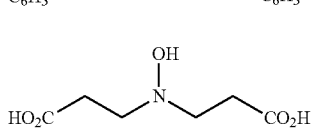 1-19
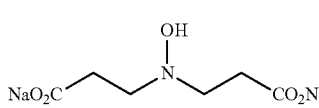 1-20
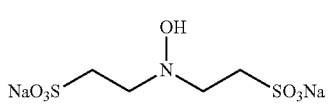 1-21
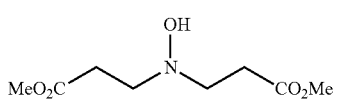 1-22
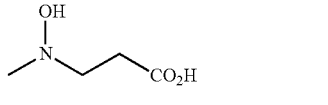 1-23
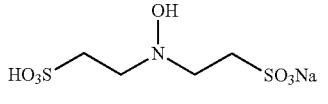 1-24
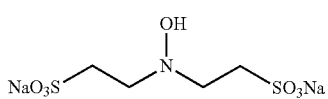 1-25
 1-26
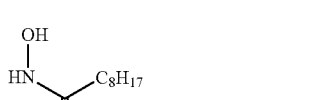 1-27

1-28 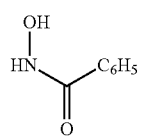

1-29 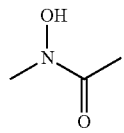

1-30 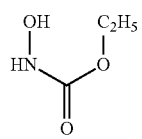

1-31 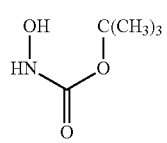

1-32 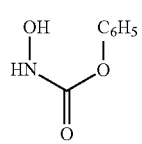

1-33 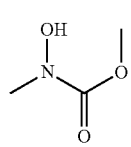

1-34 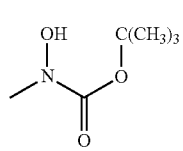

1-35 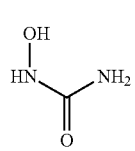

1-36 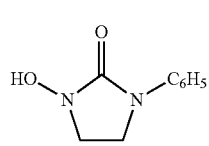

2-1 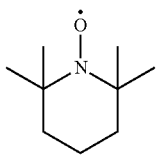

2-2 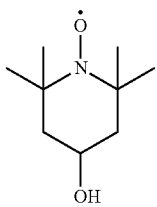

2-3 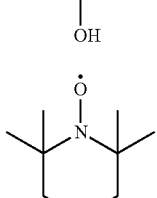

2-4 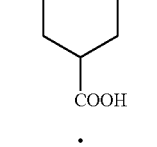

2-5 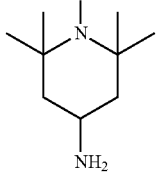

2-6 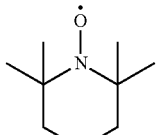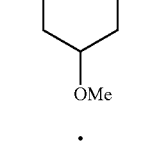

2-7 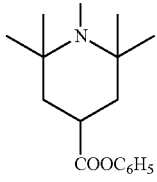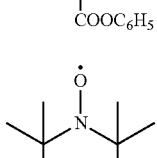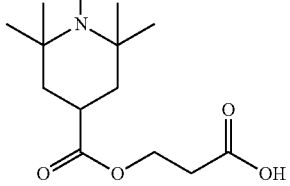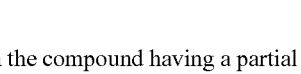

In the Formula (2), each of $R^3$, $R^4$, $R^5$, and $R^6$ independently represents an alkyl group having 1 to 4 carbon atoms, and $R^7$ represents a hydrogen atom or a substituent.

The alkyl group represented by $R^3$, $R^4$, $R^5$, and $R^6$ is preferably an linear alkyl group having 1 to 4 carbon atoms, and more preferably a methyl group.

Examples of the substituent represented by $R^7$ include the substituents exemplified for the alkyl group represented by $R^1$ and $R^2$.

Specific examples of the compound represented by the Formula (2) will be shown below, but the present invention is not limited thereto.

In the compound having a partial structure represented by the Formula (3), each of $R^8$, $R^9$, $R^{10}$, and $R^{11}$ independently represents an alkyl group having 1 to 4 carbon atoms, and $R^{12}$ represents an alkyl group, an alkoxy group, an acyl group, or a hydrogen atom.

The alkyl group represented by $R^8$, $R^9$, $R^{10}$, and $R^{11}$ is preferably a linear alkyl group having 1 to 4 carbon atoms, and more preferably a methyl group.

The alkyl group represented by $R^{12}$ is preferably an alkyl group having 1 to 4 carbon atoms.

The acyl group represented by $R^{12}$ is preferably an acyl group having 1 to 4 carbon atoms.

The alkoxy group represented by $R^{12}$ is preferably an alkoxy group having 1 to 8 carbon atoms.

The alkyl group, the alkoxy group, and the acyl group represented by $R^{12}$ may further have a substituent. Examples of the substituent include the substituents exemplified for the alkyl group represented by $R^1$ and $R^2$.

When the compound having a partial structure represented by Formula (3) has plural partial structures represented by the Formula (3), it is preferable for a value represented by the following Formula (A) to be small, since the effect, which is obtained by the addition of the compound, per unit mass becomes excellent.

Molecular weight/number of unit of partial structure represented by Formula (3)  (A)

The value represented by the Formula (A) is preferably equal to or smaller than 400, more preferably equal to or smaller than 300, and even more preferably equal to or smaller than 250.

Specific examples of the compound represented by the Formula (3) will be shown below, but the present invention is not limited thereto.

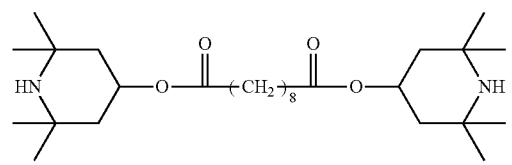
3-1

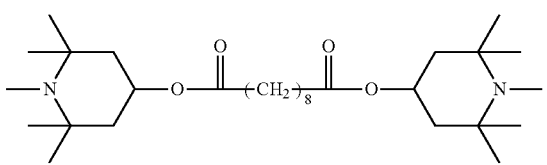
3-2

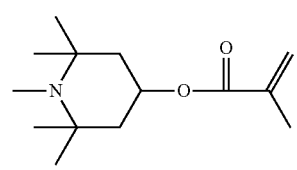
3-3

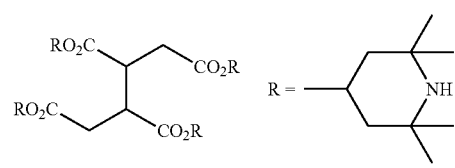
3-4

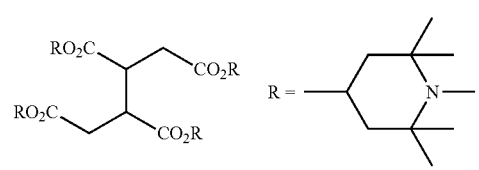
3-5

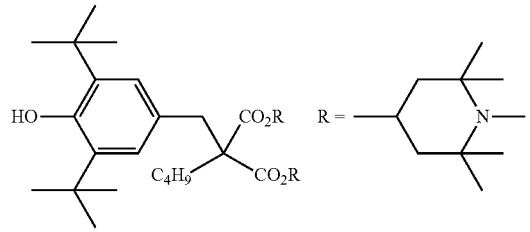
3-6

Examples of the compound also include 2-(3,5-di-t-butyl-4-hydroxyphenyl)-2-n-bis(2,2,6,6-tetramethyl-4-piperidyl) malonate, 2-(3,5-di-t-butyl-4-hydroxybenzyl)-2-n-butyl-bis(2,2,6,6-tetramethyl-4-piperidyl)malonate, 2-(3,5-di-t-butyl-4-hydroxybenzyl)-2-n-butyl-bis(1,2,2,6,6-pentamethyl-4-piperidyl)malonate, tetrakis(2,2,6,6-tetramethyl-4-piperidyl)-1,2,3,4-butanetetracarboxylate, tetrakis(1,2,2,6,6-pentamethyl-4-piperidyl)-1,2,3,4-butanetetracarboxylate, mixed (2,2,6,6-tetramethyl-4-piperidyl/tridecyl)-1,2,3,4-butanetetracarboxylate, mixed (1,2,2,6,6-pentamethyl-4-piperidyl/tridecyl)-1,2,3,4-butanetetracarboxylate, mixed {2,2,6,6-tetramethyl-4-piperidyl/β,β,β',β'-tetramethyl-3,9-[2,4,8,10-tetraoxaspiro[5.5]-undecane]diethyl}-1,2,3,4-butanetetracarboxylate, mixed {1,2,2,6,6-pentamethyl-4-piperidyl/β,β,β',β'-tetramethyl-3,9-[2,4,8,10-tetraoxaspiro[5.5]-undecane]diethyl}-1,2,3,4-butanetetracarboxylate, 1,2-bis(3-oxo-2,2,6,6-tetramethyl-4-piperidyl)ethane, 1-(3,5-di-t-butyl-4-hydroxyphenyl)-1,1-bis(2,2,6,6-tetramethyl-4-piperidyloxycarbonyl)pentane, poly[1-oxyethylene(2,2,6,6-tetramethyl-1,4-piperidyl)oxysuccinyl], poly[2-(1,1,4-trimethylbutylimino)-4,6-triazinediyl-(2,2,6,6-tetramethyl-4-piperidyl)iminohexamethylene-(2,2,6,6-tetramethyl-4-piperidyl)imino], N,N'-bis(3-aminopropyl)ethylenediamine-2,4-bis[N-butyl-N-(2,2,6,6-tetramethyl-4-piperidyl)amino]-6-chloro-1,3,5-triazine condensate and an N-methyl compound thereof, a polycondensate of succinic acid and 1-(2-hydroxyethyl)-4-hydroxy-2,2,6,6-tetramethylpiperidine, and the like.

A content of the (b) component compound in the conductive composition of the present invention, (a total content of plural kinds of compounds when the conductive composition contains the plural kinds of compounds) is preferably from 0.005 mmol to 50 mmol, and more preferably from 0.005 mmol to 5 mmol, per 1 g of the (a) conductive metal fibers. When the amount of the (b) component compound added is equal to or greater than 0.005 mmol, the addition of the (b) component compound tends to bring a sufficient effect. When the amount thereof added is equal to or smaller than 50 mmol, deterioration of resistivity that is assumed to result from hindered contact between conductive metal fibers tends to be inhibited.

A molecular weight of the (b) component compound is preferably from 100 to 10,000, more preferably from 140 to 5,000, and even more preferably from 140 to 1,000. When the molecular weight is equal to or greater than 100, volatility is suppressed, and heat resistance tends to become excellent. When the molecular weight is equal to or smaller than 10,000, deterioration of diffusivity in the film is suppressed, and a sufficient effect tends to be obtained. When the conductive composition contains plural kinds of compounds as the (b) component compound, a total molecular weight of all of the compounds is preferably from 100 to 10,000.

When the compound having a partial structure represented by Formula (3) is an oligomer or a polymer, the molecular weight means a number average molecular weight that is measured by gel permeation chromatography (GPC) and expressed in terms of polystyrene. For measuring the number average molecular weight by GPC, the oligomer or polymer is dissolved in tetrahydrofuran, and a high-speed GPC instrument (HLC-8220GPC) manufactured by TOSOH CORPORATION is used. At this time, TSKgel SuperHZ4000 (manufactured by TOSOH CORPORATION, 4.6 mm I. D.×15 cm) can be used as a column, and tetrahydrofuran (THF) can be used as an eluent.

In the present invention, among the (b) component compounds, from the viewpoint of conductivity under a high-temperature condition or irradiation of actinic radiation or conductivity in the presence of ozone that is the effect of the present invention, the compound represented by Formula (1) is preferable.

Moreover, preferable examples of the compound represented by Formula (1) include a compound represented by the following Formula (1-1). The compound represented by the following Formula (1-1) is excellent in terms of storage stability and solubility in a coating solution.

Formula (1-1)

In the Formula (1-1), each of $R^{11}$ and $R^{12}$ independently represents an alkylene group having 2 to 30 carbon atoms, and each of $X^1$ and $X^2$ independently represents a carboxyl group and an alkali metal salt thereof, a sulfo group and an alkali metal salt thereof, a hydroxyl group, an alkoxy group, an alkoxycarbonyl group, or a carbamoyl group.

The alkylene group represented by $R^{11}$ and $R^{21}$ preferably has 2 to 20 carbon atoms, and more preferably has 2 to 10 carbon atoms.

Specific examples of the compound represented by the Formula (1-1) include the compounds 1-16, 1-19, 1-20, 1-21, 1-22, 1-24, and 1-25 described above.

For producing the (b) component compound, any known method can be used. Various conditions such as temperature, selection of a solvent, and the type and amount of a reaction reagent in producing the compound can be easily set according to those skilled in the art. The conditions can be set experimentally, and those skilled in the art can easily produce the compound. Moreover, commercially available products may be used as the compound.

The conductive composition of the present invention is applied onto a substrate to form a conductive layer. Furthermore, the conductive composition of the present invention contains the (b) component compound. However, as described above, the (b) component compound can exerts its own effect, in a case where it is added to a layer coming into contact with the conductive layer, in addition to a case where it is added to the conductive layer containing the conductive metal fibers. Moreover, the (b) component compound may be added to another layer (for example, a soluble protective layer or an undercoat layer) coming into contact with the conductive layer containing the (a) conductive metal fibers, such that the (b) component compound is introduced into the conductive layer by being caused to diffuse to the conductive layer from the aforementioned another layer.

(b-1) Compounds Represented by Formulae (4) to (9)

The conductive composition of the present invention preferably further contains compounds represented by the following Formulae (4) to (9), in addition to the (b) component compound.

(4)

(5)

(6)

(7)

(8)

(9)

In Formula (4), each of $R^{41}$ and $R^{42}$ independently represents an alkyl group, an aryl group, an alkoxy group, an aryloxy group, or a halogen atom, and $R^{43}$ represents an alkyl group or an aryl group. At least two of the $R^{41}$, $R^{42}$, and $R^{43}$ may be linked to each other through an organic group having a valency of 2 or higher or through a single bond. Moreover, the Formula (4) may include a structure that plural compounds represented by Formula (4) are linked to each other through an organic group having a valency of 2 or higher or through a single bond. That is, the Formula (4) includes the structure that are formed when a monovalent group of one compound is linked to a monovalent group of other compound through an organic group having a valency of 2 or higher or through a single bond in a single molecule. The monovalent group of the compound is formed by removing one hydrogen atom from at least one of the $R^{41}$, $R^{42}$, and $R^{43}$ of the Formula (4).

In Formula (5), each of $R^{51}$ and $R^{52}$ independently represents an alkyl group. $R^{51}$ and $R^{52}$ may be linked to each other through an organic group having a valency of 2 or higher or through a single bond. Moreover, the Formula (5) may include a structure that plural compounds represented by Formula (5) are linked to each other through an organic group having a valency of 2 or higher or through a single bond. That is, the Formula (5) includes the structure that are formed when a monovalent group of one compound is linked to a monovalent group of other compound through an organic group having a valency of 2 or higher or through a single bond in a single molecule. The monovalent group of the compound is formed by removing one hydrogen atom from at least one of the $R^{51}$ and $R^{52}$ of the Formula (5).

In Formula (6), $V_{61}$ represents a hydrogen atom or a substituent.

In Formula (7), $V_{71}$ represents a hydrogen atom or a substituent, and each of $R_{71}$ and $R_{72}$ independently represents a hydrogen atom or a group which can be substituted with a nitrogen atom.

In Formula (8), $V_{81}$ represents a hydrogen atom or a substituent, and each of $R_{81}$ and $R_{82}$ independently represents a hydrogen atom or a group which can be substituted with a nitrogen atom.

In Formula (9), $V_{91}$ represents a hydrogen atom or a substituent. Each of $R_{91}$, $R_{92}$, and $R_{93}$ independently represents a hydrogen atom or a group which can be substituted with a nitrogen atom.

Among the compounds represented by the Formulae (4) to (9), it is preferable to add at least one kind of compound selected from the compounds represented by the Formulae (4) and (5). The effect is unclear but is considered to be as below.

The compounds represented by the Formulae (4) and (5) are considered to have a function of deactivating peroxide generated by a reaction between oxygen and a radical species which is generated in the conductive layer or in a layer coming into contact with the conductive layer. Presumably, for this reason, oxidation of the conductive metal fibers contained in the conductive layer may be inhibited, and as a result, deterioration of conductivity may be inhibited.

Accordingly, from the viewpoint of inhibiting deterioration of conductivity, it is preferable to use the (b) component compound, which can deactivate the radical species, concurrently with the compound represented by the Formula (4) or (5) that can deactivate the peroxide generated by the radical species.

Moreover, the compounds represented by the Formulae (6) to (9) are considered to have a function of deactivating the generated radical species just like the (b) component compound. It is considered that if the (b) component compound is used concurrently with the compounds represented by the Formulae (6) to (9), a synergistic effect of deactivating radical species is exerted.

The alkyl group represented by $R^{41}$, $R^{42}$, and $R^{43}$ in the Formula (4) represents a substituted or unsubstituted linear, branched, or cyclic alkyl group. The alkyl group preferably has 1 to 50 carbon atoms, more preferably has 1 to 30 carbon atoms, and particularly preferably has 1 to 20 carbon atoms. Preferable examples of the alkyl group include methyl, ethyl, n-propyl, isopropyl, cyclopropyl, butyl, isobutyl, t-butyl, sec-butyl, pentyl, isopentyl, neopentyl, t-pentyl, hexyl, cyclohexyl, heptyl, cyclopentyl, octyl, 2-ethylhexyl, nonyl, decyl, dodecyl, tetradecyl, hexadecyl, octadecyl, eicosyl, docosyl, triacontyl, and the like. Among these, methyl, ethyl, n-propyl, isopropyl, butyl, isobutyl, t-butyl, sec-butyl, pentyl, isopentyl, neopentyl, hexyl, cyclohexyl, octyl, 2-ethylhexyl, dodecyl, hexadecyl, and octadecyl are more preferable; and methyl, ethyl, n-propyl, isopropyl, butyl, t-butyl, pentyl, isopentyl, hexyl, cyclohexyl, octyl, 2-ethylhexyl, dodecyl, hexadecyl, and octadecyl are even more preferable.

The alkyl group represented by $R^{41}$, $R^{42}$, and $R^{43}$ may further have a substituent. Examples of the substituent include a halogen atom, an alkyl group (including a cycloalkyl group), alkenyl group (including a cycloalkenyl group and a bicycloalkenyl group), an alkynyl group, an aryl group, a cyano group, a hydroxyl group, a nitro group, a carboxyl group, an alkoxy group, an aryloxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, an acyl group, an aryloxycarbonyl group, an alkoxycarbonyl group, a carbamoyl group, and the like.

More specifically, the substituent represents a halogen atom (for example, a chlorine atom, a bromine atom, or an iodine atom), an alkyl group [(the alkyl group represents a substituted or unsubstituted linear, branched, or cyclic alkyl group. These also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, and 2-ethylhexyl), a cycloalkyl group (preferably a substituted or unsubstituted cycloalkyl group having 3 to 30 carbon atoms, for example, cyclohexyl, cyclopentyl, and 4-n-dodecylcyclohexyl), a bicycloalkyl group (preferably a substituted or unsubstituted bicycloalkyl group having 5 to 30 carbon atoms, that is, a monovalent group formed when one hydrogen atom is removed from bicycloalkane having 5 to 30 carbon atoms; for example, bicyclo[1.2.2]heptan-2-yl and bicyclo[2.2.2]octan-3-yl), and a tricyclo structure consisting of many cyclic structures. The alkyl group (for example, an alkyl group in an alkylthio group) in the substituent, which will be described later, also represents the alkyl group under the above concept), an alkenyl group (preferably a substituted or unsubstituted alkenyl group having 2 to 30 carbon atoms, for example, vinyl, allyl, prenyl, geranyl, and oleyl), a cycloalkenyl group (preferably a substituted or unsubstituted cycloalkenyl group having 3 to 30 carbon atoms, that is, a monovalent group formed when one hydrogen atom is removed from cycloalkene having 3 to 30 carbon atoms; for example, 2-cyclopenten-1-yl and 2-cyclohexen-1-yl), a bicycloalkenyl group (a substituted or unsubstituted bicycloalkenyl group which is preferably a substituted or unsubstituted bicycloalkenyl group having 5 to 30 carbon atoms, that is, a monovalent group formed when one hydrogen atom is removed from bicycloalkene having one double bond; for example, bicyclo[2.2.1]hepto-2-en-1-yl and bicyclo[2.2.2]octo-2-en-4-yl)], an alkynyl group (preferably a substituted or unsubstituted alkynyl group having 2 to 30 carbon atoms, for example, ethynyl, propargyl, or trimethylsilyl ethynyl group), an aryl group (preferably a substituted or unsubstituted aryl group having 6 to 30 carbon atoms, for example, phenyl, p-tolyl, naphthyl, m-chlorophenyl, or o-hexadecanoyl aminophenyl), a heterocyclic group (preferably a monovalent group formed when one hydrogen atom is removed from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl), a cyano group, a hydroxyl group, a nitro group, a carboxyl group, an alkoxy group (preferably a substituted or unsubstituted alkoxy group having 1 to 32 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butyldimethylsilyloxy), a heterocyclic oxy group (preferably a substituted or unsubstituted heterocyclic oxy group having 2 to 30 carbon atoms, for example, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxy carbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxy carbonyloxy), an amino group (preferably an amino group, a substituted or unsubstituted alkylamino group having 1 to 30 carbon atoms, a substituted or unsubstituted anilino group having 6 to 30 carbon atoms, for example, amino, methylamino, dimethylamino, anilino, N-methyl-anilino, diphenylamino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenyl carbonylamino), an aminocarbonylamino group (preferably a substituted or unsubstituted aminocarbonylamino having 1 to 30 carbon atoms, for example, carbamoyl amino, N,N-dim ethyl aminocarbonylamino, N,N-diethyl aminocarbonyl amino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonyl amino, or N-n-octylaminosulfonylamino), an alkyl or aryl sulfonylamino group (preferably a substituted or unsubstituted alkyl sulfonylamino having 1 to 30 carbon atoms, or a substituted or unsubstituted aryl sulfonylamino having 6 to 30 carbon atoms, for example, methyl sulfonylamino, butyl sulfonylamino, phenyl sulfonylamino, 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio, or n-hexadecylthio), an arylthio group (preferably substituted or unsubstituted arylthio having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, an alkyl and aryl sulfinyl group (preferably a substituted or unsubstituted alkyl sulfinyl group having 1 to 30 carbon atoms and a substituted or unsubstituted aryl sulfinyl group having 6 to 30 carbon atoms, for example, methyl sulfinyl, ethyl sulfinyl, phenyl sulfinyl, or p-methylphenyl sulfinyl), an alkyl or aryl sulfonyl group (preferably a substituted or unsubstituted alkyl sulfonyl group having 1 to 30 carbon atoms and a substituted or unsubstituted aryl sulfonyl group having 6 to 30 carbon atoms, for example, methyl sulfonyl, ethyl sulfonyl, phenyl sulfonyl, or p-methylphenyl sulfonyl), an acyl group (preferably a formyl group, a substituted or unsubstituted alkyl carbonyl group having 2 to 30 carbon atoms, a substituted or unsubstituted aryl carbonyl group having 7 to 30 carbon atoms, or a substituted or unsubstituted heterocyclic carbonyl group having 4 to 30 carbon atoms that is bonded to a carbonyl group through carbon atoms, for example, acetyl, pivaloyl, 2-chloroacetyl, stearoyl, benzoyl, or p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), an aryl and heterocyclic azo group (preferably a substituted or unsubstituted arylazo group having 6 to 30 carbon atoms and a substituted or unsubstituted heterocyclic azo group having 3 to 30 carbon atoms, for example, phenylazo, p-chlorophenylazo, or 5-ethylthio-1,3,4-thiadiazol-2-ylazo), an imide group (preferably N-succinimide or N-phthalimide), a phosphino group (preferably a substituted or unsubstituted phosphino group having 2 to 30 carbon atoms, for example, dimethylphosphino, diphenylphosphino, or methyl phenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), and a silyl group (preferably a substituted or unsubstituted silyl group having 3 to 30 carbon atoms, for example, trimethyl silyl, t-butyl dimethyl silyl, or phenyl dimethyl silyl).

Among the above functional groups, from the functional groups having hydrogen atoms, the hydrogen atoms may be removed, and then the functional groups may be substituted with the above groups. Examples of such functional groups include an alkyl carbonyl aminosulfonyl group, an arylcarbonylaminosulfonyl group, an alkylsulfonyl aminocarbonyl group, an aryl sulfonylaminocarbonyl group, methylsulfonylaminocarbonyl group, p-methylphenylsulfonylaminocarbonyl group, acetylaminosulfonyl group, and a benzoylaminosulfonyl group.

The alkoxy group represented by $R^{41}$ and $R^{42}$ represents a substituted or unsubstituted linear, branched, or cyclic alkoxy group. The alkoxy group preferably has 1 to 50 carbon atoms, more preferably has 1 to 30 carbon atoms, and particularly preferably has 1 to 20 carbon atoms. Preferable examples of the alkoxy group include methoxy, ethoxy, n-propoxy, isopropoxy, cyclopropoxy, butoxy, isobutoxy, t-butoxy, sec-butoxy, pentyloxy, isopentyloxy, neopentyloxy, t-pentyloxy, hexyloxy, cyclohexyloxy, pentyloxy, cyclopentyloxy, octyloxy, 2-ethylhexyloxy, nonyloxy, decyloxy, dodecyloxy, tetradecyloxy, hexadecyloxy, octadecyloxy, eicosyloxy, docosyloxy, triacontyloxy, and the like. Among these, methoxy, ethoxy, n-propoxy, isopropoxy, butoxy, isobutoxy, t-butoxy, sec-butoxy, heptyloxy, isopentyloxy, neopentyloxy, hexyloxy, cyclohexyloxy, octyloxy, 2-ethylhexyloxy, dodecyloxy, hexadecyloxy, and octadecyloxy are more preferable; and methoxy, ethoxy, n-propoxy, isopropoxy, t-butoxy, pentyloxy, isopentyloxy, hexyloxy, cyclohexyloxy, octyloxy, 2-ethylhexyloxy, dodecyloxy, hexadecyloxy, and octadecyloxy are particularly preferable.

The alkoxy group represented by $R^{41}$ and $R^{42}$ may further have a substituent. Examples of the substituent include the substituents of the alkyl group represented by $R^1$ and $R^2$.

The aryl group represented by $R^{41}$, $R^{42}$, and $R^{43}$ represents a substituted or unsubstituted aryl group. The aryl group preferably has 6 to 50 carbon atoms, more preferably has 6 to 30 carbon atoms, and particularly preferably has 6 to 20 carbon atoms. Preferable examples thereof include phenyl, 2-methylphenyl, 3-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 3-chlorophenyl, 4-chlorophenyl, 2-methoxyphenyl, 3-methoxyphenyl, 4-methoxyphenyl, 2-benzylphenyl, 4-benzylphenyl, 2-methylcarbonylphenyl, 4-methylcarbonylphenyl, and the like.

Among these, phenyl, 2-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 3-methoxyphenyl, 4-methoxyphenyl, 2-benzylphenyl, 4-benzylphenyl, and the like are more preferable, and phenyl and the like are particularly preferable.

The aryl group represented by $R^{41}$, $R^{42}$, and $R^{43}$ may further have a substituent, and examples of the substituent include the substituents of the alkyl group represented by $R^1$ and $R^2$.

The aryloxy group represented by $R^{41}$ and $R^{42}$ represents a substituted or unsubstituted aryloxy group. The aryloxy group preferably has 6 to 50 carbon atoms, more preferably has 6 to 30 carbon atoms, and particularly preferably has 6 to 20 carbon atoms. Preferable examples thereof include phenoxy, 2-methylphenoxy, 3-methylphenoxy, 4-methylphenoxy, 2-ethylphenoxy, 4-ethylphenoxy, 2,4-dimethylphenoxy, 2,4-di-t-butylphenoxy, 2,6-di-t-butylphenoxy, 2,6-dimethylphenoxy, 2,6-di-t-butyl-4-methylphenoxy, 2,4,6-trimethylphenoxy, 2,4,6-tri-t-butylphenoxy, 1-naphthyloxy, 2-naphthyloxy, 2-chlorophenoxy, 3-chlorophenoxy, 4-chlorophenoxy, 2-methoxyphenoxy, 3-methoxyphenoxy, 4-methoxyphenoxy, 2-benzylphenoxy, 4-benzylphenoxy, 2-methylcarbonylphenoxy, 4-methylcarbonylphenoxy, and the like.

Among these, phenyl, 2,4-di-t-butylphenoxy, 2,4,6-tri-t-butylphenoxy, and the like are more preferable.

The aryloxy group represented by $R^{41}$ and $R^{42}$ may further have a substituent. Examples of the substituent include the substituents of the alkyl group represented by $R^1$ and $R^2$.

In Formula (4), in terms of the resistance to moist heat, $R^{41}$ and $R^{42}$ are preferably an alkoxy group or an aryloxy group, and $R^{43}$ is preferably an alkyl group or an aryl group.

In Formula (4), at least two among $R^{41}$, $R^{42}$, and $R^{43}$ may be linked to each other through an organic group having a valency of 2 or higher or through a single bond.

When one hydrogen atom is removed from at least one of the $R^{41}$, $R^{42}$, and $R^{43}$, the compound represented by Formula (4) becomes a monovalent group, and the compound represented by Formula (4) includes a compound having plural structures represented by Formula (4) that are formed when the monovalent group is linked to at least one of the $R^{41}$, $R^{42}$, and $R^{43}$ through an organic group having a valency of 2 or higher or through a single bond in a single molecule.

Specifically, for example, when one hydrogen atom is removed from the alkyl group, aryl group, alkoxy group, or aryloxy group represented by at least one of the $R^{41}$, $R^{42}$, and $R^{43}$, an alkylene group, an arylene group, an alkoxylene group, or an arylether group is formed. Examples of the compound represented by Formula (4) include compounds formed when such a monovalent group is linked to at least one of the alkyl group, aryl group, alkoxy group, or aryloxy group represented by at least one of the $R^{41}$, $R^{42}$, and $R^{43}$ through an organic group having a valency of 2 or higher or through a single bond.

Alternatively, when the alkyl group, aryl group, alkoxy group, or aryloxy group represented by at least one of the $R^{41}$, $R^{42}$, and $R^{43}$ has the aforementioned substituent, if one hydrogen atom is removed from the substituent, a monovalent group is formed. Examples of the compound represented by Formula (4) include compounds formed when such a monovalent group is linked to at least one of the alkyl group, aryl group, alkoxy group, or aryloxy group represented by at least one of the $R^{41}$, $R^{42}$, and $R^{43}$ or linked to at least one of the substituent of the alkyl group, aryl group, alkoxy group, or an aryloxy group through an organic group having a valency of 2 or higher or through a single bond.

Examples of the organic group having a valency of 2 or higher includes group having a valency of 2 or higher that are formed when one or more hydrogen atoms are removed from the substituents exemplified for the alkyl groups represented by the $R^{41}$, $R^{42}$, and $R^{43}$.

Among the organic group and single bond, a single bond or a group having a valency of 2 or higher that is formed when one or more hydrogen atoms are removed from an alkyl group, an aryl group, a bisaryl group, an arylalkyl aryl group, an aryloxyaryl group, an alkoxyalkyl group, an alkoxyaryl group, or an alkylaryl group is preferable.

When the compound represented by Formula (4) is a compound having plural structures represented by Formula (4) in a single molecule, the number of phosphorus atoms in the single molecule is preferably from 2 to 20, more preferably from 2 to 10, and even more preferably from 2 to 5.

Specific examples of the compound represented by the Formula (4) will be shown below, but the present invention is not limited thereto.

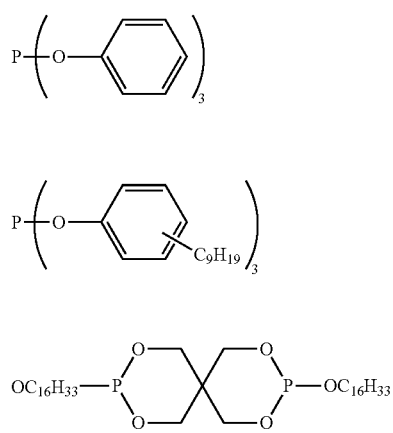
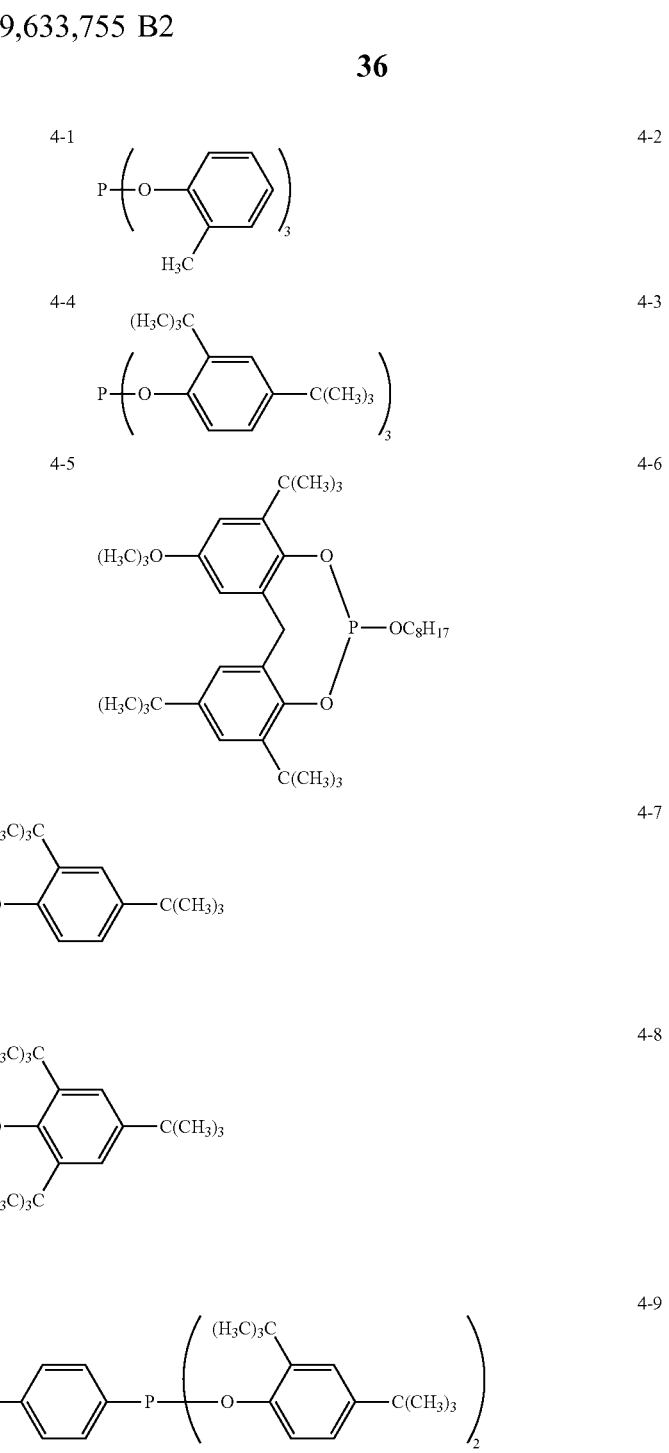
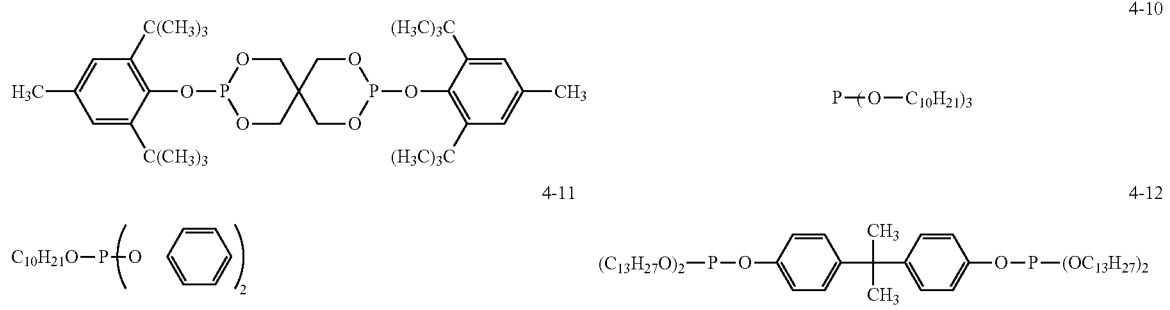

-continued

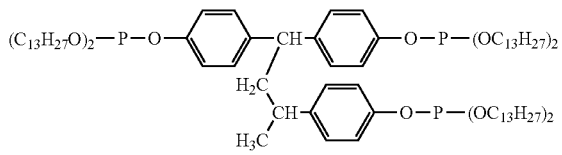
4-13

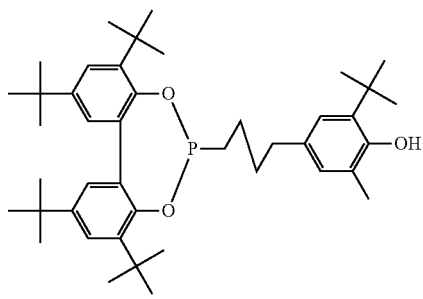
4-14

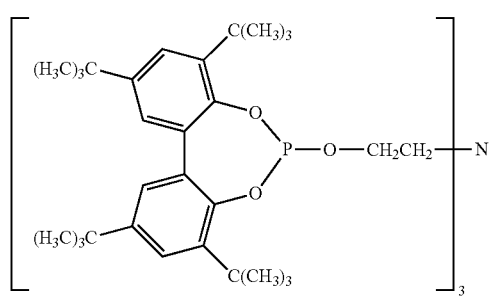
4-17

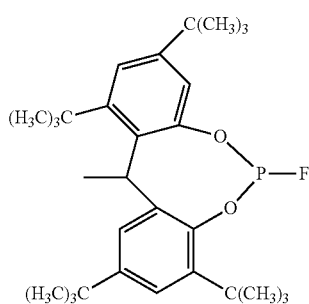
4-16

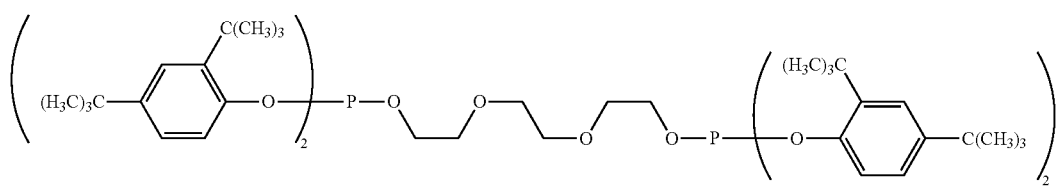
4-18

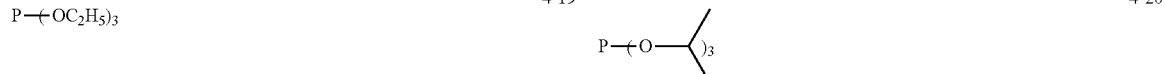
4-19

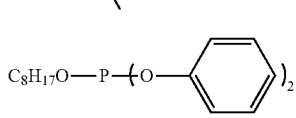
4-20

4-21 4-22

4-23

Moreover, as the compound represented by Formula (4), a phosphorous acid ester compound described in JP 2011-527357A can also be preferably used.

In the compound represented by the Formula (5), each of $R^{51}$ and $R^{52}$ independently represents an alkyl group.

The alkyl group represented by $R^{51}$ and $R^{52}$ represents a substituted or unsubstituted linear, branched, or cyclic alkyl group. The alkyl group preferably has 1 to 50 carbon atoms, more preferably has 2 to 30 carbon atoms, and particularly preferably has 2 to 20 carbon atoms. Preferable examples of the alkyl group include methyl, ethyl, n-propyl, isopropyl, cyclopropyl, butyl, isobutyl, t-butyl, sec-butyl, pentyl, isopentyl, neopentyl, t-pentyl, hexyl, cyclohexyl, heptyl, cyclopentyl, octyl, 2-ethylhexyl, nonyl, decyl, dodecyl, tetradecyl, hexadecyl, octadecyl, eicosyl, docosyl, triacontyl, and the like. Among these, methyl, ethyl, n-propyl, isopropyl, butyl, isobutyl, t-butyl, sec-butyl, pentyl, isopentyl, neopentyl, hexyl, cyclohexyl, octyl, 2-ethylhexyl, dodecyl, hexadecyl, and octadecyl are more preferable; and methyl, ethyl, n-propyl, isopropyl, butyl, t-butyl, pentyl, isopentyl, hexyl, cyclohexyl, octyl, 2-ethylhexyl, dodecyl, hexadecyl, and octadecyl are particularly preferable.

The alkyl group represented by $R^{51}$ and $R^{52}$ may further have a substituent. Examples of the substituent include a halogen atom, an alkyl group (including a cycloalkyl group), alkenyl group (including a cycloalkenyl group and a bicycloalkenyl group), an alkynyl group, an aryl group, a cyano group, a hydroxyl group, a nitro group, a carboxyl group, an alkoxy group, an aryloxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, an acyl group, an aryloxycarbonyl group, an alkoxycarbonyl group, and a carbamoyl group.

Among the substituted alkyl groups represented by $R^{51}$ and $R^{52}$, an alkoxycarbonylalkylene group is preferable. In the alkoxycarbonylalkylene group, the number of carbon atoms of the alkoxycarbonyl group is preferably 2 to 50, more preferably 5 to 30, and particularly preferably 9 to 20.

$R^{51}$ and $R^{52}$ in Formula (5) may be linked to each other through an organic group having a valency of 2 or higher or through a single bond. Herein, the organic group having a valency of 2 or higher is the same as described for the Formula (4), and a preferable range thereof is also the same.

Moreover, the compound represented by Formula (5) becomes a monovalent group when one hydrogen atom is removed from at least one of the $R^{51}$ and $R^{52}$, and the compound represented by Formula (5) includes a compound having plural structures represented by Formula (5) that are formed when the monovalent group is linked to at least one of the $R^{51}$ and $R^{52}$ through an organic group having a valency of 2 or higher or through a single bond in a single molecule. Herein, the organic group having a valency of 2 or higher is the same as described for the Formula (4), and a preferable range thereof is also the same.

Specific examples of the compound represented by the Formula (5) will be shown below, but the present invention is not limited thereto.

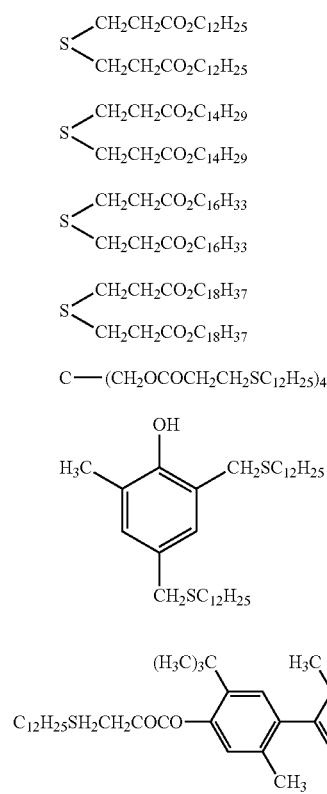

In Formula (6), $V_{61}$ represents a hydrogen atom or a substituent.

The group represented by $V_{61}$ in Formula (6) shows a binding form in which the group binds to any substitutable position of the cyclic structure contained in Formula (6), in any number within a range from 1 to 2. When $V_{61}$ represents a substituent, preferable examples of the substituent include the substituents exemplified for the alkyl group represented by $R^1$ and $R^2$ in the Formula (1). When there are plural groups represented by $V_{61}$ in Formula (6), the groups may be the same as or different from each other or may form a ring by being bonded to each other.

Specific examples of the compound represented by Formula (6) will be shown below, but the present invention is not limited thereto.

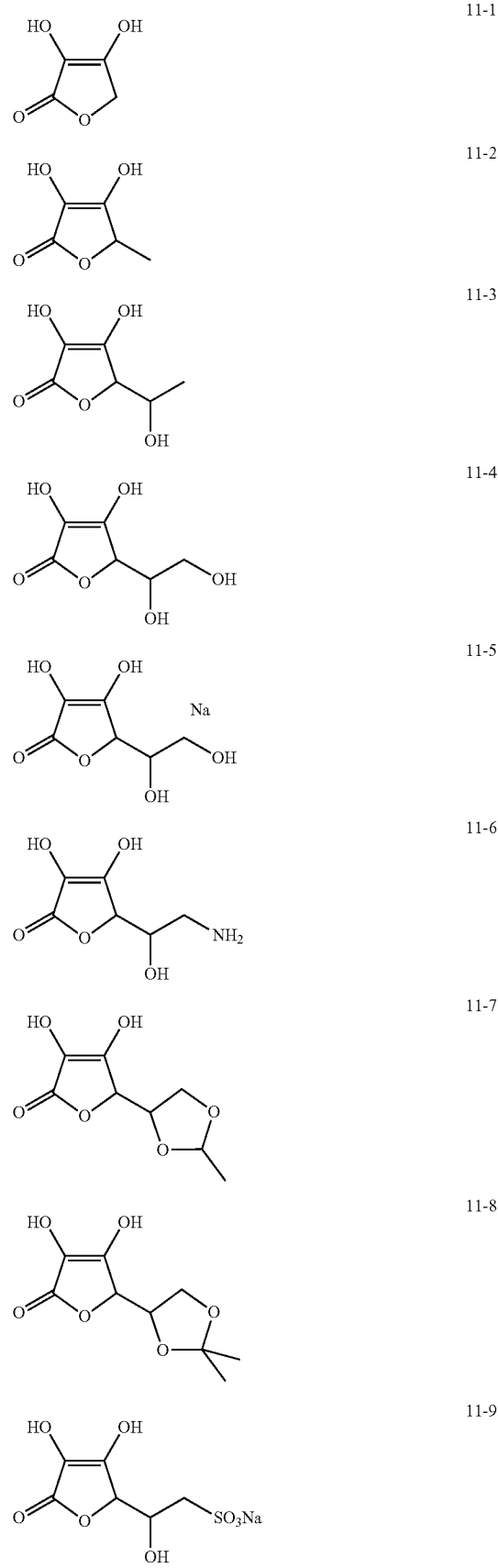

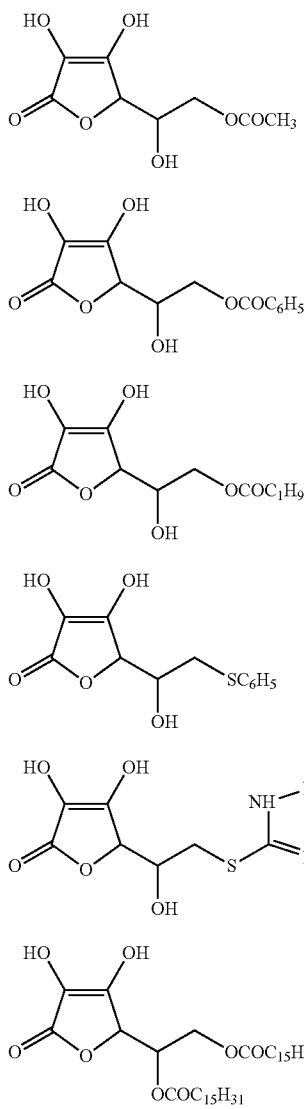

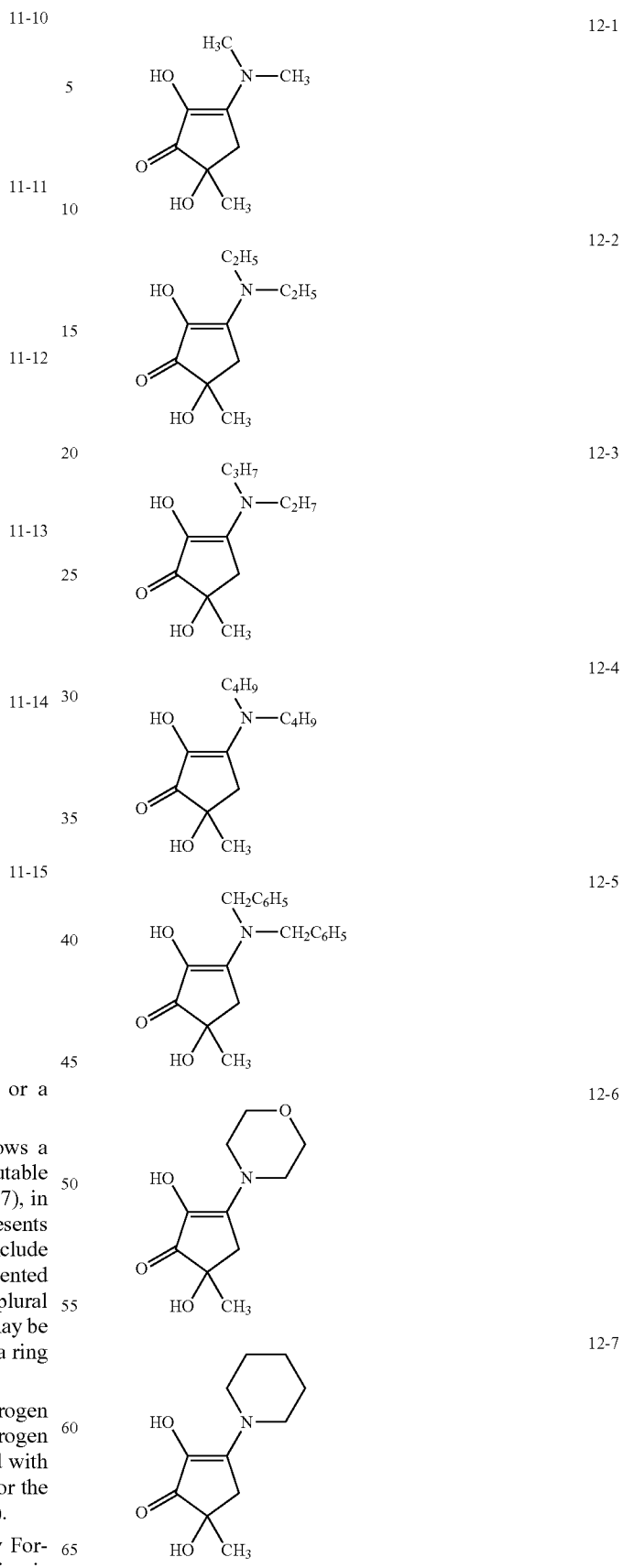

In Formula (7), $V_{71}$ represents a hydrogen atom or a substituent.

The group represented by $V_{71}$ in Formula (7) shows a binding form in which the group binds to any substitutable position of the cyclic structure contained in Formula (7), in any number within a range from 1 to 4. When $V_{71}$ represents a substituent, preferable examples of the substituent include the substituents exemplified for the alkyl group represented by $R^1$ and $R^2$ of the Formula (1). When there are plural groups represented by $V_{71}$ in Formula (7), the groups may be the same as or different from each other or may form a ring by being bonded to each other.

Each of $R^{71}$ and $R^{72}$ independently represents a hydrogen atom or a group which can be substituted with a nitrogen atom. Examples of the group which can be substituted with a nitrogen atom include the substituents exemplified for the alkyl group represented by and $R^2$ in the Formula (1).

Specific examples of the compound represented by Formula (7) will be shown below, but the present invention is not limited thereto.

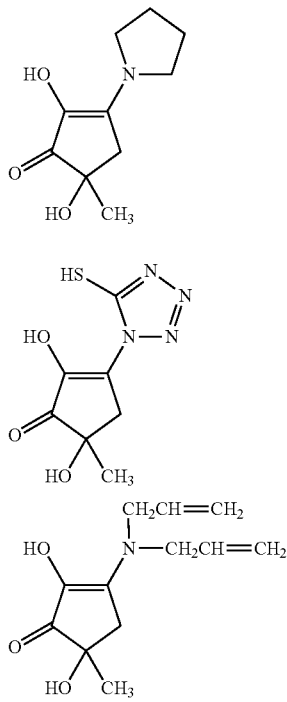

12-8

12-9

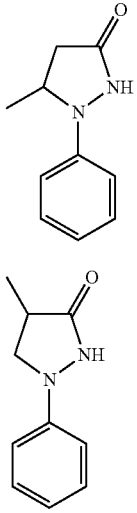

5

10

13-2

13-4

15

20

13-5

25

30

In Formula (8), $V_{81}$ represents a hydrogen atom or a substituent.

The group represented by $V_{81}$ in Formula (8) shows a binding form in which the group binds to any substitutable position of the cyclic structure contained in Formula (8), in any number within a range from 1 to 4. When $V_{81}$ represents a substituent, preferable examples of the substituent include the substituents exemplified for the alkyl group represented by $R^1$ and $R^2$ in the Formula (1). When there are plural groups represented by $V_{81}$ in Formula (8), the groups may be the same as or different from each other or may form a ring by being bonded to each other.

Each of $R_{81}$ and $R_{82}$ independently represents a hydrogen atom or a group which can be substituted with a nitrogen atom. Examples of the group which can be substituted with a nitrogen atom include the substituents exemplified for the alkyl group represented by and $R^2$ in the Formula (1).

Specific examples of the compound represented by Formula (8) will be shown below, but the present invention is not limited thereto.

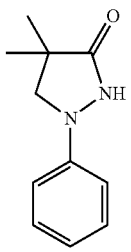

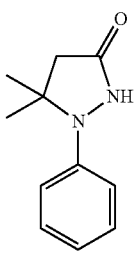

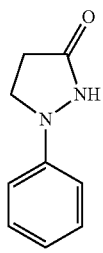

13-1

13-6

13-7

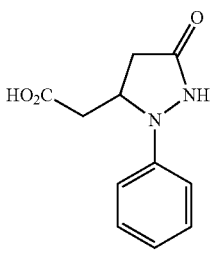

13-8

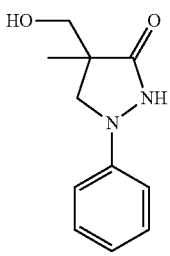

-continued
13-9 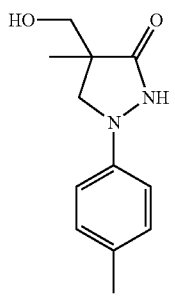
13-10 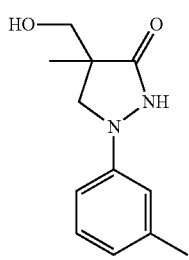
13-11 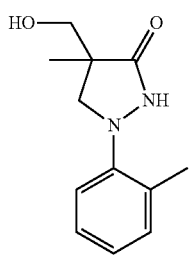
13-12 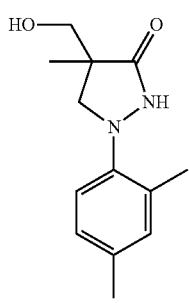
13-13 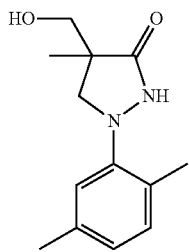
13-14 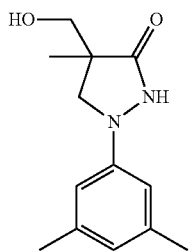
-continued
13-15 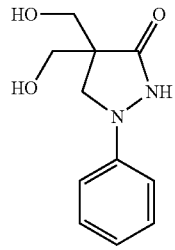
13-16 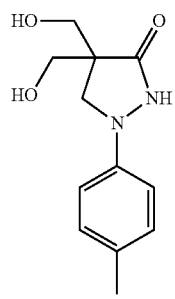
13-17 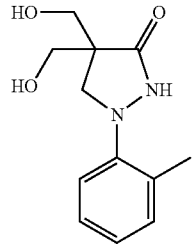
13-18 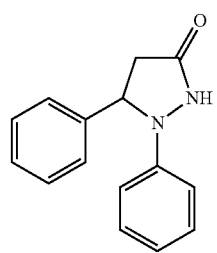
13-19 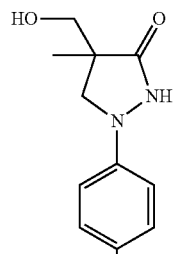
13-20 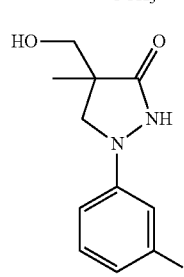

13-21
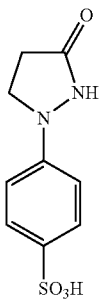

13-22
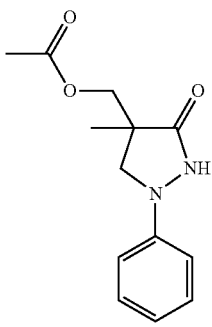

13-23
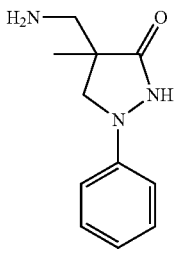

13-24
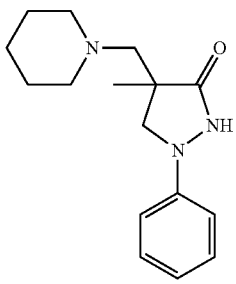

13-25
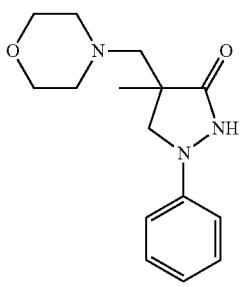

13-26
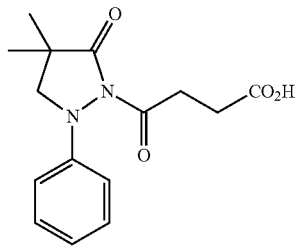

In Formula (9), $V_{91}$ represents a hydrogen atom or a substituent.

The group represented by $V_{91}$ in Formula (9) shows a binding form in which the group binds to any substitutable position of the cyclic structure contained in Formula (9), in any number within a range from 1 to 2. When $V_{91}$ represents a substituent, preferable examples of the substituent include the substituents exemplified for the alkyl group represented by $R^1$ and $R^2$ in the Formula (1). When there are plural groups represented by $V_{91}$ in Formula (9), the groups may be the same as or different from each other or may form a ring by being bonded to each other.

Each of $R_{91}$, $R_{92}$, and $R_{93}$ independently represents a hydrogen atom or a group which can be substituted with a nitrogen atom. Preferable examples of the group which can be substituted with a nitrogen atom include the substituents exemplified for the alkyl group represented by $R^1$ and $R^2$ in the Formula (1).

Specific examples of the compound represented by Formula (9) will be shown below, but the present invention is not limited thereto.

14-1
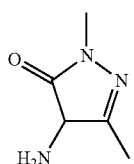

14-2
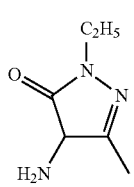

14-3
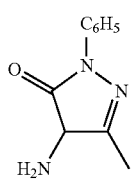

14-4
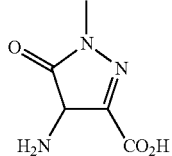

-continued

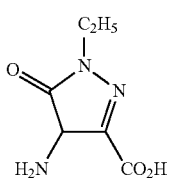
14-5

14-6

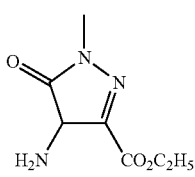
14-7

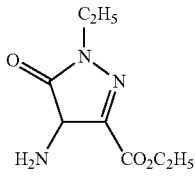
14-8

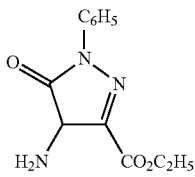
14-9

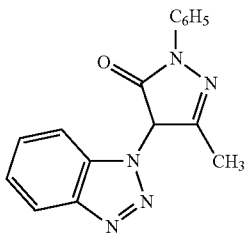
14-10

For producing the compounds represented by Formulae (4) to (9), any known method can be used. Various conditions such as temperature, selection of a solvent, and type and amount of a reaction agent in producing the compounds can be set by those skilled in the art. The conditions can be set experimentally, and those skilled in the art can easily product the compounds.

When the compounds represented by Formulae (4) to (9) are added to the conductive composition, the ratio of the added compounds to the (b) component compound is preferably 1,000 to 0.001, more preferably 100 to 0.01, and even more preferably 10 to 0.1, in terms of a molar ratio (Formulae (4) to (9)/(b) component compound). If the molar ratio is controlled to be equal to or higher than 0.001, storability of the conductive metal fiber becomes excellent, and if it is controlled to be equal to or lower than 1,000, it is excellent in terms of haze of the conductive member.

The compounds represented by Formulae (4) to (9) are added to the conductive composition, in the same manner as the (b) component compound.

For the following reason, it is inefficient to add beforehand the compounds represented by Formulae (6) to (9) to the conductive composition at the time of producing the conductive metal fiber. If the compounds are added as above, a negative influence is exerted on control of the shape of the conductive metal fiber in some cases. Moreover, in a process of washing the formed conductive metal fibers, most of the fibers are removed. Consequentially, the amount of the fiber becomes smaller than the amount required for exerting the effects of the present invention, and as a result, it is necessary to make up for the shortage again.

(c) Matrix

The conductive composition of the present invention may further contain a polymerizable compound that can form a matrix. Herein, the "matrix" is a generic term of substances containing the conductive metal fibers and forming a layer and functions to keep the conductive metal fibers dispersed stably. The matrix may be non-photosensitive or photosensitive. It is more preferable for the conductive layer to contain the matrix, since the conductive metal fibers are kept stably dispersed in the conductive layer, and the substrate strongly adheres to the conductive layer even when the conductive layer is directly formed on the substrate surface without the aid of an adhesive layer.

Furthermore, when the matrix is a non-photosensitive matrix as illustrated below for example, the "polymerizable compound that can form a matrix" refers to an alkoxide compound of an element selected from a group consisting of methacrylate or acrylate which can from an organic polymer and Si, Ti, Zr, and Al which can form an inorganic polymer, a polymer in a state of sol that is obtained by performing hydrolysis and polycondensation on a portion of such an alkoxide compound, and the like. In addition, when the matrix is a photosensitive matrix, the polymerizable compound refers to an addition-polymerizable unsaturated compound and the like contained in the photoresist composition which will be described later.

When the conductive composition of the present invention contains the polymerizable compound that can form a matrix, a content ratio of the polymerizable compound that can form a matrix/conductive metal fibers is preferably within an range of 0.001/1 to 100/1 in terms of a mass ratio. If the above range is set, a conductive member is obtained in which an adhesive force of the conductive layer with respect to the substrate and surface resistivity are appropriate. The content ratio of the polymerizable compound that can form a matrix/conductive metal fibers is more preferably within a range from 0.01/1 to 20/1, even more preferably within a range from 1/1 to 15/1, and particularly preferably within a range from 2/1 to 8/1, in terms of a mass ratio.

Moreover, as explained for the conductive member production method which will be described later, the conductive metal fibers and the polymerizable compound that can form a matrix may be separately applied onto the substrate so as to form a conductive layer. In this method, the conductive composition may not contain the polymerizable compound that can form a matrix.

[Non-Photosensitive Matrix]

The non-photosensitive matrix will be described. Preferable examples of the non-photosensitive matrix include matrixes containing an organic polymer or an inorganic polymer.

Examples of the organic polymer include polymethacrylate (for example, methyl polymethacrylate and a copolymer containing polymethacrylic acid ester), polyacrylate (for example, methyl polyacrylate and a copolymer containing polyacrylic acid ester), polyacrylonitrile, polyvinyl alcohol, polyester (for example, polyethylene terephthalate (PET), polyethylene naphthalate, and polycarbonate), a phenol or cresol formaldehyde resin (for example, Novolacs (registered trademark)), polymers having a high degree of aromaticity, such as polystyrene, polyvinyl toluene, polyvinyl xylene, polyimide, polyamide, polyamideimide, polyetherimide, polysulfide, polusulfone, polyphenylene, and polyphenyl ether, polyurethane (PU), an epoxy resin, polyolefin (for example, polyethylene, polypropylene, and polycycloolefin), an acrylonitrile-butadiene-styrene copolymer (ABS), cellulose derivatives, silicone, a silicon-containing polymer (for example, polysilsesquioxane and polysilane), polyvinyl chloride (PVC), polyacetate, polynorbornene, synthetic rubber (for example, EPR, SBR, and EPDM), a fluorine-containing polymer (for example, polyvinylidene fluoride, polytetrafluoroethylene (TF(E), polyhexafluoropropylene), hydrocarbon olefin (for example, "LUMIFLON" (registered trademark) manufactured by ASAHI GLASS CO., LTD.), an amorphous fluorocarbon polymer or copolymer (for example, "CYTOP" (registered trademark) manufactured by ASAHI GLASS CO., LTD. and "Teflon" registered trademark) manufactured by DuPont), and the like. However, the present invention is not limited to these.

Examples of the inorganic polymer include a cured sol-gel substance obtained by using, as the polymerizable compound that can form a matrix, an alkoxide compound of an element selected from a group consisting of Si, Ti, Zr, and Al, performing hydrolysis and polycondensation on the polymerizable compound, and heating and drying the resultant if necessary.

The cured sol-gel substance is preferable since the material makes it possible to easily produce a matrix highly resistant to scratch and abrasion.

The specific alkoxide compound described above is preferably a compound represented by the following Formula (10).

$$M(OR^p)_a R^q_{4-a} \qquad (10)$$

In Formula (10), M represents an element selected from Si, Ti, Al, and Zr; each $R^p$ independently represents a hydrogen atom or a hydrocarbon group; each $R^q$ independently represents a hydrogen atom or a hydrocarbon group; and a represents an integer from 2 to 4.

Preferable examples of the hydrocarbon group represented by each of the $R^p$ and $R^q$ in Formula (10) include an alkyl group and an aryl group.

When the hydrocarbon group is an alkyl group, the alkyl group preferably has 1 to 18 carbon atoms, more preferably has 1 to 8 carbon atoms, and even more preferably has 1 to 4 carbon atoms. Moreover, when the hydrocarbon group is an aryl group, a phenyl group is preferable.

The alkyl group and aryl group may further have a substituent. Examples of the substituent that can be introduced include the substituents exemplified for the alkyl groups represented by $R^1$ and $R^2$ in the Formula (1). It is preferable for the compound to have a molecular weight of equal to or smaller than 1,000.

Specific examples of the compound represented by Formula (10) will be shown below, but the present invention is not limited thereto.

(Alkoxysilane)

When M is Si, and a is 2, that is, when the compound is dialkoxysilane, examples thereof include dimethyl dimethoxysilane, diethyl dimethoxysilane, propylmethyl dimethoxysilane, dimethyldiethoxysilane, diethyldiethoxysilane, dipropyl diethoxysilane, γ-chloropropylmethyldiethoxysilane, acetoxymethyl methyldiethoxysialne, acetoxymethyl methyldimethoxysilane, phenylmethyl dimethoxysilane, phenylethyl diethoxysilane, phenylmethyl dipropoxysilane, vinylmethyl dimethoxysilane, vinylmethyl diethoxysilane, vinylmethyl dibutoxysilane, isopropenylmethyl dimethoxysilane, isopropenylmethyl diethoxysilane, isopropenylmethyl dibutoxysilane, and the like. Among these, from the viewpoint of easy availability and adhesiveness with respect to a hydrophilic layer, dimethyl dimethoxysilane, diethyl dimethoxysilane, dimethyl diethoxysilane, diethyl diethoxysilane, and the like are particularly preferable.

When M is Si, and a is 3, that is, when the compound is trialkoxysilane, examples thereof include methyl trimethoxysilane, ethyl trimethoxysilane, propyl trimethoxysilane, methyl triethoxysilane, ethyl triethoxysilane, propyl triethoxysilane, chloromethyl triethoxysilane, vinyl trimethoxysilane, isopropenyl trimethoxysilane, isopropenyl triethoxysilane, and the like. Among these, from the viewpoint of easy availability and adhesiveness with respect to a hydrophilic layer, methyl trimethoxysilane, ethyl trimethoxysilane, methyl triethoxysilane, ethyl triethoxysilane, and the like are particularly preferable.

When M is Si, and a is 4, that is, when the compound is tetraalkoxysilane, examples thereof include tetramethoxysilane, tetraethoxysilane, tetrapropoxysilane, tetrabutoxysilane, methoxytriethoxysilane, ethoxytrimethoxysilane, methoxytripropoxysilane, ethoxytripropoxysilane, propoxytrimethoxysilane, propoxytriethoxysilane, dimethoxydiethoxysilane, and the like. Among these, tetramethoxysilane, tetraethoxysilane, and the like are particularly preferable.

(Alkoxytitanate)

When M is Ti, and a is 2, that is, when the compound is dialkoxytitanate, examples thereof include dimethyl dimethoxytitanate, diethyl dimethoxytitanate, propylmethyl dimethoxytitanate, dimethyl diethoxytitanate, diethyl diethoxytitanate, dipropyl diethoxytitanate, phenylethyl diethoxytitanate, phenylmethyl dipropoxytitanate, dimethyl dipropoxytitanate, and the like.

When M is Ti, and a is 3, that is, when the compound is trialkoxytitanate, examples thereof include methyl trimethoxytitanate, ethyl trimethoxytitanate, propyl trimethoxytitanate, methyl triethoxytitanate, ethyl triethoxytitanate, propyl triethoxytitanate, chloromethyl triethoxytitanate, phenyl trimethoxytitanate, phenyl triethoxytitanate, phenyl tripropoxytitanate, and the like.

When M is Ti, and a is 4, that is, when the compound is tetraalkoxytitanate, examples thereof include tetramethoxytitanate, tetraethoxytitanate, tetrapropoxytitanate, tetraisopropoxytitanate, tetrabutoxytitanate, and the like.

(Alkoxide of Zirconium or Aluminum)

When M is Zr, that is, when the compound is alkoxide of zirconium, examples thereof include zirconate corresponding to the compound exemplified above as the compound containing titanium.

When M is Al, that is when the compound is alkoxide of aluminum, examples thereof include trimethoxyaluminate, triethoxyaluminate, tripropoxyaluminate, tetraethoxyaluminate, and the like.

These specific alkoxides can be easily obtained in the form of commercially available products. Moreover, they may be produced by a known synthesis method, for example, a reaction between a metal chloride and any alcohol.

As the specific alkoxide, one kind of compound may be used singly, or two or more kinds of compounds may be used in combination.

It is preferable for the conductive layer containing the cured sol-gel substance as a matrix to be formed in a manner in which an aqueous solution containing the specific alkoxide compound is used as a coating solution (hereinafter, also referred to as "sol-gel coating solution") and coated onto a substrate to form a coating solution film, reactions including hydrolysis and polycondensation of the specific alkoxide compound (hereinafter, the reactions including hydrolysis and polycondensation are referred to as "sol-gel reaction") are caused in the coating solution film, and the resultant is dried if necessary by evaporating water by means of heating.

In preparing the sol-gel coating solution, a dispersion of the conductive metal fibers may be separately prepared in advance, and then the dispersion may be mixed with the specific alkoxide compound. Moreover, after a solution containing the specific alkoxide compound is prepared, the solution may be heated such that the solution is put in a state of sol by means of causing at least a portion of the specific alkoxide compound to undergo hydrolysis and polycondensation, and the solution in the state of sol may be mixed with the dispersion of the conductive metal fibers to obtain the sol-gel coating solution.

(Catalyst)

When the conductive composition of the present invention contains the specific alkoxide, in order to accelerate the sol-gel reaction, it is preferable to add an acidic catalyst or a basic catalyst. The catalyst will be described below.

As the catalyst, any catalyst can be used as long as it accelerates the reactions including hydrolysis and polycondensation of the alkoxide compound.

Such a catalyst include an acid or a basic compound, and these can be used as is. Alternatively, an acid or a basic compound dissolved in a solvent such as water or alcohol may be used (hereinafter, the acid and the basic compound in such a state will be referred to as an acidic catalyst and a basic catalyst respectively).

When the acid or basic compound is dissolved in a solvent, the concentration thereof is not particularly limited and may be appropriately determined according to the characteristics of the acid or basic compound to be used, an intended content of the catalyst, and the like. When the concentration of the acid or basic compound constituting the catalyst is high, speed of hydrolysis and polycondensation tends to be heightened. However, if a basic catalyst with an excessively high concentration is used, precipitates are generated, and defects are formed in the conductive layer in some cases. Accordingly, when the basic catalyst is used, the concentration thereof is preferably equal to or lower than 1 N expressed in terms of a concentration in an aqueous solution.

The type of acidic catalyst or basic catalyst is not particularly limited. However, when a catalyst with a high concentration needs to be used, it is preferable to use a compound that practically does not leave residue in the dried conductive layer. Specific examples of the acidic catalyst include hydrogen halide such as hydrochloric acid, nitric acid, sulfuric acid, sulfurous acid, hydrogen sulfide, perchloric acid, hydrogen peroxide, carbonic acid, carboxylic acid such as formic acid and acetic acid, substituted carboxylic acid obtained when R of the structural formula thereof represented by RCOOH is substituted with other elements or substituents, sulfonic acid such as benzenesulfonic acid, and the like. Examples of the basic catalyst include an ammoniacal base such as aqueous ammonia, an amine such as ethyl amine or aniline, and the like.

A Lewis acid catalyst formed of a metal complex can also be preferably used. Particularly, a metal complex catalyst is preferable as a catalyst, and the metal complex is constituted with a metal element selected from group 2, group 13, group 4 and group 5 on the periodic table and an oxygen-containing oxo or hydroxy compound selected from β-diketone, ketoester, hydroxycarboxylic acid or an ester thereof, aminoalcohol, and an enolic active hydrogen compound.

Among the constituent metal elements, elements of group 2, such as Mg, Ca, St, and Ba, elements of group 13, such as Al and Ga, elements of group 4, such as Ti and Zr, and elements of group 5, such as V, Nb, and Ta are preferable. Each of these forms a complex excellent in a catalyst effect. Among these, Zr, Al, and Ti are preferable since they form an excellent complex.

In the present invention, examples of the oxygen-containing oxo or hydroxy compound constituting a ligand of the above metal complex include β-diketone such as acetylacetone(2,4-pentanedione) and 2,4-heptanedione, a ketoester such as methyl acetoacetate, ethyl acetoacetate, and butyl acetoacetate, hydroxycarboxylic acid and an ester thereof such as lactic acid, methyl lactate, salicylic acid, ethyl salicylate, phenyl salicylate, malic acid, tartaric acid, and methyl tartrate, a ketoalcohol such as 4-hydroxy-4-methyl-2-heptanone, 4-hydroxy-2-heptanone, 4-hydroxy-4-methyl-2-heptanone, and 4-hydroxy-2-heptanone, an aminoalcohol such as monoethanolamine, N,N-dimethylethanolamine, N-methyl-monoethanolamine, diethanolamine, and triethanolamine, an enolic active compound such as methylol melamine, methylol urea, methylol acrylamide, and malonic acid diethyl ester, a compound having a substituent on a methyl group, a methylene group, or carbonyl carbon of acetylacetone(2,4-pentanedione).

As the ligand, an acetylacetone derivative is preferable, and in the present invention, the acetylacetone derivative refers to a compound having a substituent on a methyl group, a methylene group, or carbonyl carbon of acetylacetone. The substituent substituted with the methyl group of acetylacetone is a linear or branched alkyl group, acyl group, a hydroxyalkyl group, a carboxyalkyl group, an alkoxy group, or an alkoxyalkyl group having 1 to 3 carbon atoms. The substituent substituted with the methylene group of acetylacetone is a carboxyl group or a linear or branched carboxyalkyl group and hydroxyalkyl group having 1 to 3 carbon atoms. The substituent substituted with the carbonyl carbon of acetylacetone is an alkyl group having 1 to 3 carbon atoms. In this case, a hydrogen atom is added to carbonyl oxygen, and thus a hydroxyl group is formed.

Specific examples of preferable acetylacetone derivatives include ethylcarbonylacetone, n-propylcarbonylacetone, i-propylcarbonylacetone, diacetyl acetone, 1-acetyl-1-propionyl-acetylacetone, hydroxyethylcarbonylacetone, hydroxypropylcarbonylacetone, acetoacetic acid, acetopropionic acid, diacetoacetic acid, 3,3-diacetopropionic acid, 4,4-diacetobutyric acid, carboxyethylcarbonylacetone, carboxypropylcarbonylacetone, and diacetone alcohol. Among these, acetylacetone and diacetylacetone are particularly preferable. The complex consisting of the acetylacetone derivative and the aforementioned metal element is a mononuclear complex in which 1 to 4 acetylacetone derivatives are coordinated with one metal element. When the number of bond of the metal element that can form a coordinate bond is greater than a total number of bond of the acetylacetone derivative that can form a coordinate bond, ligands that are widely used in a general complex, such as water molecules, halogen ions, a nitro group, and an ammonio group, may be coordinated.

Preferable examples of the metal complex include a tris(acetylacetonato)aluminum complex salt, a di(acetylacetonato)aluminum.aquo-complex salt, a mono(acetylactonato)aluminum.chloro-complex salt, a di(diacetylacetonato) aluminum complex salt, ethylacetoacetate aluminum diisopropylate, aluminum tris(ethylacetoacetate), cyclic aluminum oxide isopropylate, a tris(acetylacetonato)barium complex salt, a di(acetylacetonato)titanium complex salt, a tris(acetylacetonato)titanium complex salt, a di-i-propoxy-.bis(acetylacetonato)titanium complex salt, zirconium tris (ethylacetoacetate), a zirconium tris(benzoic acid) complex salt, and the like. These are excellently stable in an aqueous coating solution and exert an excellent effect of accelerating gelation in a sol-gel reaction at the time of heating and drying. Among these, ethyl acetoacetate aluminum diisopropylate, aluminum tris(ethylacetoacetate), a di(acetylacetonato)titanium complex salt, and zirconium tris(ethylacetoacetate) are particularly preferable.

The present specification does not describe a counter-salt of the aforementioned metal complex. However, any counter-salt can be used as long as it is a water-soluble salt in the form of a complex compound having neutral charge. For example, it is possible to use salts that are stoichiometrically neutral, such as a nitric acid salt, a halogen acid salt, a sulfuric acid salt, and phosphoric acid salt.

The behavior of the metal complex in a silica sol-gel reaction is described in detail in J. SoL-Gel. Sci. and Tec. 16. 209 (1999). The following scheme is assumed to be as the reaction mechanism. That is, presumably, the metal complex may have a coordinate structure and remain stable in the coating solution, and in a dehydration condensation reaction in which a step of heating and drying is started after coating, the metal complex may accelerate crosslinking in a mechanism similar to that of an acid catalyst. In any case, by the use of the metal complex, temporal stability of the coating solution and quality of the film surface and durability of the conductive layer become excellent.

The metal complex catalyst is easily obtained in the form of commercially available product. Alternatively, it is also obtained by a known synthesis method, for example, a reaction between a metal chloride and an alcohol.

The catalyst according to the present invention is used preferably in an amount within a range from 0% by mass to 50% by mass and more preferably in an amount within a range from 5% by mass to 25% by mass with respect to nonvolatile components in the sol-gel coating solution. One kind of the catalyst may be used singly, or two or more kinds thereof may be used in combination.

(Solvent)

If necessary, in order to form a uniform coating solution film on a substrate, a solvent may be added to the sol-gel coating solution.

Examples of the solvent include water, a ketone-based solvent (for example, acetone, methyl ethyl ketone, and diethyl ketone), an alcohol-based solvent (for example, methanol, ethanol, 2-propanol, 1-propanol, 1-butanol, and tert-butanol), a chlorine-based solvent (for example, chloroform, and dichloromethane), an aromatic solvent (for example, benzene, toluene, and the like), an ester-based solvent (for example, ethyl acetate, butyl acetate, and isopropyl acetate), an ether-based solvent (for example, diethylether, tetrahydrofuran, and dioxane), a glycol ether-based solvent (for example, ethylene glycol monomethyl ether and ethylene glycol dimethyl ether), and the like.

In the coating solution film of the sol-gel coating solution formed on the substrate, reactions including hydrolysis and condensation of the specific alkoxide compound occur. In order to accelerate the reactions, it is preferable to heat and dry the coating solution film. The heating temperature for accelerating the sol-gel reaction is preferably within a range from 30° C. to 200° C., and more preferably within a range from 50° C. to 180° C. The heating and drying time is preferably 10 seconds to 300 minutes, and more preferably 1 minute to 120 minutes.

It is preferable for the non-photosensitive matrix to be formed of the cured sol-gel substance since a conducive layer having a high degree of film strength is obtained.

[Photosensitive Matrix]

Hereinafter, a photosensitive matrix will be described.

Preferable examples of the photosensitive matrix include a photoresist composition appropriate for a lithographic process. If the conductive layer contains the photoresist composition as a matrix, it is preferable since a conductive layer having a conductive region and a non-conductive region in the form of a pattern can be formed by a lithographic process. Particularly preferable examples of the photoresist composition include a photopolymerizable composition since this makes it possible to obtain a conductive layer which is excellent in transparency, flexibility, and adhesiveness with respect to a substrate. Hereinafter, the photopolymerizable composition will be described.

(Photopolymerizable Composition)

The photopolymerizable composition contains, as basic components, (I) a addition-polymerizable unsaturated compound and (II) a photopolymerization initiator that generates radicals when being irradiated with light. If necessary, the photopolymerizable composition further contains (III) a binder and (IV) additives other than the components (I) to (III).

Hereinafter, those components will be described.

(I) Addition-Polymerizable Unsaturated Compound

The addition-polymerizable unsaturated compound (hereinafter, also referred to as "polymerizable compound") as the component (I) is a compound which undergoes an addition polymerization reaction in the presence of radicals and turns into a polymer. Generally, as such a compound, a compound having 1, preferably 2 or more, and even more preferably 4 or more ethylenically unsaturated bonds on a molecular terminal is used. The compound is in the chemical form such as a monomer or a prepolymer, that is, a dimer, a trimer, an oligomer, and a mixture of these. Various compounds are known as the polymerizable compound and can be used as the component (I).

Among the compounds, as the polymerizable compound, from the viewpoint of film strength, trimethylolpropane tri(meth)acrylate, pentaerythritol tetra(meth)acrylate, dipentaerythritol hexa(meth)acrylate, and dipentaerythritol penta (meth)acrylate are particularly preferable.

A content of the component (I) is preferably within a range from 2.6% by mass to 37.5% by mass, and more preferably within a range from 5.0% by mass to 20.0% by mass, based on a total mass of solid contents of the conductive composition.

(II) Photopolymerization Initiator

The photopolymerization initiator as the component (II) is a compound that generates radicals when being irradiated with light. Examples of the photopolymerization initiator include compounds generating acid radicals, which finally become an acid, compounds generating other radicals, and the like when being irradiated with light. Hereinafter, the former will be referred to as "photoacid generator", and the later will be referred to as "photoradical generator".

—Photoacid Generator—

As the photoacid generator, a photoinitiator for photocation polymerization, a photoinitiator for photoradical polymerization, a photodecolorant for dyes, a photoalterant, a known compound that generates acid radicals by being irradiated with actinic rays or radiation used for microresist and the like, or a mixture of these can be appropriately selected and used.

The photoacid generator is not particularly limited and can be appropriately selected according to the purpose. Examples thereof include a triazine compound having at least one dihalomethyl or trihalomethyl group, 1,3,4-oxadiazole, naphthoquinone-1,2-diazido-4-sulfonyl halide, a diazonium salt, a phosphonium salt, a sulfonium salt, an iodonium salt, imidosulfonate, oxime sulfonate, diazodisulfone, disulfone, o-nitrobenzylsulfonate, and the like. Among these, imidosulfonate, oxime sulfonate, and o-nitrobenzylsulfonate as compounds generating sulfonic acid are particularly preferable.

Moreover, it is possible to use groups generating acid radicals by being irradiated with actinic rays or radiation or compounds obtained by introducing a compound into a main chain or a side chain of a resin, for example, the compounds described in U.S. Pat. No. 3,849,137A, DE3914407B, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), and the like.

Furthermore, it is possible to use the compounds described in U.S. Pat. No. 3,779,778A, EP126712B, and the like as the acid radical generator.

—Photoradical Generator—

The photoradical generator is a compound that functions to generate radicals by means of causing a degradation reaction or a hydrogen abstraction reaction by directly absorbing light or by being photosensitized. It is preferable for the photoradical generator to have an absorption in a region of a wavelength of 200 nm to 500 nm.

There are many compounds known as the photoradical generator, and examples thereof include a carbonyl compound, a ketal compound, a benzoin compound, an acridine compound, an organic peroxy compound, an azo compound, a coumarin compound, an azide compound, a metallocene compound, a hexaarylbiimidazole compound, an organic boric acid compound, a disulfonic acid compound, an oxime ester compound, and an acylphosphine (oxide) compound described in JP2008-268884A. These can be appropriately selected according to the purpose. Among these, from the viewpoint of exposure sensitivity, a benzophenone compound, an acetophenone compound, a hexaarylbiimidazole compound, an oxime ester compound, and an acylphosphine (oxide) compound are particularly preferable.

Examples of the benzophenone compound include benzophenone, Michler's ketone, 2-methylbenzophenone, 3-methylbenzophenone, N,N-diethylaminobenzophenone, 4-methylbenzophenone, 2-chlorobenzophenone, 4-bromobenzophenone, 2-carboxybenzophenone, and the like. One kind of these may be used singly, or two or more kinds thereof may be used concurrently.

Examples of the acetophenone compound include 2,2-dimethoxy-2-phenyl acetophenone, 2,2-diethoxyacetophenone, 2-(dimethylamino)-2-[(4-methylphenyl)methyl]-1-[4-(4-morpholinyl)phenyl]-1-butanone, 1-hydroxycyclohexyl phenyl ketone, α-hydroxy-2-methylphenyl propanone, 1-hydroxy-1-methylethyl(p-isopropylphenyl)ketone, 1-hydroxy-1-(p-dodecylphenyl)ketone, 2-methyl-1-(4-methylthiophenyl)-2-morpholinopropan-1-one, 1,1,1-trichloromethyl-(p-butylphenyl)ketone, 2-benzyl-2-dimethylamino-1-(4-morpholinophenyl)-butanone-1, and the like. As specific examples of commercially available products thereof, Irgacure 369, Irgacure 379, Irgacure 907, and the like manufactured by BASF are preferable. One kind of these may be used singly, or two or more kinds thereof may be used concurrently.

Examples of the hexaarylbiimidazole compound include various compounds descried in JP1994-29285B (JP-H06-29285B), U.S. Pat. No. 3,479,185A, U.S. Pat. No. 4,311,783A, U.S. Pat. No. 4,622,286A, and the like. Specific examples of the compounds include 2,2'-bis(o-chlorophenyl)-4,4',5,5'-tetraphenylbiimidazole,
2,2'-bis(o-bromophenyl)-4,4,5,5'-tetraphenylbiimidazole,
2,2'-bis(o,p-dichlorophenyl)-4,4',5,5'-tetraphenylbiimidazole,
2,2'-bis(o-chlorophenyl)-4,4',5,5'-tetra(m-methoxyphenyl) biimidazole,
2,2'-bis(o,o'-dichlorophenyl)-4,4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole,
2,2'-bis(o-trifluorophenyl)-4,4',5,5'-tetraphenylbiimidazole,
and the like. One kind of these may be used singly, or two or more kinds thereof may be used concurrently.

Examples of the oxime ester compound include the compounds described in J.C.S. Perkin II (1979) 1653-1660, J.C.S. Perkin II (1979) 156-162, Journal of Photopolymer Science and Technology (1995) 202-232, JP2000-66385A, JP2000-80068A, JP2004-534797A, and the like. Specifically, for example, Irgacure OXE-01, OXE-02, and the like manufactured by BASF are preferable. One kind of these may be used singly, or two or more kinds thereof may be used concurrently.

Examples of the acylphosphine (oxide) compound include Irgacure 819, Darocur 4265, Darocur TPO, and the like manufactured by BASF.

From the viewpoint of exposure sensitivity and transparency, as the photoradical generator, 2-(dimethylamino)-2-[(4-methylphenyl)methyl]-1-[4-(4-morpholinyl)phenyl]-1-butanone, 2-benzyl-2-dimethylamino-1-(4-morpholinophenyl)-butanone-1,2-methyl-1-(4-methylthiophenyl)-2-morpholinopropan-1-one, 2,2'-bis(2-chlorophenyl)-4,4',5,5'-tetraphenylbiimidazole, N,N-diethylaminobenzophenone, and Irgacure OXE-01 are particularly preferable.

One kind of the photopolymerization initiator as the component (II) may be used singly, or two or more kinds thereof may be used concurrently. A content thereof is preferably 0.1% by mass to 50% by mass, more preferably 0.5% by mass to 30% by mass, and even more preferably 1% by mass to 20% by mass, based on a total mass of solid contents of the conductive composition. If the content is within the above range of numerical values, when a pattern having a conductive region and a non-conductive region, which will be described later, is formed into a conductive layer, excellent sensitivity and pattern formability are obtained.

(III) Binder

A binder can be appropriately selected from alkali-soluble resins which are linear organic high molecular-weight polymers and have at least one group (for example, a carboxyl group, a phosphoric acid group, or a sulfonic acid group) enhancing alkali solubility in a molecule (preferably, a molecule having an acrylic copolymer or a styrene-based copolymer as a main chain).

Among these, binders which are soluble in an organic solvent and in an aqueous alkaline solution are preferable, and binders which have a dissociable group and become alkali-soluble when the dissociable group is dissociated by the action of a base are particularly preferable. Herein, the dissociable group refers to a functional group that can be dissociated in the presence of a base.

For producing the binder, for example, a method performed by a known radical polymerization method can be used. When the alkali-soluble resin is produced by the radical polymerization method, various conditions including the temperature, pressure, type and amount of radical initiator, type of solvent, and the like can be easily set by those skilled in the art. The conditions can be set experimentally.

As the linear organic high-molecular weight polymer, polymers having carboxylic acid on a side chain are preferable.

The polymers having carboxylic acid on a side chain include a methacrylic acid copolymer, an acrylic acid copolymer, an itaconic acid copolymer, a crotonic acid copolymer, a maleic acid copolymer, a partially esterified maleic acid copolymer, and the like described in JP1984-44615A (JP-S59-44615A), JP1979-34327B (JP-S54-34327B), JP1983-12577B (JP-S58-12577B), JP1979-25957B (JP-S54-25957B), JP1984-53836A (JP-S59-53836A), and JP1984-71048A (JP-S59-71048A). The polymers also include acidic cellulose derivatives having carboxylic acid on a side chain, polymers obtained by adding an acid anhydride to a hydroxyl group-containing polymer, and the like. Moreover, high-molecular weight polymers having a (meth)acryloyl group on a side chain are also preferable examples of the polymers.

Among these, a benzyl (meth)acrylate/(meth)acrylic acid copolymer and a multi-component copolymer consisting of benzyl (meth)acrylate/(meth)acrylic acid/other monomers are particularly preferable.

Moreover, a high-molecular weight polymer having a (meth)acryloyl group on a side chain and a multi-component copolymer consisting of (meth)acrylic acid/glycidyl (meth)acrylate/other monomers are also useful examples of the polymers. The polymers can be used by being mixed with each other in any amount.

In addition to the above, examples of the polymers include a 2-hydroxypropyl (meth)acrylate/a polystyrene macromonomer/benzyl methacrylate/methacrylic acid copolymer, a 2-hydroxy-3-phenoxypropyl acrylate/a polymethyl methacrylate macromonomer/benzyl methacrylate/methacrylic acid copolymer, a 2-hydroxyethyl methacrylate/a polystyrene macromonomer/methyl methacrylate/methacrylic acid copolymer, a 2-hydroxyethyl methacrylate/a polystyrene macromonomer/methyl methacrylate/methacrylic acid copolymer, and the like described in JP1995-140654A (JP-H07-140654A).

As a specific constitutional unit of the alkali-soluble resin, (meth)acrylic acid and other monomers that can be copolymerized with the (meth)acrylic acid are preferable.

Examples of other monomers that can be copolymerized with the (meth)acrylic acid include alkyl (meth)acrylate, aryl (meth)acrylate, a vinyl compound, and the like. Hydrogen atoms of an alkyl group and an aryl group of these monomers may be substituted with a substituent.

Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, dicyclopentanyl (meth)acrylate, dicyclopentenyl (meth)acrylate, dicyclopentenyloxy ethyl (meth)acrylate, and the like. One kind of these may be used singly, or two or more kinds thereof may be used concurrently.

Examples of the vinyl compound include styrene, α-styrene, vinyl toluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, $CH_2=CR^1R^2$, $CH_2=C(R^1)(COOR^3)$ [here, $R^1$ represents a hydrogen atom or an alkyl group having 1 to 5 carbon atoms, $R^2$ represents a aromatic hydrocarbon group having 6 to 10 carbon atoms, and $R^3$ represents an alkyl group having 1 to 8 carbon atoms or an aralkyl group having 6 to 12 carbon atoms], and the like. One kind of these may be used singly, or two or more kinds thereof may be used concurrently.

In view of an alkaline dissolution rate, physical properties of the film, and the like, a weight average molecular weight of the binder is preferably 1,000 to 500,000, more preferably 3,000 to 300,000, and even more preferably 5,000 to 200,000.

Herein, the weight average molecular weight can be measured by gel permeation chromatography and obtained using a standard polystyrene calibration curve.

A content of the binder as the component (III) is preferably 5% by mass to 90% by mass, more preferably 10% by mass to 85% by mass, and even more preferably 20% by mass to 80% by mass, based on a total mass of solid contents of the conductive composition. If the content is within the above preferable range, both the developability and conductivity of the conductive metal fibers can be obtained at the same time.

Moreover, regarding the matrix, the aforementioned polymer compound as a dispersant used for producing the conductive metal fiber can be used as a portion of the components constituting the matrix.

(IV) Additives Other than The Components (I) to (III)

Additives other than the components (I) to (III) may be added to the photopolymerizable composition. Examples of the additives include various additives such as a sensitizer, a chain transfer agent, a crosslinking agent, a dispersant, a solvent, a surfactant, an antioxidant, an anti-sulfidizing agent, a metal corrosion inhibitor, a viscosity regulator, and a preservative.

(IV-1) Chain Transfer Agent

A chain transfer agent is used for improving exposure sensitivity of the photopolymerizable composition. Examples of the chain transfer agent include N,N-dialkylamino benzoic acid alkyl ester such as N,N-dimethylamino benzoic acid ethyl ester; mercapto compounds having a heterocycle, such as 2-mercaptobenzothiazole, 2-mercaptobenzoxazole, 2-mercaptobenzimidazole, N-phenylmercaptobenzimidazole, and 1,3,5-tris(3-mercaptobutyloxyethyl)-1,3,5-triazine-2,4,6(1H,3H,5H)-trione; aliphatic polyfunctional mercapto compounds such as pentaerythritol tetrakis(3-mercaptopropionate), pentaerythritol tetrakis(3-mercaptobutyrate), and 1,4-bis(3-mercaptobutyryloxy)butane; and the like. One kind of these may be used singly, or two or more kinds thereof may be used concurrently.

A content of the chain transfer agent is preferably 0.01% by mass to 15% by mass, more preferably 0.1% by mass to 10% by mass, and even more preferably 0.5% by mass to 5% by mass, based on a total mass of solid contents of the photopolymerizable composition containing the conductive metal fibers.

(IV-2) Crosslinking Agent

A crosslinking agent is a compound which forms a chemical bond by a free radical, an acid, or heat and cures the conductive layer. Examples thereof include a melamine-based compound substituted with at least one group selected from a methylol group, an alkoxymethyl group, and an acyloxymethyl group, a guanamine-based compound, a glycoluril-based compound, a urea-based compound, a phenol-based compound, an ether compound of phenol, an epoxy-based compound, an oxetane-based compound, a thioepoxy-based compound, an isocyanate-based compound, an azide-based compound, an ethylenically unsaturated group-containing compound having a methacryloyl group, an acryloyl group, and the like. Among these, in view of physical properties of the film, heat resistance, and solvent resistance, an epoxy-based compound, an oxetane-based compound, and an ethylenically unsaturated group-containing compound are particularly preferable.

One kind of oxetane resin can be used singly, or alternatively, the oxetane resin can be used by being mixed with an epoxy resin. It is particularly preferable to concurrently use the oxetane resin with an epoxy resin, since the reactivity and physical properties of the film are improved.

Moreover, when an ethylenically unsaturated double bond-containing compound is used as a crosslinking agent, the crosslinking agent is also included in the (I) polymerizable compound. It should be considered that the content of the crosslinking agent is included in the content of the (I) polymerizable compound of the present invention.

A content of the crosslinking agent is preferably 1 part by mass to 250 parts by mass, and more preferably 3 parts by mass to 200 parts by mass, based on a total mass of solid contents of the photopolymerizable composition containing the conductive metal fibers.

(IV-3) Dispersant

A dispersant is used for dispersing the conductive metal fibers in the photopolymerizable composition while preventing aggregation of the conductive metal fibers. The dispersant is not particularly limited as long as it can disperse the conductive metal fibers, and can be appropriately selected according to the purpose. For example, dispersants commercially available as a pigment dispersant can be used, and particularly, polymer dispersants adsorbed onto the conductive metal fibers are preferable. Examples of such polymer dispersants include polyvinylpyrrolidone, a BYK series (manufactured by BYK-Chemie), a Solsperse series (manufactured by Lubrizol Japan Limited), an Ajisper series (manufactured by AJINOMOTO CO., INC.), and the like.

Moreover, when the polymer dispersant as a dispersant is further added in addition to the dispersant used for producing the conductive metal fibers, it should be considered that the polymer dispersant is included in the binder as the component (III), and the content thereof is included in the content of the component (III).

A content of the dispersant is preferably 0.1 parts by mass to 50 parts by mass, more preferably 0.5 parts by mass to 40 parts by mass, and particularly preferably 1 part by mass to 30 parts by mass, with respect to 100 parts by mass of the binder as the component (II). If the content of the dispersant is controlled to be equal to or greater than 0.1 parts by mass, aggregation of the conductive metal fibers in the dispersion is effectively inhibited. If the content is controlled to be equal to or smaller than 50 parts by mass, it is preferable since a stabilized solution film is formed in the coating step, and occurrence of coating unevenness is inhibited.

(IV-4) Solvent

A solvent is a component for obtaining the coating solution which is for forming the photopolymerizable component containing the conductive metal fibers into a film on the substrate surface. The solvent can be appropriately selected according to the purpose, and examples thereof include propylene glycol monomethyl ether (PGME), propylene glycol monomethyl ether acetate (PGMEA), methanol, ethanol, 1-propanol, 2-propanol, butanol, 1-methoxy-2-propanol, 3-methoxybutanol, acetone, methyl ethyl ketone, methyl isobutyl ketone, cyclohexanone, methyl acetate, ethyl acetate, propyl acetate, isopropyl acetate, butyl acetate, ethyl 3-ethoxypropionate, methyl 3-methoxypropionate, ethyl lactate, γ-butyrolactone, propylene carbonate, N-methyl-pyrrolidinone, N-ethyl-2-pyrrolidinone, and the like. One kind of these may be used singly, or two or more kinds thereof may be used concurrently.

A concentration of solid contents of the coating solution containing the solvent is preferably within a range of 0.1% by mass to 20% by mass.

(d) Other Additives

The conductive composition of the present invention may further contain a compound which can be adsorbed onto a metal or a compound which can be coordinated with a metal ion, in addition to the components (a) to (c). The compound which can be adsorbed onto a metal or the compound which can be coordinated with a metal ion is not particularly limited and can be appropriately selected according to the purpose. For example, an azole compound (benzotriazole, 4-methylbenzotriazole, 5-methylbenzotriazole, 4-ethylbenzotrizaole, 5,6-dimethylbenzotriazole, tolyltriazole, benzyltriazole, 5,6-dimethylbenzimidazole, thiadiazole, tetrazole, and the like), a triazine compound, an ammonium compound, a phosphonium compound, a mercapto compound (2-mercaptobenzoxazole, 2-mercaptobenzothiazole, 2-mercaptotetrazole, 2-mercaptopyrimidine, 2-mercaptobenzimidazole, dithiothiadiazole, alkyldithiothiadiazole, alkylthiol, and the like), a sulfide compound, and a disulfide compound are preferable.

The compound which can be adsorbed onto a metal or the compound which can be coordinated with a metal ion is adsorbed onto the surface of metal or forms a complex, and in this manner, a coat is formed. As a result, the compound exerts a corrosion preventing effect or a rust preventing effect, and accordingly, the effects of the present invention can be further improved.

It is possible to select any method as a method for adding the compound which can be adsorbed onto a metal or the compound which can be coordinated with a metal ion can be added to the conductive composition. For example, the compound may be added to the conductive composition singly, or may be added to the conductive composition in the form of a solution obtained by dissolving or dispersing the compound in an appropriate solvent. Alternatively, the prepared conductive layer may be dipped into a solution of the compound which can be adsorbed onto a metal or into a solution of the compound which can be coordinated with a metal ion.

The amount of the added compound which can be adsorbed onto a metal or the compound which can be coordinated with a metal ion is preferably from 0.1% to 100%, more preferably from 1% to 50%, and particularly preferably from 2% to 25%, per mass of the conductive metal fiber. If the amount is controlled to be from 0.1% to 100%, occurrence of corrosion or rusting of the conductive metal fiber is effectively prevented, and at the same time, a high degree of conductive is maintained.

It is preferable for the conductive composition of the present invention to contain a solvent, such that the composition can be formed into a conductive layer by being coated onto an intended substrate. In producing the conductive metal fiber, when an aqueous dispersion obtained by dispersing the conductive metal fibers in an aqueous medium is produced by using water as a solvent, the (b) component compound may be added to the aqueous dispersion. It is preferable for the (b) component compound to be added within a range from 0.005 mmol to 50 mmol per 1 g of the conductive metal fibers.

Meanwhile, when a solvent other than the solvent (for example, water) used for producing the conductive metal fiber, for example, an organic solvent such as propylene glycol monomethyl ether or propylene glycol monomethyl ether acetate is required as a solvent of the coating solution of the conductive composition, solvent substitution, which is for partially or completely substituting the solvent (for example, water) used for producing the conductive metal fiber with an intended solvent (for example, propylene glycol monomethyl ether acetate), may be performed, and then the (b) component compound may be added thereto. It is preferable for the (b) component compound to be added within a range from 0.005 mmol to 50 mmol per 1 g of the conductive metal fibers.

The coating solution of the conductive composition of the present invention can be prepared in this manner. Examples of the solvent of the coating solution include, in addition to the aforementioned solvent, an alcohol-based solvent such as methanol, ethanol, 1-propanol, 2-propanol, butanol, 1-methoxy-2-propanol, or 3-methoxybutanol, a ketone-based solvent such as acetone, methyl ethyl ketone, methyl isobutyl ketone, or cyclohexanone, an ester-based solvent such as methyl acetate, ethyl acetate, propyl acetate, isopropyl acetate, butyl acetate, methyl 3-ethoxypropionate, methyl 3-methoxypropionate, ethyl lactate, γ-butyrolactone, or propylene carbonate, an amide-based solvent such as N-methyl-2-pyrrolidinone or N-ethyl-2-pyrrolidinone, a benzene-based solvent such as toluene or xylene, a mixed solvent of these, and the like.

A concentration of the conductive metal fibers in the coating solution is appropriately determined within a range from 0.001% by mass to 50% by mass, according to an intended thickness of the conductive layer.

The conductive composition of the present invention and the conductive member which will be described later can be widely used in, for example, a touch panel, an electrode for display, an electromagnetic wave shield, an electrode for organic EL display, an electrode for inorganic EL display, electronic paper, an electrode for flexible display, an integrated solar cell, a liquid crystal display device, a display device equipped with touch panel function, and other various devices.

<Conductive Member>

The conductive member of the present invention has a conductive layer, which contains at least (a) conductive metal fibers having an average minor-axis length from 1 nm to 150 nm and the (b) component compound, on a substrate.

The conductive layer may be directly disposed on a substrate, or may be disposed on another layer consisting of one or plural layers such as an under coat layer, an intermediate layer, and a cushion layer that are disposed on a substrate. Moreover, on the conductive layer, other layers such as a surface-protecting layer (a soluble protective layer or the like), a hard coating layer, an oxygen barrier layer, and an antistatic layer may be further disposed. Particularly, when the conductive layer is formed of the conductive composition not containing the matrix, it is preferable to adopt an embodiment in which an adhesive layer is disposed in advance on a substrate, and a conductive layer constituted with the aforementioned conductive composition is disposed on the adhesive layer.

(Substrate)

The substrate is not particularly limited in terms of the shape, structure, size, and the like, as long as it can support the conductive layer. The substrate can be appropriately selected according to the purpose and can have the shape of, for example, a plate, a film, and a sheet. The substrate can have a single layer structure, a laminate structure, and the like. The substrate may be transparent or opaque.

The material of the substrate is not particularly limited and can be appropriately selected according to the purpose. Examples of the material include a transparent glass substrate, a sheet (film) made of a synthetic resin, a metal substrate, a ceramic plate, a silicon wafer used as a semiconductor substrate, and the like.

Examples of the transparent glass substrate include white glass, blue glass, silica-coated blue glass, and the like. Moreover, a thin-film glass substrate having a thickness of 10 μm to hundreds of μm that has been developed recently may also be used.

Examples of the sheet made of a synthetic resin include a polyethylene terephthalate (PET) sheet, a polycarbonate sheet, a triacetyl cellulose (TAC) sheet, a polyethersulfone sheet, a polyester sheet, an acrylic resin sheet, a vinyl chloride resin sheet, an aromatic polyamide resin sheet, a polyamide imide sheet, a polyimide sheet, and the like.

Examples of the metal substrate include an aluminum plate, a copper plate, a nickel plate, a stainless steel plate, and the like.

If necessary, the substrate can be treated with a chemical such as a silane coupling agent or can be subjected to pretreatment such as plasma treatment, ion plating, sputtering, a gas-phase reaction process, or vacuum vapor deposition.

When the conductive layer of the present invention is formed onto the substrate used in the present invention, in order to enhance adhesiveness of functional layers and to improve wettability of the coating solution, it is preferable to perform pretreatment such as hydrophilizing treatment or embossing treatment on one surface or both surfaces of the substrate. Examples of the pretreatment include corona discharge treatment, glow discharge treatment, plasma treatment, atmospheric plasma treatment, flame treatment, hot air treatment, ozone•UV irradiation treatment, chromic acid treatment (wet type), saponification treatment (wet type), and the like. Among these, the corona discharge treatment and the plasma treatment (vacuum glow discharge and atmospheric glow discharge treatment) are particularly preferable.

[Plasma Treatment]

The plasma treatment used in the present invention is performed by vacuum glow discharge, atmospheric glow discharge, and the like. Examples of other methods include methods such as flame plasma treatment. These can be performed using the methods described in, for example, JP1994-123062A (JP-H06-123062A), JP1999-293011A (JP-H11-293011A), and JP1999-5857A (JP-H11-5857A).

In the plasma treatment, gas is plasma-excited by the application of high-frequency voltage. As a result, glow discharge occurs between electrodes, the plasma-excited gas is emitted onto the substrate surface, and consequentially, the substrate surface is modified.

The gas excited with plasma is not particularly limited. As such a gas, argon, helium, neon, krypton, xenon, nitrogen, carbon dioxide, and freon such as tetrafluoromethane and a mixture of these are preferable. Moreover, the gas obtained by adding reactive gas, which can provide a polar functional group such as a carboxyl group, a hydroxyl group, or a carbonyl group to the surface of a plastic film, to inert gas such as argon or neon is preferable. As the reactive gas, in addition to hydrogen, oxygen, nitrogen, and gas such as water vapor or ammonia, an organic compound having a low boiling point, such as low hydrocarbon or ketone, can be used if necessary. However, in view of handleability, the gas such hydrogen, oxygen, carbon dioxide, nitrogen, or water vapor is preferable. When water vapor is used, it is possible to use other gas bubbled in water. Alternatively, other gas may be mixed with water vapor.

A frequency of the high-frequency voltage to be applied is preferably used in a range from 1 kHz to 100 kHz, and more preferably used in a range from 1 kHz to 40 kHz.

The plasma treatment by glow discharge may be performed in a vacuum or in the atmosphere.

In the plasma discharge treatment by glow discharge, in order to effectively cause discharge, the aforementioned reactive gas needs to be introduced in a state in which the atmospheric pressure is being kept within a range from 0.005 torr to 20 torr (0.67 Pa to 2,666 Pa). In order to increase the treatment rate, it is preferable to adopt high-output conditions by setting the pressure as high as possible. However, if the intensity of an electric field is excessively increased, the substrate is damaged in some cases.

When the atmospheric glow discharge, in which plasma discharge is caused at a pressure close to the atmospheric pressure, is performed, in order to stably cause discharge, it is preferable to use the reactive gas concurrently with inert gas such as helium or argon. However, when plasma is generated in a pulsed electric field, the inert gas is not required, and the reaction rate can be increased by increasing the concentration of the reactive gas.

[Corona Discharge Treatment]

The corona discharge treatment can be performed according to any of known methods described in, for example, JP1973-5043B (JP-S48-5043B), JP1972-51905B (JP-S47-51905B), JP1972-28067A (JP-S47-28067A), JP1974-83767A (JP-S49-83767A), JP1976-41770A (JP-S51-41770A), and JP1976-131576A (JP-S51-131576A). As the treatment machine, various commercially available corona treatment machines can be used. For example, a corona treatment machine manufactured by SOFTAL Korona & Plasma having multi-knife electrodes is useful since this machine is constituted with plural electrodes and makes it possible to prevent heating of a film by blowing air between electrodes and to remove low-molecular weight substances that come up to the surface of a film. Moreover, in the substrate having a conductive layer on one surface thereof, for the surface on which the conductive layer has not been formed, in order to avoid sparks caused between an electrode and the conductive layer, it is desirable to perform the corona treatment by using a dielectric-coated electrode (an ceramic electrode, a quartz electrode, or the like) as a discharge electrode and using a metal roll such as stainless steel as a counter electrode.

The conditions of corona treatment vary with the type of substrate to be used, the type of matrix of coating film, the type of corona treatment machine to be used, and the like. However, the corona treatment is preferably performed using an irradiation energy within a range from 0.1 J/m$^2$ to 10 J/m$^2$, and more preferably performed using an irradiation energy within a range from 0.5 J/m$^2$ to 5 J/m$^2$.

When the substrate surface is subjected to hydrophilizing treatment by the surface treatment performed in the aforementioned manner, a contact angle formed between the substrate surface and water is preferably within a range from 0° to 40°, more preferably within a range from 0° to 20°, and even more preferably within a range from 0° to 10°.

An average thickness of the substrate is not particularly limited and can be appropriately set according to the purpose. Generally, it is preferable to set the average thickness within a range from 1 μm to 500 μm. The average thickness is more preferably 3 μm to 400 μm, and particularly preferably 5 μm to 300 μm. If the average thickness of the substrate is set to be equal to or greater than 1 μm, it is easy to handle the conductive member. If the average thickness is set to be equal to or smaller than 500 μm, the substrate has appropriate flexibility and is handled easily, and consequentially, even when the substrate is used as a transfer-type conductive member, uniform transferability is easily obtained.

When the conductive member is required to have transparency, a total visible light transmittance of the substrate is preferably equal to or higher than 70%, more preferably equal to or higher than 85%, and particularly preferably equal to or higher than 90%.

Moreover, in the present invention, as the substrate, a substrate that is colored to an extent that does not hinder the accomplishment of the object of the present invention can also be used.

(Conductive Layer)

The conductive layer according to the present invention contains at least (a) conductive metal fibers having an average minor-axis length from 1 nm to 150 nm and the (b) component compound.

An average thickness of the conductive layer of the present invention is preferably 0.01 μm to 2 μm, more preferably 0.02 μm to 1 μm, even more preferably 0.03 μm to 0.8 μm, and particularly preferably 0.05 μm to 0.5 μm. If the average thickness of the conductive layer is equal to or greater than 0.01 μm, it is easy to obtain a conductive layer having sufficient durability and film strength, and in-plane distribution of conductivity becomes uniform. Moreover, if the average thickness is set to be equal to or smaller than 2 μm, it is easy to obtain a conductive layer having a high degree of transmittance and transparency.

A method of forming the conductive layer on a substrate is not particularly limited, and a general coating method using the aforementioned coating solution of the conductive composition can be used. The method can be appropriately selected according to the purpose, and examples of the method include a roll coating method, a bar coating method, a dip coating method, a spin coating method, a cast coating method, a die coating method, a blade coating method, a gravure coating method, a curtain coating method, a spray coating method, a doctor coating method, and the like.

Furthermore, as described above, each of the (a) conductive metal fibers and the (b) component compound may be added to different players, and in this case, the conductive composition of the present invention containing the (a) conductive metal fibers and the (b) component compound may not be used.

For the conductive layer according to the present invention, in addition to the conductive metal fibers, other conductive materials, for example, fine conductive particles can be concurrently used, as long as they do not diminish the effects of the present invention. From the viewpoint of the effects, a proportion of the conductive metal fibers in the conductive layer is preferably equal to or higher than 50%, more preferably equal to or higher than 60%, and particularly preferably equal to or higher than 75% in terms of a volume ratio. Hereinafter, the proportion of the conductive metal fibers will be referred to as "proportion of conductive metal fibers" in some cases.

If the proportion of the conductive metal fibers is set to be equal to or higher than 50%, sufficient conductivity is easily obtained, and a conductive layer having excellent durability is easily obtained. Moreover, particles having a shape different from that of the conductive metal fiber are not preferable since they do not make a great contribution to conductivity and absorb light. Particularly, when the particles having a shape different from that of the conductive metal fiber are formed of a metal and are spherical particles that exhibit strong plasmon absorption, transparency deteriorates in some cases.

The proportion of the conductive metal fibers can be determined in the following manner. For example, when the conductive metal fiber is a silver nanowire, an aqueous dispersion containing the silver nanowires is filtered such that the silver nanowires are separated from other particles, and by using an ICP optical emission spectrometer, an amount of silver remaining on the filter paper and an amount of conductive material filtered through the filter paper are measured respectively to determine the proportion of the conductive metal fibers. The conductive metal fibers remaining on the filter paper are observed with a TEM, an average minor-axis length of 300 strands of conductive metal fibers is observed, and distribution thereof is investigated to detect the proportion.

The method of measuring the average minor-axis length and average major-axis length of the conductive metal fibers is as described above.

(Soluble Protective Layer)

It is also preferable for the conductive member of the present invention to have a soluble protective layer, which contains at least a water-soluble polymer, on the conductivel layer. The soluble protective layer contains a water-soluble polymer and further contains other components if necessary. The soluble protective layer of the present invention may contains the (b) component compound according to the present invention.

—Water-Soluble Polymer—

The water-soluble polymer is not particularly limited and can be appropriately selected according to the purpose. Examples thereof include gelatin, gelatin derivatives, casein, agar, starch, polyvinyl alcohol, a polyacrylic acid copolymer, carboxyalkyl cellulose, cellulose derivatives such as water-soluble cellulose ether, polyvinyl pyrrolidone, dextran, polyalkylene glycol, and the like. One kind of these may be used singly, or two or more kinds thereof may be used concurrently. Among these, polyvinyl pyrrolidone, polyvinyl alcohol, and water-soluble cellulose derivatives are particularly preferable.

The polyvinyl pyrrolidone may be a copolymer having a polymerization unit other than a vinyl pyrrolidone unit, and examples of such a copolymer include a vinyl pyrrolidone/vinyl acetate copolymer and the like. The polyvinyl alcohol may be a copolymer having a polymerization unit other than a vinyl alcohol unit, and examples of such a copolymer include a vinyl alcohol/vinyl pyrrolidone copolymer and the like.

Examples of the water-soluble cellulose derivatives include carboxymethyl cellulose, hydroxyethyl cellulose, hydroxypropyl methyl cellulose, and the like.

Examples of the polyalkylene glycol include polyethylene glycol, an ethylene glycol/propylene glycol copolymer, and the like. Among these, polyalkylene glycol having a weight average molecular weight of 5,000 to 100,000 is preferable.

The aforementioned other components are not particularly limited and appropriately selected according to the purpose. Examples thereof include various additives such as a filler, a surfactant, an antioxidant, an anti-sulfidizing agent, a metal corrosion inhibitor, a viscosity regulator, and a preservative.

An average thickness of the soluble protective layer is preferably 0.1 μm to 5 μm, more preferably 0.2 μm to 2 μm, and even more preferably 0.5 μm to 1 μm. If the average thickness is equal to or greater than 0.1 μm, scratch resistance is easily improved. If the average thickness is equal to or smaller than 5 μm, the time taken for removing the soluble protective layer is easily shortened, and it is easy to inhibit the soluble protective layer from remaining on the conductive layer. Moreover, if the average thickness is equal to or smaller than 5 μm, the binder of the protective layer is prevented from being mixed into the conductive fiber-containing layer and deteriorating density of the conductive fibers, and deterioration of conductivity tends to be inhibited.

Herein, the average thickness of the soluble protective layer can be measured by observing the cross-section of the protective layer by using, for example, a scanning electron microscope (SEM).

The soluble protective layer can be formed by coating the surface of the conductive layer with a composition for a soluble protective layer that contains at least a water-soluble polymer. The composition for a soluble protective layer contains at least a water-soluble polymer, a solvent, and other components if necessary.

The solvent is not particularly limited and can be appropriately selected according to the purpose. Examples thereof include methanol, ethanol, 1-propanol, 2-propanol, acetone, 2-butanone, ethyl acetate, propyl acetate, tetrahydrofuran, acetonitrile, dioxane, toluene, xylene, cyclohexanone, ethylene glycol monoethyl ether, propylene glycol monomethyl ether, propylene glycol monomethyl ether acetate, diethylene glycol dimethyl ether, diethylene glycol methyl ether, methyl 3-methoxypropionate, ethyl 3-ethoxypropionate, N,N-dimethylformamide, acetic acid, water, and the like. One kind of these may be used singly, or two or more kinds thereof may be used concurrently. Among these, solvents that do not dissolve the conductive layer are preferable, and water is particularly preferable.

A method of "coating" is not particularly limited and can be appropriately selected according to the purpose. Examples of the method include all of general liquid-phase film forming methods such as a coating method, a printing method, and an ink jet method.

The coating method is not particularly limited and can be appropriately selected according to the purpose. Examples thereof include a roll coating method, a bar coating method, a dip coating method, a spin coating method, a cast coating method, a die coating method, a blade coating method, a gravure coating method, a curtain coating method, a spray coating method, a doctor coating method, and the like.

Examples of the printing method include a letterpress printing method, a screen printing method, an offset printing method, a gravure printing method, and the like.

The soluble protective layer may be removed by the application of a solvent.

The removal of the soluble protective layer may be performed when the pattern of the conductive layer is formed or may be performed along with the formation of pattern by a user.

The solvent used for removing the soluble protective layer is preferably either water or an alkaline solution.

The water is not particularly limited and can be appropriately selected according to the purpose. Examples thereof include pure water such as deionized water, ultrafiltered water, reverse osmosis water, and distilled water, ultrapure water, and the like.

The alkali containing in the alkaline solution is not particularly limited and can be appropriately selected according to the purpose. Examples thereof include tetramethyl ammonium hydroxide, tetraethyl ammonium hydroxide, 2-hydroxyethyltrimethyl ammonium hydroxide, sodium carbonate, sodium hydrogen carbonate, potassium carbonate, potassium hydrogen carbonate, sodium hydroxide, potassium hydroxide, and the like.

A method of applying the water and alkaline solution is not particularly limited and can be appropriately selected according to the purpose. Examples thereof include coating, dipping, spraying, and the like. Among these, dipping is particularly preferable.

A dipping time of the water and alkaline solution is not particularly limited and can be appropriately set according to the purpose. For example, it is preferably 10 seconds to 5 minutes.

It is preferable to adjust a surface resistivity of the conductive member of the present invention within a range from 1 Ω/square to 1,000 Ω/square. The surface resistivity of the conductive member is preferably within a range from 1 Ω/square to 500 Ω/square, particularly preferably within a range from 1 Ω/square to 250 Ω/square, and most preferably within a range from 1 Ω/square to 200 Ω/square.

The surface resistivity is a value obtained by measuring the surface of the conductive layer opposite to the substrate side in the conductive member according to the present invention by means of a four-point probe method. The method of measuring surface resistivity by means of the four-point probe method can be performed based on, for example, JIS K 7194:1994 (Testing method for resistivity of conductive plastics with a four-point probe array). The surface resistivity can be simply measured using a commercially available surface resistivity meter. In order to control the surface resistivity, at least one of the type and content ratio of the conductive metal fibers contained in the conductive layer may be adjusted. More specifically, for example, if the content ratio between the matrix and the conductive metal fibers is adjusted, it is possible to form a conductive layer having a surface resistivity within an intended range.

A total light transmittance of the conductive member according to the present invention is preferably equal to or higher than 70%, more preferably equal to or higher than 85%, and particularly preferably equal to or higher than 90%.

A haze of the conductive member according to the present invention is preferably equal to or lower than 10%, more preferably equal to or lower than 5%, and particularly preferably equal to or lower than 2%.

Preferable Embodiments of the Present Invention

Examples of preferable embodiments of the conductive member of the present invention include the following three embodiments.

A first preferable embodiment of the present invention is a conductive member obtained by disposing a conductive layer containing conductive metal fibers on a substrate, in which when the conductive member is observed in a direction vertical to the substrate surface, the entire region of the conductive layer is a conductive region (hereinafter, such a conductive layer will also be referred to as "non-patterned conductive layer").

The conductive member according to the first embodiment can be preferably used as a transparent electrode of a solar cell, an electromagnetic wave shielding material, an antistatic material, and the like.

A second preferable embodiment of the present invention is a conductive member obtained by disposing a conductive layer containing conductive metal fibers on a substrate, in which the conductive layer has a conductive region and a non-conductive region (hereinafter, such a conductive layer will also be referred to as "patterned conductive layer"). The non-conductive layer may or may not contain the conductive metal fibers. When the non-conductive layer contains the conductive metal fibers, the conductive metal fibers contained in the non-conductive layer are cut, or contact resistance between the conductive metal fibers is extremely high, and as a result, the non-conductive layer practically does not exhibit conductivity.

The conductive member according to the second preferable embodiment is used for preparing, for example, a touch panel or a wiring material. In this case, a conductive region and a non-conductive region having an intended shape are formed, and the shape of electrode formed of the conventional ITO transparent conductive film is exemplified. Specifically, examples thereof include those called a stripe pattern or diamond pattern described in WO2005/114369A, WO2004/061808A, JP2010-33478A, and JP2010-44453A.

A third preferable embodiment of the present invention is a conductive member obtained by disposing at least a cushion layer and a conductive layer containing the conductive metal fibers in this order onto a first substrate. This conductive member is used by transferring the conductive layer onto a second substrate. In the present embodiment, the substrate is peeled after then conductive member is transferred to a transfer member, and the cushion layer and the conductive layer are transferred to the transfer member.

In the third embodiment, the entire region of the conductive layer may be conductive (non-patterned conductive layer) or may be a patterned conductive layer having a conductive region and a non-conductive region. When the conductive layer is a non-patterned conductive layer, the preferable use thereof is the same as in the aforementioned first preferable embodiment of the present invention. When the conductive layer is a patterned conductive layer, preferable use and shape thereof are the same as in the aforementioned second preferable embodiment of the present invention.

The first preferable embodiment and the second preferable embodiment of the present invention will be described in detail.

The first preferable embodiment and the second preferable embodiment of the present invention are a conductive member obtained by disposing a conductive layer containing the conductive metal fibers on a substrate. The combination of the substrate and the conductive layer can be selected in any way according to the purpose. In the present invention, it is preferable to use the aforementioned cured sol-gel substance as the matrix of the conductive layer.

The patterned conductive layer according to the second preferable embodiment of the present invention can be produced by, for example, the following patterning method.

(1) The patterned conductive layer can be produced by a patterning method in which a non-patterned conductive layer is formed in advance, and high-energy laser beams of carbon dioxide laser, YAG laser, or the like are emitted to the conductive metal fibers contained in an intended region of the non-patterned conductive layer so as to form the intended region into a non-conductive region by cutting or deleting a portion of the conductive metal fibers. This method is described in, for example, JP2010-4496A.

(2) The patterned conductive layer can be produced by a patterning method in which a negative or positive photoresist layer is disposed on a non-patterned conductive layer formed in advance; the photoresist layer is exposed to light patternwise as intended or developed so as to form a cured resist layer having the pattern shape; and then by using a wet process, in which the resist layer is treated with an etching solution that can etch the conductive metal fibers, or using a dry process such as reactive ion etching, the conductive metal fibers in the conductive layer in an unprotected region of the cured resist layer are removed by etching. This method is described in, for example, JP2010-507199A (particularly, paragraphs 0212 to 0217).

(3) The patterned conductive layer can be produced by a patterning method in which a photosensitive non-patterned conductive layer is formed in advance, and the conductive layer is exposed to light patternwise by means of, for example, surface exposure using a photomask or scanning exposure using laser beams, and then developed. The patterning method includes an exposure step and a development step and further includes other steps if necessary. This method is described in, for example, JP2009-251186A.

(4) The patterned conductive layer can be produced by a patterning method in which a photoresist layer is disposed in the form of pattern onto a non-patterned conductive layer formed in advance; the photoresist layer is exposed to intended light or developed if necessary so as to form a cured resist layer in the form of pattern; and then by using a wet process in which the resist layer is treated with an etching solution that can etch the conductive metal fibers or using a dry process such as reactive ion etching, the conductive metal fibers contained in the conductive layer in an unprotected region in the cured resist layer are removed by etching.

(5) The patterned conductive layer can be produced by a patterning method in which a photoetching layer containing a compound, which can react with the conductive metal fibers and remove conductivity of the fibers, is formed on a non-patterned conductive layer formed in advance, by exposing the conductive layer to light patternwise; and the photoetching layer is exposed to intended light such that the conductive metal fibers in the region irradiated with the light are insulated by oxidation, cutting, or the like.

Among the above, the methods of (1), (2), (4), and (5) are appropriate in a case where the conductive layer is constituted only with the conductive metal fibers or in a case where the conductive layer contains the conductive metal fibers and a non-photosensitive matrix.

Moreover, a light source used for exposure described in the methods of (2), (3), (4), and (5) is selected in connection with a photosensitive wavelength region of a photoresist composition. However, generally, UV such as g-ray, h-ray, i-ray, or j-ray is preferably used. Moreover, a blue LED may also be used.

The pattern exposure method is not particularly limited, and may be performed by surface exposure using a photomask or scanning exposure using laser beams and the like. At this time, either refraction exposure using a lens or reflection exposure using a reflecting mirror may be performed. Moreover, it is possible to use exposure methods such as contact exposure, proximity exposure, reduced projection exposure, and reflection projection exposure.

In the patterning methods described in (2) and (4), the resist used for the photoresist layer is selected from any of negative and positive resists.

The negative resist contains, for example, a photopolymerization initiator and a photocurable material (a monofunctional or polyfunctional monomer or oligomer or a crosslinking group-containing polymer). The negative resist can also contain any of additives including a binder, a filler, a sensitizer, a polymerization inhibitor, a dye, a pigment, a surfactant, a thickener, a leveling agent, a crosslinking agent, an adhesion enhancer, and a solvent. The photopolymerization initiator can be used by being appropriately selected from compounds known as a photoinitiator for photoradical polymerization and a mixture of the compounds. The type of photopolymerization initiator is not particularly limited, and for example, an alkylphenone-based compound (for example, a benzyl dimethyl ketal compound, an α-hydroxyalkylphenone compound, or an α-aminoalkylphenone compound), and an oxime-based compound (for example, an oxime ester-based compound) can be used. One kind of the photopolymerization initiator may be used singly, or two or more kinds thereof may be used in combination.

The positive resist contains, for example, a photoacid generator and a curing agent. It can also contain any of additives including a binder, a filler, a sensitizer, a polymerization inhibitor, a dye, a pigment, a surfactant, a thickener, a leveling agent, a crosslinking agent, an adhesion enhancer, and a solvent.

A method of applying the resist layer is not particularly limited, and examples of the method include a coating method, a printing method, an ink jet method, and the like.

The coating method is not particularly limited, and examples thereof include a roll coating method, a bar coating method, a dip coating method, a spin coating method, a cast coating method, a die coating method, a blade coating method, a gravure coating method, a curtain coating method, a spray coating method, a doctor coating method, and the like.

Examples of the printing method include a letterpress printing method, a screen printing method, an offset printing method, a gravure printing method, and the like.

In the patterning method described in (2) and (4), the solvent dissolving the conductive metal fibers can be appropriate selected according to the conductive metal fiber. For example, when the conductive metal fiber is a silver nanowire, examples of the solvent include a bleach fixer, which is mainly used in a bleach-fixing step of photographic printing paper of a silver halide color photosensitive material in the field of so-called photographic science, a strong acid, an oxidant, hydrogen peroxide, and the like. Among these, the bleach fixer, dilute nitric acid, and hydrogen peroxide are more preferable, and the bleach fixer and dilute nitric acid are particularly preferable. Furthermore, when the silver nanowire is dissolved by the solvent that dissolves the conductive metal fibers, the portion of the silver nanowire that comes into contact with the solvent does not need to be completely dissolved, or alternatively, the portion may partially remain as long as the silver nanowire loses conductivity.

A concentration of the dilute nitric acid is preferably 1% by mass to 20% by mass.

A concentration of the hydrogen peroxide is preferably 3% by mass to 30% by mass.

Regarding the bleach fixer, the treatment materials or treatment methods described in, for example, JP1990-207250A (JP-H02-207250A), p. 26, right lower column, line 1 to p. 34, right upper column, line 9 and JP1992-97355A (JP-H04-97355A), p. 5, left upper column, line 17 to p. 18, right lower column, line 20 can be preferably used.

The bleach-fixing time is preferably equal to or shorter than 180 seconds, more preferably from 1 second to 120 seconds, and even more preferably from 5 seconds to 90 seconds. Moreover, a time required for washing with water or stabilization is preferably equal to or shorter than 180 seconds and more preferably from 1 second to 120 seconds.

The bleach fixer is not particularly limited as long as it is a bleach fixer for photographs, and can be appropriately selected according to the purpose. Examples thereof include CP-48S and CP-49E (bleach fixer for color paper) manufactured by FUJIFILM Corporation, Ektacolor RA bleach fixer manufactured by KODAK CORPORATION, bleach fixers D-J2P-02-P2, D-30P2R-01, and D-22P2R-01 manufactured by Dai Nippon Printing Co., Ltd., and the like. Among these, CP-48S and CP-49E are particularly preferable.

A viscosity of the solvent that dissolves the conductive metal fibers is preferably 5 mPa·s to 300,000 mPa·s, more preferably 10 mPa·s to 150,000 mPa·s, at 25° C. If the viscosity is controlled to be 5 mPa·s, it is easy to control the solvent to diffuse within an intended range, and as a result, and the conductive layer having a clear boundary between a conductive region and a non-conductive region can be patterned. On the contrary, if the viscosity is controlled to be equal to or lower than 300,000 mPa·s, printing of the solvent can be performed without load, and dissolution of the conductive metal fibers can be completed within an intended treatment time.

A method of applying the solution, which dissolves the conductive metal fibers, patternwise is not particularly limited as long as the solvent can be applied patternwise. The method can be appropriately selected according to the purpose, and examples thereof include screen printing, ink jet printing, and a method of forming in advance an etching mask by using a resist agent or the like and coating the surface of the mask with the solvent by means of coater coating, roller coating, dip coating, or spray coating, and the like. Among these, screen printing, ink jet printing, coater coating, and dip coating are particularly preferable.

For the ink jet printing, for example, either piezoelectric method or a thermal method can be used.

Regarding the aforementioned patterning method described in (5), examples of the patterning method of an etching agent generating an etchable chemical species such as a photoradical generator include 1) a method of performing bar coating and then performing UV mask exposure, 2) a method of performing patterning by using an ink jet and then performing UV solid exposure, 3) a method of performing patterning by screen printing and then performing UV solid exposure, and the like. The etching agent described in (5) can be removed by any method after exposure.

It is unclear why the conductive metal fiber-containing conductive material can be patterned by the method described in (4). However, the reason is assumed to be as below. From a radical species generated when the photoradical generator absorbs light, a peracid, a peroxide, or a peroxyradical may be generated, and it may oxidize the conductive metal fibers in the conductive layer adjacent thereto. As a result, a conductive network may be destroyed, and conductivity of the destroyed portion may deteriorate. This patterning method is more advantageous compared to the patterning method of completely removing the conductive metal fibers by means of etching or the like, since a difference in haze between a conductive portion and a non-conductive portion is small, and the pattern is not easily noticed.

In the patterning method described in (5), the photoradical generator is a compound functions to generate radicals by directly absorbing light or being photosensitized and causing a degradation reaction or a hydrogen abstraction reaction. It is preferable for the photopolymerization initiator to have an absorption in a region of a wavelength of 200 nm to 900 nm, preferably in a region of a wavelength of 200 nm to 600 nm, even more preferably in a region of a wavelength of 250 nm to 500 nm, and particularly preferably in a region of a wavelength of 300 nm to 500 nm.

Many compounds are known as such a photoradical generator, and examples thereof include a carbonyl compound, an acetal compound, a benzoin compound, an acridine compound, an organic peroxy compound, an azo compound, a coumarin compound, an azide compound, a metallocene compound, a hexaarylbiimidazole compound, an organic boric acid compound, a disulfonic acid compound, an oxime ester compound, and an acylphosphine (oxide) compound described in JP2008-268884A. These can be appropriately selected according to the purpose. Among these, from the viewpoint of exposure sensitivity, a benzophenone compound, an acetophenone compound, a hexaarylbiimidazole compound, an oxime ester compound, and an acylphosphine (oxide) compound are particularly preferable.

One kind of these photoradical generators may be used singly. Moreover, the photoradical generators may be diluted with an appropriate solvent, or may be mixed with a polymer, a thickener, or inorganic particles such that they obtain coating suitability, ink jet ejection suitability, or screen printing suitability. Alternatively, in order to improve visibility, the photoradical generators may be colored with a pigment or a dye added thereto.

The type of pattern is not particularly limited and can be appropriately selected according to the purpose. Examples thereof include letters, symbols, motifs, figures, wiring patterns, and the like.

The size of pattern is not particularly limited, and can be appropriately set according to the purpose. The size may be freely set within a range from nano-size to milli-size.

(Intermediate Layer)

In the first preferable embodiment and the second preferable embodiment of the present invention, it is preferable that at least one intermediate layer be disposed between the substrate and the conductive layer. If the intermediate layer is disposed between the substrate and the conductive layer, at least one of the adhesiveness between the substrate and the conductive layer, total light transmittance of the conductive layer, haze of the conductive layer, and film strength of the conductive layer can be improved.

Examples of the intermediate layer include an adhesive layer which is for improving adhesion force between the substrate and the conductive layer, a functional layer which improves functionality by interacting with the components contained in the conductive layer, and the like. The intermediate layer to be disposed can be appropriately selected.

Components used for the intermediate layer are not particularly limited, and may improve at least one of the aforementioned characteristics. For example, when an adhesive layer is used as the intermediate layer, the intermediate layer contains a compound selected from a polymer used as an adhesive, a silane coupling agent, a titanium coupling agent, a sol-gel film obtained by hydrolysis and polycondensation of an alkoxysilane compound, and the like.

Moreover, it is preferable for the intermediate layer coming into contact with the conductive layer (that is, the intermediate layer in a case where the intermediate layer consists of a single layer, or the intermediate layer coming into contact with the conductive layer in a case where the intermediate layer consists of plural layers) to be a functional layer containing a compound having a functional group that can interact with the conductive metal fibers contained in the conductive layer, since a conductive layer excellent in a total light transmittance, a haze, and a film strength is obtained. When the conductive member has such an intermediate layer, even if the conductive layer contains the conductive metal fibers and the matrix, a conductive layer excellent in a film strength is obtained.

The action is unclear but is considered to be as below. If the intermediate layer containing a compound having a functional group that can interact with the conductive metal fibers contained in the conductive layer is disposed, due to the interaction between the conductive metal fiber contained in the conductive layer and the compound having a functional group contained in the intermediate layer, aggregation of conductive materials in the conductive layer may be inhibited, and uniform dispersity may be improved. As a result, deterioration of transparency and haze that results from the aggregation of conductive materials in the conductive layer may be inhibited, and the film strength may be improved due to the adhesiveness. Hereinafter, the intermediate layer that shows the above interaction will be referred to as "functional layer" in some cases.

When the conductive metal fiber is, for example, a silver nanowire, the functional group that can interact with the conductive metal fibers is preferably at least one kind selected from a group consisting of an amide group, an amino group, a mercapto group, a carboxylic acid group, sulfonic acid group, a phosphoric acid group, a phosphonic acid group, and a salt of these. The functional group is more preferably an amino group, a mercapto group, a phosphoric acid group, a phosphonic acid group, or a salt of these, and most preferably is an amino group.

Examples of the functional group include amide group-containing compounds such as ureidopropyltriethoxysilane, polyacrylamide, and poly(N-methylacrylamide); amino group-containing compounds such as N-β(aminoethyl)γ-aminopropyltrimethoxysilane, 3-aminopropyltriethoxysilane, bis(hexamethylene)triamine, and poly(2-aminoethyl-acrylamide); mercapto group-containing compounds such as 3-mercaptopropyltrimethoxysilane and 2-mercaptoethyltrimethoxysilane; compounds having sulfonic acid or a slat thereof, such as poly(sodium p-styrenesulfonate) and poly(acrylamide-2-methylpropanesulfonic acid); carboxylic acid group-containing compounds such as polyacrylic acid, polymethacrylic acid, and a polyacrylic acid partial sodium salt; phosphoric acid group-containing compounds such as poly(2-phosphonoxyethyl methacrylate); and phosphonic acid group-containing compounds such as polyvinyl phosphonate.

If the functional group is selected among the above, after the coating solution for forming a conductive layer is coated, the conductive metal fibers interact with the functional group contained in the intermediate layer. Consequentially, it is possible to inhibit the conductive metal fibers from being aggregated in the process of drying and to form a conductive layer in which the conductive metal fibers have uniformly dispersed.

The intermediate layer can be formed by coating a solution, in which the compound constituting the intermediate layer is dissolved, dispersed, or emulsified, onto the substrate and drying the substrate. A general method can be used as the coating method without particularly limitation, and the coating method can be appropriately selected according to the purpose. Examples of the coating method include a roll coating method, a bar coating method, a dip coating method, a spin coating method, a cast coating method, a die coating method, a blade coating method, a gravure coating method, a curtain coating method, a spray coating method, a doctor coating method, and the like.

Figure 2:
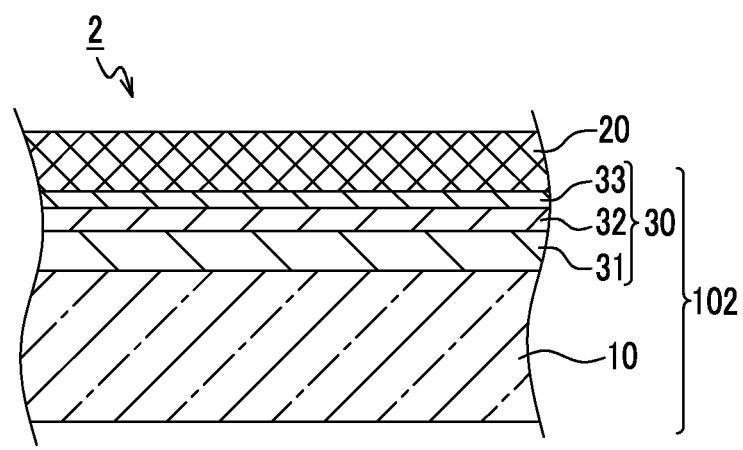
FIG. 2 is a schematic cross-sectional view of a conductive member according to a second embodiment of the present invention.

FIGS. 1 and 2 are schematic cross-sectional views respectively showing conductive members (1) and (2) according to the first preferable embodiment and the second preferable embodiment of the present invention. In FIG. 1, an intermediate layer 30, which has a first adhesive layer 31 having excellent affinity with the substrate 10 and a second adhesive layer 32 having excellent affinity with the conductive layer 20, is disposed between a substrate 10 and a conductive layer 20.

In FIG. 2, the intermediate layer 30, which has a functional layer 33 adjacent to the conductive layer 20 in addition to the first adhesive layer 31 and the second adhesive layer 32 as shown in the first preferable embodiment, is disposed between the substrate 10 and the conductive layer 20. In the present specification, the intermediate layer 30 refers to a layer constituted with at least one layer selected from the first adhesive layer 31, the second adhesive layer 32, and the functional layer 33.

Figure 3:
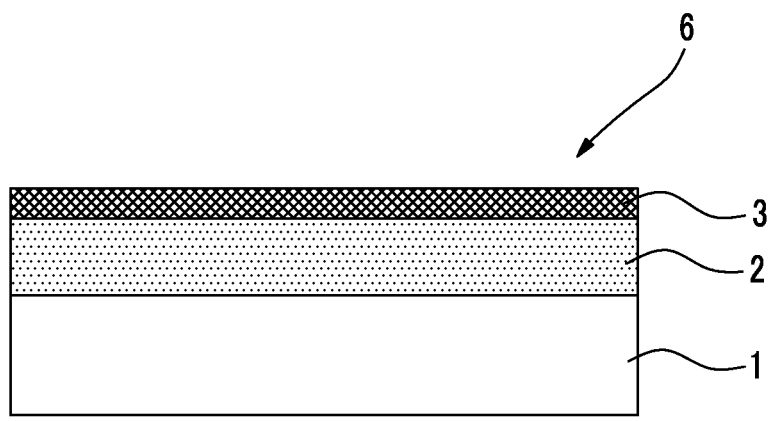
FIG. 3 is a schematic cross-sectional view of a conductive member according to a third embodiment of the present invention.
Figure 4:
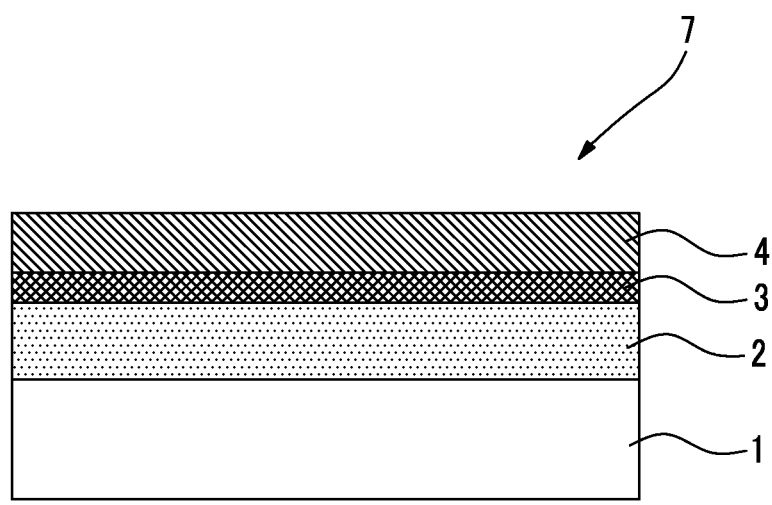
FIG. 4 is a schematic cross-sectional view of a conductive member according to a fourth embodiment of the present invention.

FIGS. 3 and 4 are schematic cross-sectional views showing conductive members (6) and (7) according to the third preferable embodiment of the present invention and a modified example of the third preferable embodiment. Herein, the conductive member (6) of FIG. 3 has a substrate 1 and a cushion layer 2 and a conductive layer 3 which are disposed at one side of the substrate 1 in this order. Moreover, the conductive member (7) of FIG. 4 is obtained by disposing an adhesive layer 4 on the conductive layer 3 of the conductive member (6) of FIG. 3.

The conductive member (6) according to the third preferable embodiment of the present invention will be described in detail.

The conductive member (6) has the cushion layer 2 and the conductive metal fiber-containing conductive layer 3 on the substrate 1 in this order. If necessary, the conductive member 3 further has other layers.

An average thickness of the cushion layer 2 is 1 µm to 50 µm, and preferably 5 µm to 20 µm. When the average thickness of the cushion layer 2 is equal to or greater than 1 µm, uniform transferability and responsiveness to concavities and convexities tend to become excellent. When the average thickness is equal to or smaller than 50 µm, color balance of the conductive member (6) tends to become excellent.

The conductive member of the present invention is not particularly limited in terms of the shape, structure, size, and the like, as long as it is constituted as above. The shape, structure, size, and the like can be appropriately selected according to the purpose. For example, the shape may be a film shape, a sheet shape, and the like, and the structure may be a single layer structure, a laminate structure, and the like. Furthermore, the size can be appropriately determined according to the purpose and the like.

It is preferable for the conductive member to be flexible and transparent. The "transparent" conductive member includes a colorless and transparent conductive member, a colored transparent conductive member, a translucent conductive member, a colored translucent conductive member, and the like.

(Cushion Layer)

In the third preferable embodiment, the conductive member has a cushion layer. Due to the cushion layer, even when the conductive layer covers the concavities and convexities of the substrate side, the conductive layer is not cut, and responsiveness to the concavities and convexities is improved. The shape, structure, size, and the like of the cushion layer are not particularly limited and can be appropriately selected according to the purpose. For example, the shape may be a film shape or a sheet shape, and the structure may be a single layer structure, a laminate structure, or the like. Furthermore, the size can be appropriately determined according to the purpose or the like.

The cushion layer is a layer that plays a role of improving transferability with respect to a transfer medium. The cushion layer contains at least a polymer and further contains other components if necessary.

The polymer contained in the cushion layer is not particularly limited as long as it is a polymer softened by heating. The polymer can be appropriately selected according to the purpose, and examples thereof include a thermoplastic resin and the like. Examples of the thermoplastic resin include an acrylic resin, a styrene-acryl copolymer, polyvinyl alcohol, polyethylene, an ethylene-vinyl acetate copolymer, an ethylene-ethyl acrylate copolymer, an ethylene-methacrylic acid copolymer and polyvinyl chloride gelatin; cellulose esters such as cellulose nitrate, cellulose triacetate, cellulose diacetate, cellulose acetate butyrate, and cellulose acetate propionate; homopolymers or copolymers containing vinylidene chloride, vinyl chloride, styrene, acrylonitrile, vinyl acetate, alkyl (having 1 to 4 carbon atoms) acrylate, and vinyl pyrrolidone; soluble polyester; polycarbonate; soluble polyamide; and the like. One kind of these may be used singly, or two or more kinds thereof may be used concurrently.

A glass transition temperature of the cushion layer is preferably 40° C. to 150° C., and more preferably 90° C. to 120° C. If the glass transition temperature is equal to or higher than 40° C., deterioration of handleability that is caused when the cushion layer is excessively softened at room temperature is inhibited. If the glass transition temperature is equal to or lower than 150° C., a state in which transferability of the conductive layer deteriorates without softening of the cushion layer in a thermal laminate method is prevented. The glass transition temperature may be regulated by the addition of a plasticizer or the like.

Examples of the aforementioned other components include organic polymer substances described in the section from paragraph 0007 of JP1993-72724A (JP-H05-72724A), various plasticizers for regulating adhesion force between the cushion layer and the substrate, a supercooling substance, an adhesion enhancer, a filler, an antioxidant, a surfactant, a release agent, a thermal polymerization inhibitor, a viscosity regulator, a solvent, and the like.

The cushion layer can be formed by coating a coating solution for a cushion layer that contains the polymer and the aforementioned other components if necessary onto the substrate and drying the substrate.

The coating method is not particularly limited and can be appropriately selected according to the purpose. Examples thereof include a roll coating method, a bar coating method, a dip coating method, a spin coating method, a cast coating method, a die coating method, a blade coating method, a gravure coating method, a curtain coating method, a spray coating method, a doctor coating method, and the like.

The conductive member according to the present invention exhibits excellent conductivity and transparency even when being exposed to harsh conditions such as a high-temperature or a high-humidity, and has a low surface resistivity. Accordingly, the conductive member can be widely used in, for example, a touch panel, an electrode for display, an electromagnetic wave shield, an electrode for organic EL display, an electrode for inorganic EL display, electronic paper, an electrode for flexible display, an integrated solar cell, a liquid crystal display device, a display device equipped with touch panel function, and other various devices. Among these, the conductive member can be particularly preferably used in a touch panel.

<Conductive Member Production Method>

The conductive member production method of the present invention is not particularly limited as long as it is a method that can form a conductive layer, which contains at least (a) conductive metal fibers having an average minor-axis length from 1 nm to 150 nm and the (b) component compound, on a substrate. Preferable examples of the production method include two methods including methods (1) and (2) described below, and examples of the method (1) include two methods described below. In any of the methods (1-1), (1-2), and (2), a conductive layer containing the conductive metal fibers as the (a) component, the (b) component compound, and the matrix as the (c) component is formed.

(1) In this method, a conductive layer is formed on a substrate by using the conductive composition which contains the (a) conductive metal fibers having an average minor-axis length from 1 nm to 150 nm and the (b) component compound.

Examples of the method (1) include the following methods (1-1) and (1-2).

(1-1) In this method, the conductive composition which contains the (a) conductive metal fibers having an average minor-axis length from 1 nm to 150 nm and the (b) component compound is applied onto a substrate, and then the (c) matrix is applied onto the substrate, whereby a conductive layer containing the (a) component, the (b) component, and the (c) component is formed.

(1-2) In this method, the conductive composition which contains the (a) conductive metal fibers having an average minor-axis length from 1 nm to 150 nm, the (b) component compound, and the (c) matrix is applied onto a substrate, whereby a conductive layer containing the (a) component, the (b) component, and the (c) component is formed.

(2) In this method, the (a) conductive metal fibers having an average minor-axis length from 1 nm to 150 nm are applied onto a substrate, and then a composition which contains the (b) component compound and the (c) polymerizable compound that can form a matrix is applied onto the substrate, whereby a conductive layer containing the (a) component, the (b) component, and the (c) component is formed.

Moreover, as described above, the (b) component compound can exerts its effect even in a case in which the compound is added to a layer adjacent to the conductive layer, in addition to a case in which the compound is added to the conductive metal fiber-containing conductive layer. Accordingly, examples of a method of adding the (b) component compound to the conductive layer include the following three methods.

(1) In this method, the (b) component compound is added to the conductive composition.

(2) In this method, a conductive metal fiber-containing layer is formed in advance on a substrate, and the layer is dipped into a solution containing the (b) component compound.

(3) In this method, the (b) component compound is added beforehand to a layer other than the conductive layer, and the (b) component compound is introduced into the conductive layer from other layer by diffusion when the conductive layer is coated and dried.

Among these, the methods (1) and (2) are preferable, and the method (1) is more preferable.

Therefore, examples of the method of producing a conductive member by using the (a) conductive metal fiber, the (b) component compound, and the (c) polymerizable compound that can form a matrix include the following methods. These methods will be described with reference to FIGS. 5 to 8. FIGS. 5 to 8 are views illustrating an example of the conductive member production method of the present invention. All of the views illustrate a case in which the conductive layer contains the (a) component, the (b) component compound, and the (c) component.

Figure 5:
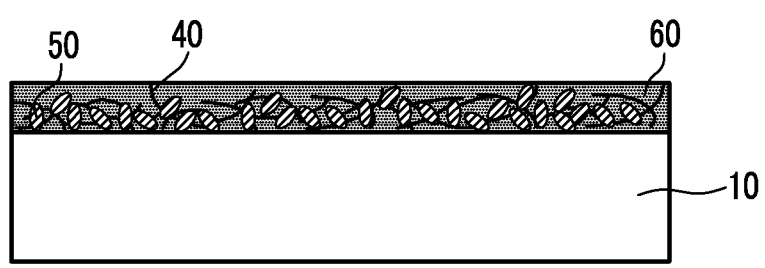
FIG. 5 is a drawing illustrating an example of a conductive member production method of the present invention.

[1] Method Described in FIG. 5

A conductive composition, which contains conductive metal fiber 40 as the (a) component, a (b) component compound 50, and a polymerizable compound 60 as the (c) component that can form a matrix, is applied onto a substrate.

This method is advantageous since it simplifies the process.

[II] Method Described in FIG. 6

Figure 6A:
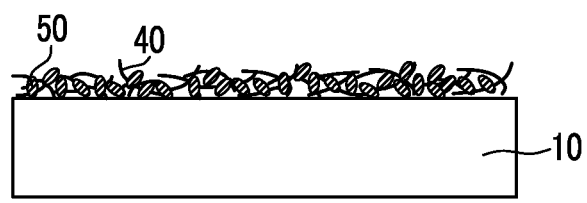
FIG. 6A and FIG. 6B are drawings illustrating another example of the conductive member production method of the present invention.
Figure 6B:
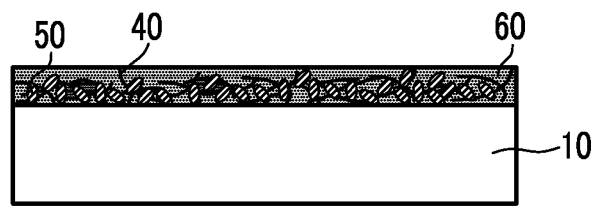

A conductive composition, which contains the conductive metal fiber 40 as the (a) component, and the (b) component compound 50, is applied onto a substrate (FIG. 6(A)), and then a solution containing a polymerizable compound 60 as the (c) component that can form a matrix is applied onto the substrate (FIG. 6(B)).

This method is effective when the (b) component compound 50 does not easily dissolve in the solution containing the polymerizable compound 60 as the (c) component that can form a matrix.

[III] Method Described in FIG. 7

Figure 7A:
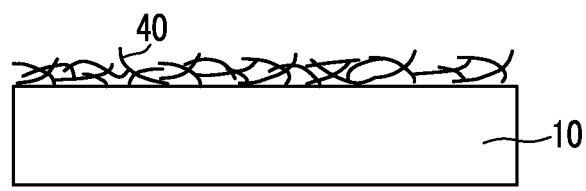
FIG. 7A and FIG. 7B are drawings illustrating another example of the conductive member production method of the present invention.
Figure 7B:
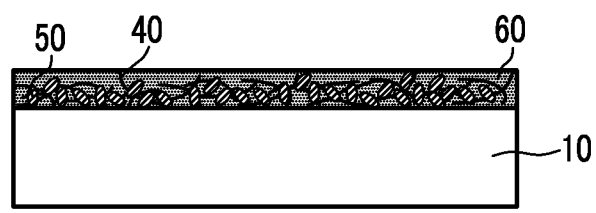

The conductive metal fiber 40 as the (a) component is applied onto a substrate (FIG. 7(A)), and then a solution containing the (b) component compound 50 and the polymerizable compound 60 as the (c) component that can form a matrix is applied onto the substrate (FIG. 7(B)).

This method is excellent since it can decrease contact resistance between conductive metal fibers 40.

[IV] Method Described in FIG. 8

Figure 8A:
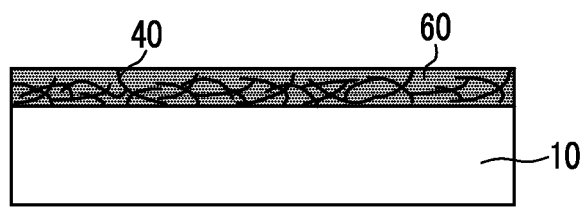
FIG. 8A, FIG. 8B and FIG. 8C are drawings illustrating another example of the conductive member production method of the present invention.
Figure 8B:
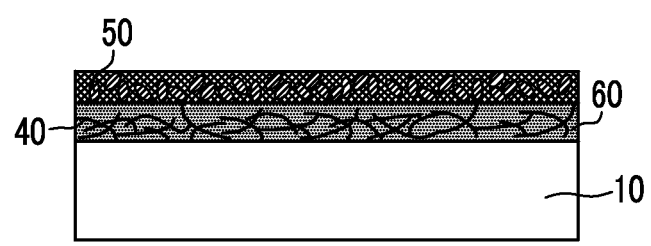
Figure 8C:
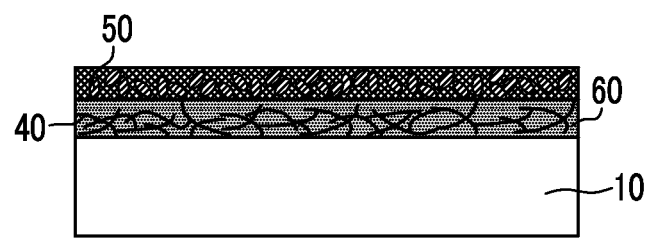

A solution containing the conductive metal fiber 40 as the (a) component and the polymerizable compound 60 as the (c) component that can form a matrix is applied onto a substrate so as to form a first layer (FIG. 8(A)). Thereafter, as another layer, a second layer containing the (b) component compound 50 is formed on the first layer (FIG. 8(B)), and then the (b) component compound 50 is caused to diffuse to the first layer from the second layer (FIG. 8(C)).

This method is excellent since it makes it possible to avoid influence of the (b) component compound when the (b) component compound exerts an influence on the diffusivity or contact resistance of the conductive metal fiber.

In FIG. 8, another layer comes into contact with the surface of the first layer that is far from the substrate 10. However, this layer may come into contact with the surface of the first layer that is close to the substrate 10.

<Touch Panel>

The conductive member according to the present invention is applied to, for example, a surface capacitive touch panel, a projected capacitive touch panel, and a resistive film touch panel. Herein, the touch panel has a so-called touch sensor and a touch pad.

The layer constitution of an electrode portion of the touch panel sensor in the touch panel is preferably formed by one of the bonding method in which two transparent electrodes are bonded to each other, the method in which a transparent electrode is provided to both surfaces of a substrate, the single-side jumper, the through-hole method, and a single-side lamination method.

The surface capacitive touch panel is described in, for example, JP2007-533044A.

<Solar Cell>

The conductive member according to the present invention is also useful as a transparent electrode in an integrated solar cell (hereinafter, also referred to as "solar cell device" in some cases). The integrated solar cell is not particularly limited, and those generally utilized as a solar cell device can be used. Examples thereof include a monocrystalline silicon-based solar cell device, a polycrystalline silicon-based solar cell device, an amorphous silicon-based solar cell device constituted with single-junction, a tandem structure, or the like, a semiconductor solar cell device of a compound of group III-V such as gallium arsenide (GaAs) and indium phosphide (InP), a semiconductor solar cell device of a compound of group II-VI such as cadmium telluride (CdTe), a semiconductor solar cell device of a compound of group such as copper/indium/selenium (so-called CIS), copper/indium/gallium/selenium (so-called CIGS), and copper/indium/gallium/selenium/sulfur (so-called CIGSS), a dye-sensitized solar cell device, an organic solar cell device, and the like.

Among these, in the present invention, the solar cell device is preferably an amorphous silicon-based solar cell device constituted with a tandem structure and a semiconductor solar cell device of a compound of group such as copper/indium/selenium (so-called CIS), copper/indium/gallium/selenium (so-called CIGS), and copper/indium/gallium/selenium/sulfur (so-called CIGSS).

In the amorphous silicon-based solar cell device constituted with a tandem structure, amorphous silicon, a microcrystalline silicon thin film layer, a thin film containing these and germanium (Ge), and a tandem structure consisting of two or more layers of these are used as a photoelectric conversion layer. Moreover, plasma CVD or the like is used for forming a film.

The conductive member according to the present invention is applicable to all of the aforementioned solar cell devices. The conductive member may be contained in any portion of the solar cell device, but it is preferable for the conductive layer is disposed in a portion adjacent to the photoelectric conversion layer. Regarding the positional relationship of the conductive member and the photoelectric conversion layer, the following constitution is preferable, but the present invention is not limited thereto. Furthermore, the following constitution does not show all of the portions constituting the solar cell device but merely shows the range which makes it possible to understand the positional relationship of the transparent conductive layer. Herein, the constitution shown in the bracket corresponds to the conductive member according to the present invention.

(a) [Substrate-conductive layer]-photoelectric conversion layer (b) [Substrate-conductive layer]-photoelectric conversion layer-[conductive layer-substrate]

(c) Substrate-electrode-photoelectric conversion layer-[conductive layer-substrate]

(d) Rear electrode-photoelectric conversion layer-[conductive layer-substrate]

The details of the solar cell are described in, for example, JP2010-87105A.

EXAMPLES

Hereinafter, examples of the present invention will be described, but the present invention is not limited to the examples. Moreover, all of "%" and "part(s)" indicating content in the examples are based on mass.

In the following examples, an average diameter (average minor-axis length), an average major-axis length, and a coefficient of variation of the average minor-axis length of metal nanowires were measured in the following manner.

<Average Diameter (Average Minor-Axis Length) and Average Major-Axis Length of Metal Nanowires>

A diameter (average minor-axis length) and a major-axis length of 300 strands of metal nanowires randomly selected from metal nanowires observed under magnification by using a transmission electron microscope (TEM; manufactured by JEOL Ltd., JEM-2000FX) were measured. From the average, an average diameter (average minor-axis length) and an average major-axis length of the metal nanowires were obtained.

<Coefficient of Variation of Average Minor-Axis Length (Diameter) of Metal Nanowires>

An average minor-axis length (diameter) of 300 metal nanowires randomly selected from images of the electron microscope (TEM) was measured. Moreover, a standard deviation and an average thereof were calculated for the 300 metal nanowires

Preparation Example 1

Preparation of Silver Nanowire Dispersion (1)

First, the following additive solutions A, B, C, and D were prepared.

[Additive Solution A]

120 mg of stearyl trimethyl ammonium chloride, 12.0 g of a 10% aqueous solution of stearyl trimethyl ammonium hydroxide, and 4.0 g of glucose were dissolved in 240.0 g of distilled water, thereby obtaining a reaction solution A-1. Moreover, 140 mg of silver nitrate powder was dissolved in 4.0 g of distilled water, thereby obtaining an aqueous silver nitrate solution A-1. The aqueous silver nitrate solution A-1 was added to the reaction solution A-1 which was being kept at 20° C. under vigorous stirring. After the addition of the aqueous silver nitrate solution A-1, the resultant was vigorously stirred for 180 minutes, thereby obtaining an additive solution A.

[Additive Solution B]

42.0 g of silver nitrate powder was dissolved in 958 g of distilled water.

[Additive Solution C]

75 g of 25% aqueous ammonia was mixed with 925 g of distilled water.

[Additive Solution D]

400 g of polyvinyl pyrrolidone (K30) was dissolved in 1.6 kg of distilled water.

Thereafter, a silver nanowire dispersion (1) was prepared in the following manner. 1.30 g of stearyl trimethyl ammonium bromide powder, 33.1 g of sodium bromide powder, 1,000 g of glucose powder, and 115.0 g of nitric acid (1 N) were dissolved in 12.7 kg of distilled water at 80° C. While the resultant solution was being kept at 80° C. under stirring at 500 rpm, 170 g of the additive solution A, the additive solution B, and the additive solution C were sequentially added to the solution at an addition rate of 250 ml/min, 500 ml/min, and 500 ml/min respectively. After the addition, the resultant was continuously heated under stirring for 100 minutes at 80° C. at a stirring speed of 200 rpm and then cooled to 25° C. Subsequently, the stirring speed was changed to 500 rpm, and the additive solution D was added thereto at a rate of 500 ml/min. The solution obtained in this manner was taken as a preliminary liquid 101.

Next, while 1-propanol was being vigorously stirred, the preliminary liquid 101 was added thereto at a time such that a mixing ratio between the preliminary liquid 101 and 1-propanol became 1:1 in terms of volume ratio. The obtained mixed solution was stirred for 3 minutes, thereby obtaining a preliminary liquid 102. By using an ultrafiltration module with a molecular weight cut-off of 150,000, ultrafiltration was performed in the following manner. The preliminary liquid 102 was concentrated by 4-fold, and then addition and concentration of a mixed solution consisting of distilled water and 1-propanol (1:1 in terms of a volume ratio) were repeated until conductivity of the finally obtained filtrate became equal to or lower than 50 µS/cm. The obtained filtrate was concentrated, thereby obtaining the silver nanowire dispersion (1) with a metal content of 0.50%.

For the silver nanowires of the obtained silver nanowire dispersion (1), the average minor-axis length, average major-axis length, coefficient of variation of minor-axis length of the silver nanowires, and average aspect ratio were measured. As a result, it was confirmed that the average minor-axis length is 15.1 nm, the average major-axis length is 7.2 µm, and the coefficient of variation is 17.5%. Moreover, it was confirmed that the average aspect ratio is 477. Hereinafter, the "silver nanowire dispersion (1)" indicates a silver nanowire dispersion obtained by the above method.

Preparation Example 2

Preparation of Silver Nanowire Dispersion (2)

A silver nanowire dispersion (2) with a metal content of 0.48% was obtained in the same manner as in Preparation Example 1, except that 130.0 g of distilled water was used instead of the additive solution A in Preparation Example 1.

For the silver nanowires of the obtained silver nanowire dispersion (2), the average minor-axis length, average major-axis length, coefficient of variation of minor-axis length of the silver nanowires, and average aspect ratio were measured in the aforementioned manner. As a result, it was confirmed that the average minor-axis length is 47.2 nm, the average major-axis length is 12.6 µm, and the coefficient of variation is 23.1%. Moreover, an average aspect ratio was confirmed to be 267. Hereinafter, the "silver nanowire dispersion (2)" indicates a silver nanowire dispersion obtained by the above method.

Preparation Example 3

Preparation of Silver Nanowire Dispersion (3)

60 g of silver nitrate powder was dissolved in 370 g of propylene glycol, thereby preparing a silver nitrate solution 301. 72.0 g of polyvinyl pyrrolidone (molecular weight of 55,000) was added to 4.45 kg of propylene glycol, and the resultant was heated to 90° C. while a gas-phase portion of the container was exposed to nitrogen gas. The solution obtained in this manner was taken as a reaction solution 301. In the state where the container was being exposed to nitrogen gas, 2.45 g of the silver nitrate solution 301 was added to the reaction solution 301 under vigorous stirring, and the resultant was heated under stirring for 1 minute. Thereafter, to this solution, a solution obtained by dissolving 11.8 g of tetrabutyl ammonium chloride in 100 g of propylene glycol was added, thereby obtaining a reaction solution 302.

To the reaction solution 302 which was being kept at 90° C. under stirring at a stirring speed of 500 rpm, 200 g of the silver nitrate solution 301 was added at an addition rate of 50 ml/min. The stirring speed was then decreased to 100 rpm, the nitrogen gas flow was cut, and the resultant was heated under stirring for 15 hours. To the thus obtained solution which was being kept at 90° C. under stirring at a stirring speed of 100 rpm, 220 g of the silver nitrate solution 301 was added at an addition rate of 0.5 ml/min. After the addition ended, the resultant was continuously heated under stirring for 2 hours. The stirring speed was then changed to 500 rpm, 1.0 kg of distilled water was added to the solution, and then the resultant was cooled to 25° C., thereby preparing a preliminary liquid 301.

By using an ultrafiltration module with a molecular weight cut-off of 150,000, ultrafiltration was performed in the following manner. The addition of a mixed solution consisting of distilled water and 1-propanol (1:1 in terms of a volume ratio) to the preliminary liquid 301 and concentration of the resultant were repeated until conductivity of the finally obtained filtrate became equal to or lower than 50 µS/cm. The obtained filtrate was concentrated, thereby obtaining the silver nanowire dispersion (3) with a metal content of 0.44%.

For the silver nanowires of the obtained silver nanowire dispersion (3), the average minor-axis length, average major-axis length, coefficient of variation of minor-axis length of the silver nanowires, and average aspect ratio were measured. As a result, it was confirmed that the average minor-axis length is 29.5 nm, the average major-axis length is 17.0 µm, and the coefficient of variation is 19.0%. Moreover, the average aspect ratio was confirmed to be 576.

Hereinafter, the "silver nanowire dispersion (3)" indicates a silver nanowire dispersion obtained by the above method.

Preparation Example 4

Pretreatment of Glass Substrate

An alkali-free substrate having a thickness of 0.7 µm was dipped in an 1% aqueous solution of sodium hydroxide and irradiated with ultrasonic waves for 30 minutes by using an ultrasonic washing machine. Thereafter, the substrate was washed with deionized water for 60 seconds and then heated for 60 minutes at 200° C. Subsequently, a silane coupling solution (a 0.3% aqueous solution of N-β(aminoethyl) γ-aminopropyltrimethoxysilane, trade name: KBM603, manufactured by Shin-Etsu Chemical Co., Ltd.) was poured over the substrate for 20 seconds by a shower, and then the substrate was washed with pure water by a shower, thereby obtaining a glass substrate. Hereinafter, the "glass substrate" indicates an alkali-free glass substrate obtained by the above pretreatment.

Preparation Example 5

Preparation of PET Substrate 101 Having Constitution Shown in FIG. 1

An adhesive solution 1 composed of the following components was prepared.

(Adhesive Solution 1)

| | |
|---|---|
| Takelac WS-4000 (polyurethane for coating, a solid content concentration of 30%, manufactured by Mitsui Chemicals, Inc.) | 5.0 parts |
| Surfactant (Nanoacty HN-100, manufactured by Sanyo Chemical Industries, Ltd.) | 0.3 parts |
| Surfactant (Sandetto BL, a solid content concentration of 43%, manufactured by Sanyo Chemical Industries, Ltd.) | 0.3 parts |
| Water | 94.4 parts |

One surface of a PET film 10 having a thickness of 125 µm was subjected to corona discharge treatment, and the adhesive solution 1 was coated onto the surface having undergone the corona discharge treatment. The film was then dried for 2 minutes at 120° C., thereby forming a first adhesive layer 31 having a thickness of 0.11 µm.

An adhesive solution 2 composed of the following components was prepared.

(Adhesive Solution 2)

| | |
|---|---|
| Tetraethoxysilane (KBE-04, manufactured by Shin-Etsu Chemical Co., Ltd.) | 5.0 parts |
| 3-Glycidoxypropyltrimethoxysilane (KBM-403, manufactured by Shin-Etsu Chemical Co., Ltd.) | 3.2 parts |
| 2-(3,4-Epoxycyclohexyl)ethyltrimethoxysilane (KBM-303, manufactured by Shin-Etsu Chemical Co., Ltd.) | 1.8 parts |
| Aqueous acetic acid solution (an acetic acid concentration of 0.05%, pH of 5.2) | 10.0 parts |
| Curing agent (boric acid, manufactured by Wako Pure Chemical Industries, Ltd) | 0.8 parts |
| Colloidal silica (Snowtex O, an average particle size of 10 nm to 20 nm, a solid content concentration of 20%, pH of 2.6, manufactured by NISSAN CHEMICAL INDUSTRIES, LTD) | 60.0 parts |
| Surfactant (Nanoacty HN-100, manufactured by Sanyo Chemical Industries, Ltd.) | 0.2 parts |
| Surfactant (Sandetto BL, a solid content concentration of 43%, manufactured by Sanyo Chemical Industries, Ltd.) | 0.2 parts |

An adhesive solution 2 was prepared in the following manner. While an aqueous acetic acid solution was being vigorously stirred, 3-glycidoxypropyltrimethoxysilane (KBM-403) was added dropwise to the aqueous acetic acid solution for 3 minutes. Thereafter, while the obtained aqueous acetic acid solution was being vigorously stirred, 2-(3,4-epoxycyclohexyl)ethyltrimethoxysilane (KBM-303) was added thereto for 3 minutes. Next, while the aqueous acetic acid solution containing KBM-403 and KBM-303 was being vigorously stirred, tetramethoxysilane was added thereto for 5 minutes, and then the solution was continuously stirred for 2 hours. Subsequently, colloidal silica, a curing agent, and a surfactant were sequentially added thereto, thereby preparing an adhesive solution 2.

The surface of the first adhesive layer 31 was subjected to corona discharge treatment, and then the surface was coated with the adhesive solution 2 by means of a bar coating method. Thereafter, the resultant was heated for 1 minute at 170° C. and dried so as to form a second adhesive layer 32 having a thickness of 0.5 µm, thereby obtaining a PET substrate 101 having the constitution shown in FIG. 1.

Example 1 and Comparative Example 1

Preparation of Conductive Member 1-1

An alkoxysilane compound-containing solution (hereinafter, also referred to as "sol-gel solution") composed as below was stirred for 1 hour at 60° C., and then it was confirmed that the solution is a uniform solution.
<Solution of Alkoxysilane Compound>

| | |
|---|---|
| Tetraethoxysilane (compound (II)) (KBE-04, manufactured by Shin-Etsu Chemical Co., Ltd.) | 5.0 parts |
| 1% Aqueous acetic acid solution | 10.0 parts |
| Distilled water | 4.2 parts |

3.44 parts of the obtained sol-gel solution was mixed with 14.90 parts of the silver nanowire dispersion (1) obtained in Preparation Example 1, and the resultant was mixed with an aqueous solution of the compound 1-3 such that a content of the compound 1-3 described in the present specification became 0.5 mmol with respect to 1 g of silver nanowires. Thereafter, the resultant was distilled with distilled water and 1-propanol, thereby preparing a conductive layer coating solution 1-1 with a silver concentration of 0.25% and a 1-propanol concentration of 30%.

The surface of the second adhesive layer 32 of the PET substrate 101 was subjected to corona discharge treatment, and the surface was coated with the conductive layer coating solution 1-1 by a bar coating method such that the amount of silver became 0.012 g/m² and the total amount of the coated solid contents became 0.096 g/m². Thereafter, the resultant was dried for 1 minute at 140° C. so as to cause a sol-gel reaction, thereby forming a conductive layer 20. In this manner, a conductive member 1-1 having the constitution shown in the cross-sectional view of FIG. 1 was obtained.

(Preparation of Conductive Member 1-2)

A conductive member 1-2 as a comparative example was prepared by the same method as the method of preparing the conductive member 1-1, except that the compound 1-3 was not added at the time of preparing the conductive layer coating solution in the method of preparing the conductive member 1-1.

(Preparation of Conductive Members 1-3 to 1-24)

Conductive members 1-3 to 1-24 of the present invention were prepared by the same method as the method of preparing the conductive member 1-1, except that in the method of preparing the conductive member 1-1, the type and amount (indicated using "mmol" with respect 1 g of silver nanowires) of the (b) component compound to be added were changed as shown in Table 1.

(Preparation of Conductive Members 1-25 to 1-30)

Conductive members 1-25 to 1-30 of the present invention were prepared by the same method as the method of preparing the conductive member 1-1, except that in the method of preparing the conductive member 1-1, compounds represented by Formulae (4) to (9) were further added in addition to of the (b) component compound (Table 1 shows the type and amount of those compounds added).

(Preparation of Conductive Members 1-31 to 1-41)

Conductive members 1-31 to 1-41 of the present invention were prepared by the same method as the method of preparing the conductive member 1-1, except that in the method of preparing the conductive member 1-1, in addition to the (b) component compound, the following compounds A-1 to A-4 as the compound according to the present invention that can be adsorbed onto a metal or can be coordinated with a metal ion were further added (Tables 1 and 2 show the type and amount of those compounds added).

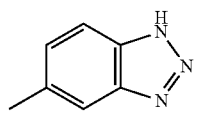

A-1

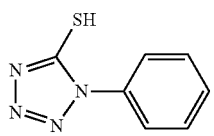

A-2

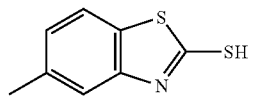

A-3

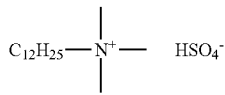

A-4

(Preparation of Conductive Members 1-42 to 1-46)

Conductive members 1-42 to 1-46 of the present invention were prepared by the same method as the method of preparing the conductive member 1-1, except that in the method of preparing the conductive member 1-1, in addition to the (b) component compound, the compounds represented by Formulae (3) to (11) and the above compounds A-1 to A-4 as the compound according to the present invention that can be adsorbed onto a metal or the compound that can be coordinated with a metal ion were further added (Table 2 shows the type and amount of those compounds added).

(Preparation of Conductive Members 1-47 to 1-49)

Conductive members 1-47 to 1-49 as comparative examples were prepared by the same method as the method of preparing the conductive member 1-1, except that in the method of preparing the conductive member 1-1, instead of the (b) component compound, the following comparative compound C-1, C-2, or C-3 was added (Table 2 shows the type and amount of the compound added).

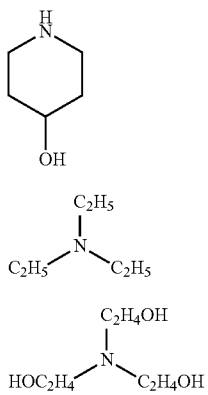

<Evaluation>

Each of the obtained conductive members was evaluated as below. Moreover, to evaluate optical characteristics, a total light transmittance and a level of haze were measured by the following method. Furthermore, to evaluate weather resistance, heat resistance, resistance to moist heat, and ozone resistance were measured by the following method. The results are shown in Table 1.

[Conductivity (Surface Resistivity)]

A surface resistivity of each of the conductive members was measured using Loresta-GP MCP-T600 manufactured by Mitsubishi Chemical Corporation. In the measurement, in samples of 10 cm×10 cm, the surface resistivity of central portion of randomly selected five conductive regions was measured, and the average was calculated. The conductive members were ranked as below.

5: Surface resistivity of less than 165 Ω/square, extremely excellent level

4: Surface resistivity of equal to or higher than 165 Ω/square but less than 180 Ω/square, excellent level 3: Surface resistivity of equal to or higher than 180 Ω/square but less than 200 Ω/square, acceptable level 2: Surface resistivity of equal to or higher than 200 Ω/square but less than 250 Ω/square, unproblematic level 1: Surface resistivity of equal to or higher than 250 Ω/square, seriously problematic level

[Resistivity of Conductive Member Having Undergone Patterning]

(Conductivity (Surface Resistivity))

For evaluation, a pattern having a size of 5 cm×5 cm was prepared. Moreover, the surface resistivity of the central portion of randomly selected three conductive regions was measured, and average thereof was calculated. In this manner, the conductive members were ranked as below according to the surface resistivity obtained after patterning.

5: Surface resistivity of less than 165 Ω/square, extremely excellent level

4: Surface resistivity of equal to or higher than 165 Ω/square but less than 180 Ω/square, excellent level 3: Surface resistivity of equal to or higher than 180 Ω/square but less than 200 Ω/square, acceptable level 2: Surface resistivity of equal to or higher than 200 Ω/square but less than 250 Ω/square, unproblematic level 1: Surface resistivity of equal to or higher than 250 Ω/square, seriously problematic level (Fine Line Resistivity)

A fine line resistivity of the conductive member patterned in the form of a stripe pattern or a fine line pattern was measured using a tester (manufactured by CUSTOM corporation, CDM-5000E). For the stripe pattern, the resistivity of five conductive lines of one conductive member was measured, and the average was taken as the resistivity. For the fine line pattern, the resistivity of hundred lines having a line width of 300 μm and a length of 30 mm was measured, and the average thereof was calculated.

[Optical Characteristics (Total Light Transmittance)]

A total light transmittance (%) of each of the conductive members was measured using Haze-Guard Plus manufactured by BYK-Gardner. Moreover, the total light transmittance of the conductive portion and a non-conductive portion having undergone patterning was measured in the following sequence. It is difficult to measure the conductive portion and the non-conductive portion of an actual fine line pattern by using a haze meter. Accordingly, a pattern for evaluation (10 mm square) was provided to a sample similar to the actual fine line pattern, and the total light transmittance of the conductive portion and the non-conductive portion was measured. The total light transmittance was measured at an angle of 0° by using a CIE visibility function y under a C light source. The total light transmittance of the central portion of randomly selected five conductive regions in a sample of 10 cm×10 cm was measured, and the average was calculated. The conductive members were ranked as below.

A: Transmittance of equal to or higher than 90%, excellent level

B: Transmittance of equal to or higher than 85% but less than 90%, slightly problematic level

[Optical Characteristics (Haze)]

A level of haze of a portion corresponding to the conductive region of the conductive member was measured using a Haze-Guard Plus manufactured by BYK-Gardner. In the measurement, the haze of central portion of randomly selected five conductive regions of a sample of 10 cm×10 cm was measured, and the average was calculated. Moreover, the level of haze of the conductive region and the non-conductive region having undergone patterning was measured in the following sequence. It is difficult to measure the conductive portion and the non-conductive portion of an actual fine line pattern by using a haze meter. Accordingly, a pattern for evaluation (10 mm square) was provided to a sample similar to the actual fine line pattern, and the level of haze of the conductive portion and the non-conductive portion was measured.

[Heat Resistance]

Each of the conductive members was subjected to forced heating treatment for 60 minutes at 200° C. by using a dry oven OFW-600 manufactured by AS ONE Corporation. The surface resistivity (RDT) of each conductive member having undergone the heating treatment was measured by the aforementioned method, and a ration of change of the surface resistivity to a surface resistivity (R0) measured before the heating treatment (RDT/R0) was calculated. In this manner, heat resistance of each of the conductive members was evaluated, and the conductive members were ranked as below.

Furthermore, the patterned fine lines were ranked in the same manner as the ratio of change of fine line resistivity described above.

Rank 5: Ratio of change of surface resistivity of less than 10%, extremely excellent level Rank 4: Ratio of change of surface resistivity of equal to or higher than 10% but less than 20%, excellent level Rank 3: Ratio of change of surface resistivity of equal to or higher than 20% but less than 35%, acceptable level Rank 2: Ratio of change of surface resistivity of equal to or higher than 35% but less than 50%, slightly problematic level Rank 1: Ratio of change of surface resistivity of equal to or higher than 50%, problematic level

[Ozone Resistance]

Each of the conductive members was exposed to an environment with an ozone concentration of 10 ppm and a temperature of 30° C. for 5 hours. Moreover, the surface resistivity (ROT) of each of the conductive members before and after the treatment was measured by the aforementioned method, and a ratio of change (ROT/R0) of ROT to the surface resistivity (R0) measured before the exposure to ozone was calculated. In this manner, the ozone resistance of each of the conductive members was evaluated, and the conductive members were ranked as below.

Furthermore, the patterned fine lines were ranked in the same manner as the ratio of change of fine line resistivity described above.

Rank 5: Ratio of change of surface resistivity of equal to or higher than 100% but less than 150%, extremely excellent level Rank 4: Ratio of change of surface resistivity of equal to or higher than 150% but less than 200%, excellent level Rank 3: Ratio of change of surface resistivity of equal to or higher than 200% but less than 350%, acceptable level Rank 2: Ratio of change of surface resistivity of equal to or higher than 350% but less than 500%, slightly problematic level Rank 1: Ratio of change of surface resistivity of equal to or higher than 500%, problematic level

TABLE 1

| Conductive member | Compound of Formula (1), (2), or (3) Compound | Added amount (mmol/g) | Compounds of Formulae (4) to (9) Compound | Added amount (mmol/g) | Compound that can be adsorbed onto or coordinated with metal Compound | Added amount (mmol/g) | | Rank of conductivity | Optical characteristics Rank of total light transmittance | Level of haze (%) | Rank of heat resistance | Rank of ozone resistance |
|---|---|---|---|---|---|---|---|---|---|---|---|---|
| 1-1 | 1-3 | 0.5 | — | — | — | — | Present invention | 5 | A | 1.06 | 3 | 4 |
| 1-2 | — | — | — | — | — | — | Comparative example | 4 | A | 1.05 | 1 | 1 |
| 1-3 | 1-4 | 0.5 | — | — | — | — | Present invention | 5 | A | 1.06 | 4 | 4 |
| 1-4 | 1-5 | 0.5 | — | — | — | — | Present invention | 5 | A | 1.06 | 4 | 4 |
| 1-5 | 1-19 | 0.5 | — | — | — | — | Present invention | 5 | A | 1.05 | 5 | 4 |
| 1-6 | 1-20 | 0.5 | — | — | — | — | Present invention | 5 | A | 1.05 | 5 | 4 |
| 1-7 | 1-25 | 0.5 | — | — | — | — | Present invention | 5 | A | 1.05 | 5 | 4 |
| 1-8 | 1-27 | 0.5 | — | — | — | — | Present invention | 5 | A | 1.07 | 3 | 3 |
| 1-9 | 1-34 | 0.5 | — | — | — | — | Present invention | 5 | A | 1.07 | 3 | 3 |
| 1-10 | 2-2 | 0.5 | — | — | — | — | Present invention | 5 | A | 1.05 | 3 | 3 |
| 1-11 | 2-4 | 0.5 | — | — | — | — | Present invention | 4 | A | 1.06 | 3 | 3 |
| 1-12 | 2-6 | 0.5 | — | — | — | — | Present invention | 5 | A | 1.06 | 3 | 3 |
| 1-13 | 3-2 | 0.5 | — | — | — | — | Present invention | 4 | A | 1.04 | 3 | 3 |
| 1-14 | 3-4 | 0.5 | — | — | — | — | Present invention | 4 | A | 1.05 | 3 | 3 |
| 1-15 | 3-6 | 0.5 | — | — | — | — | Present invention | 4 | A | 1.05 | 4 | 4 |
| 1-16 | 1-25 | 0.004 | — | — | — | — | Present invention | 5 | A | 1.04 | 3 | 3 |
| 1-17 | 1-25 | 0.01 | — | — | — | — | Present invention | 5 | A | 1.04 | 4 | 3 |
| 1-18 | 1-25 | 0.055 | — | — | — | — | Present invention | 5 | A | 1.04 | 4 | 4 |
| 1-19 | 1-25 | 0.5 | — | — | — | — | Present invention | 5 | A | 1.05 | 4 | 4 |
| 1-20 | 1-25 | 2.5 | — | — | — | — | Present invention | 5 | A | 1.05 | 4 | 4 |
| 1-21 | 1-25 | 4.5 | — | — | — | — | Present invention | 5 | A | 1.06 | 4 | 4 |
| 1-22 | 1-25 | 9.0 | — | — | — | — | Present invention | 4 | A | 1.06 | 4 | 4 |
| 1-23 | 1-25 | 45 | — | — | — | — | Present invention | 4 | A | 1.08 | 4 | 4 |
| 1-24 | 1-26 | 60 | — | — | — | — | Present invention | 4 | B | 1.05 | 3 | 3 |
| 1-25 | 1-4 | 0.5 | 4-1 | 0.25 | — | — | Present invention | 5 | A | 1.06 | 5 | 5 |
| 1-26 | 2-2 | 0.5 | 4-1 | 0.25 | — | — | Present invention | 5 | A | 1.08 | 4 | 4 |
| 1-27 | 3-2 | 0.5 | 4-1 | 0.25 | — | — | Present invention | 4 | A | 1.08 | 4 | 4 |
| 1-28 | 1-4 | 0.5 | 5-2 | 0.25 | — | — | Present invention | 5 | A | 1.06 | 5 | 4 |
| 1-29 | 2-2 | 0.5 | 5-2 | 0.25 | — | — | Present invention | 5 | A | 1.08 | 5 | 3 |
| 1-30 | 1-4 | 0.5 | 7-7 | 0.25 | — | — | Present invention | 5 | A | 1.06 | 5 | 4 |
| 1-31 | 1-5 | 0.5 | — | — | A-1 | 0.25 | Present invention | 5 | A | 1.04 | 5 | 5 |
| 1-32 | 1-20 | 0.5 | — | — | A-1 | 0.25 | Present invention | 5 | A | 1.04 | 5 | 5 |
| 1-33 | 2-6 | 0.5 | — | — | A-1 | 0.25 | Present invention | 5 | A | 1.05 | 4 | 4 |

TABLE 2

| Conductive member | Compound of Formula (1), (2), or (3) | | Compound of Formula (4) or (5) | | Compound that can be adsorbed onto or coordinated with metal | | Rank | Rank of conductivity | Optical characteristics | | Rank of heat resistance | Rank of ozone resistance |
|---|---|---|---|---|---|---|---|---|---|---|---|---|
| | Compound | Added amount (mmol/g) | Compound | Added amount light | Compound | Added amount (mmol/g) | | | Level of total transmittance | Rank of haze (%) | | |
| 1-34 | 3-2 | 0.5 | — | — | A-1 | 0.25 | Present invention | 4 | A | 1.05 | 4 | 4 |
| 1-35 | 1-25 | 0.5 | — | — | A-1 | 8 | Present invention | 4 | A | 1.07 | 5 | 5 |
| 1-36 | 1-25 | 0.5 | — | — | A-1 | 16 | Present invention | 3 | A | 1.08 | 5 | 5 |
| 1-37 | 1-20 | 0.5 | — | — | A-2 | 0.25 | Present invention | 5 | A | 1.04 | 5 | 5 |
| 1-38 | 1-20 | 0.5 | — | — | A-3 | 0.25 | Present invention | 5 | A | 1.04 | 5 | 5 |
| 1-39 | 1-5 | 0.5 | — | — | A-4 | 0.25 | Present invention | 5 | A | 1.04 | 5 | 5 |
| 1-40 | 2-2 | 0.5 | — | — | A-4 | 0.25 | Present invention | 5 | A | 1.04 | 4 | 4 |
| 1-41 | 3-6 | 0.5 | — | — | A-4 | 0.25 | Present invention | 4 | A | 1.04 | 5 | 5 |
| 1-42 | — | — | — | — | A-1 | 0.25 | Comparative example | 5 | A | 1.05 | 3 | 3 |
| 1-43 | — | — | — | — | A-1 | 3 | Comparative example | 3 | A | 1.06 | 2 | 2 |
| 1-44 | — | — | — | — | A-2 | 0.25 | Comparative example | 5 | A | 1.04 | 3 | 2 |
| 1-45 | — | — | — | — | A-3 | 0.25 | Comparative example | 5 | A | 1.05 | 3 | 2 |
| 1-46 | — | — | — | — | A-4 | 0.25 | Comparative example | 4 | A | 1.04 | 3 | 4 |
| 1-47 | C-1 | 0.5 | — | — | — | — | Comparative example | 3 | A | 1.04 | 1 | 2 |
| 1-48 | C-2 | 0.5 | — | — | — | — | Comparative example | 4 | A | 1.04 | 1 | 1 |
| 1-49 | C-3 | 0.5 | — | — | — | — | Comparative example | 4 | A | 1.04 | 1 | 2 |

From Tables 1 and 2, the following can be understood. The conductive members 1-1 and 1-3 to 1-41 containing the (b) component compound according to the present invention show a small extent of change in resistivity when they are stored at a high temperature and exhibit excellent ozone resistance and weather resistance. Among these, the compound represented by Formula (1) exerts a stronger effect, and the compounds 1-19, 1-20, and 1-25 exert a much stronger effect.

Moreover, the conductive members 1-25 to 1-30, which concurrently use the compounds represented by Formulae (4) to (9) in addition to the (b) component compound according to the present invention, are excellent in overall performance of a conductive member in terms of the optical characteristics, heat resistance, and ozone resistance, compared to a case where only the (b) component compound according to the present invention is added to a conductive member.

Furthermore, the conductive members 1-31 to 1-41, which contain the compound according to the present invention that can be adsorbed onto a metal or the compound that can be coordinated with a metal ion in addition to the (b) component compound according to the present invention, are excellent in overall performance of a conductive member in terms of the optical characteristics, heat resistance, and ozone resistance, compared to a case where only the (b) component compound according to the present invention is added to the conductive member.

On the other hand, the conductive members 1-2 and 1-42 to 1-49 as comparative examples that do not contain the compound according to the present invention are insufficient in terms of the heat resistance and ozone resistance.

Example 2 and Comparative Example 2

Evaluation of Dependence on Minor-Axis Length

An aqueous silver nanowire dispersion was prepared by the same method as the method of preparing the conductive member 1-1, except that in the method of preparing the silver nanowire dispersion (1) described in Preparation Example 1, the initial temperature of the mixed solution obtained at the first stage was changed to 24° C. from 20° C. The obtained aqueous silver nanowire dispersion was named Ag-2.

Moreover, an aqueous silver nanowire dispersion was prepared by the same method as the method of preparing the conductive member 1-1, except that in the method of preparing the silver nanowire dispersion (1) described in Preparation Example 1, the initial temperature of the mixed solution obtained at the first stage was changed to 28° C. from 20° C. The obtained aqueous silver nanowire dispersion was named Ag-3.

For the silver nanowires contained in Ag-2 and Ag-3, the average minor-axis length, average major-axis length, and coefficient of variation of minor-axis length of the silver nanowires were measured in the same manner described above.

As a result, it was confirmed that the average minor-axis length of the silver nanowires contained in Ag-2 is 27.6 nm, the average major-axis length is 31.8 μm, and the coefficient of variation of minor-axis length is 25.2%.

Furthermore, it was confirmed that the average minor-axis length of the silver nanowires contained in Ag-3 is 33.6 nm, the average major-axis length is 28.8 μm, and the coefficient of variation of minor-axis length is 27.5%.

Conductive members 2-1 to 2-3 were prepared by the same method as the method of preparing the conductive members 1-7, 1-2, and 1-10 of Example 1, except that in the method of preparing the conductive members 1-7, 1-2, and 1-10 of Example 1, Ag-2 was used instead of the silver nanowire dispersion (1). Moreover, conductive members 2-4 to 2-6 were prepared by the same method as the method of preparing the conductive members 1-7, 1-2, and 1-10, except that Ag-3 was used instead of the silver nanowire dispersion (1).

In addition, conductive members 2-7 to 2-9 were prepared by the same method as the method of preparing the conductive members 1-7, 1-2, and 1-10, except that in the method of preparing the conductive members 1-7, 1-2, and 1-10 of Example 1, the silver nanowire dispersion (2) of Preparation Example 2 was used instead of the silver nanowire dispersion (1). Moreover, conductive members 2-10 to 2-12 were prepared by the same method as the method of preparing the conductive members 1-7, 1-2, and 1-10, except that the silver nanowire dispersion (3) of Preparation Example 3 was used instead of the silver nanowire dispersion (1).

Each of the obtained conductive members 2-1 to 2-12 was evaluated in the same manner as in Example 1, and the obtained evaluation results are shown in Table 3. Furthermore, evaluation results of the conductive members 1-7, 1-2, and 1-10 obtained in Example 1 are also shown in Table 3.

stood that the effects of the present invention are excellently exerted even in the conductive member using the silver nanowire dispersion (3) prepared in a non-aqueous solvent.

That is, it is understood that in order to obtain better optical characteristics of a transparent conductive film, it is effective to use silver nanowires having a small average minor-axis length (that is, fine silver nanowires), and the present invention is effective particularly as means for improving the heat resistance, and ozone resistance that such silver nanowires exhibit.

Example 3 and Comparative Example 3

Evaluation of Patterned Conductive Member

The conductive member 1-1 obtained in Example 1 was patterned in the following manner. First, a positive resist (light-soluble composition) composed as below was coated onto the conductive member 1-1 by using a wire bar coater so as to yield a dry film thickness of 2 μm. The resultant was pre-baked on a hot plate for 120 seconds at 90° C., and then subjected to contact exposure by using a high-pressure mercury lamp through an exposure mask having a stripe pattern (line/space=50 μm/50 μm). The sample having

TABLE 3

| | Silver nanowire | | Compound of | | | | Optical characteristics | | | |
|---|---|---|---|---|---|---|---|---|---|---|
| | | Average minor- | Formula (1) or (2) | | | | Rank of | | Rank of | Rank of |
| Conductive member | Dispersant | axis length (nm) | Compound | Added amount (mmol/g) | | Rank of conductivity | total light transmittance | Level of haze (%) | heat resistance | ozone resistance |
| 2-1 | Ag-2 | 27.6 | 1-25 | 0.5 | Present invention | 5 | A | 1.44 | 5 | 5 |
| 2-2 | Ag-2 | 27.6 | — | — | Comparative example | 5 | A | 1.44 | 2 | 2 |
| 2-3 | Ag-2 | 27.6 | 2-2 | 0.5 | Present invention | 5 | A | 1.41 | 3 | 4 |
| 2-4 | Ag-3 | 33.6 | 1-25 | 0.5 | Present invention | 5 | A | 1.69 | 5 | 5 |
| 2-5 | Ag-3 | 33.6 | — | — | Comparative example | 5 | A | 1.71 | 3 | 4 |
| 2-6 | Ag-3 | 33.6 | 2-2 | 0.5 | Present invention | 5 | A | 1.71 | 4 | 5 |
| 1-7 | (1) | 15.1 | 1-25 | 0.5 | Present invention | 5 | A | 1.05 | 5 | 4 |
| 1-2 | (1) | 15.1 | — | — | Comparative example | 5 | A | 1.05 | 4 | 1 |
| 1-10 | (1) | 15.1 | 2-2 | 0.5 | Present invention | 5 | A | 1.05 | 3 | 3 |
| 2-7 | (2) | 47.2 | 1-25 | 0.5 | Present invention | 5 | A | 1.75 | 4 | 5 |
| 2-8 | (2) | 47.2 | — | — | Comparative example | 4 | A | 1.78 | 2 | 3 |
| 2-9 | (2) | 47.2 | 2-5 | 0.5 | Present invention | 5 | A | 1.75 | 4 | 5 |
| 2-10 | (3) | 29.5 | 1-25 | 0.5 | Present invention | 4 | A | 1.06 | 5 | 5 |
| 2-11 | (3) | 29.5 | — | — | Comparative example | 4 | A | 1.07 | 1 | 1 |
| 2-12 | (3) | 29.5 | 2-5 | 0.5 | Present invention | 4 | A | 1.05 | 5 | 4 |

From Table 3, it is understood that the effects of the present invention are also exerted even in thicker silver nanowires obtained by increasing the average minor-axis length of silver nanowires. It is also understood that as the average minor-axis length of silver nanowires increases, the heat resistance, and ozone resistance are improved even in a conductive member not containing the compound of the present invention, but the degree of improvement is insufficient. On the contrary, it is understood that as the average minor-axis length of silver nanowires increases, the level of haze also increases, and the smaller the average minor-axis length is, the better the optical characteristics of the transparent conductive film becomes. Furthermore, it is under-undergone exposure was subjected to a developing treatment which will be described later, and a mask resist with line/space=50 μm/50 μm was formed on a conductive layer. Thereafter, etching treatment which will be described later was performed to dissolve silver nanowires present outside the portion in which the mask resist remained, thereby forming a stripe pattern of silver nanowires. Moreover, by performing post-exposure and peeling development treatment which will be described later, the mask resist was completely dissolved.

Each of the above patterning step was performed under the following conditions.

(Exposure)

Exposure was performed using an i-ray (365 nm) of a high-pressure mercury lamp at an intensity of 150 mJ/cm² (illuminance of 20 mW/cm²).

(Developing Treatment)

Paddle development was performed for 90 seconds in an aqueous solution (23° C.) of 0.4% by mass tetramethyl ammonium hydroxide (TMAH), thereby removing the exposed portion. Thereafter, the sample was washed with pure water (23° C.) for 90 seconds, and then dried at room temperature.

(Etching Treatment)

Etching was performed for 90 seconds at 23° C. by using the following etching solution A, and the sample was washed with pure water (23° C.) for 90 seconds. Thereafter, the sample was washed with pure water (23° C.) for 90 seconds, and then dried at room temperature.

—Etching Solution A—

| | |
|---|---|
| Ethylenediaminetetraacetic acid iron (III) ammonium | 2.71 g |
| Ethylenediaminetetraacetic acid disodium salt dihydrate | 0.17 g |
| Ammonium thiosulfate (70% by mass) | 3.61 g |
| Sodium sulfite | 0.84 g |
| Glacial acetic acid | 0.43 g |
| Water for obtaining a total of 1,000 mL of etching solution A | |

(Post-Exposure)

Exposure was performed using an i-ray (365 nm) of a high-pressure mercury lamp at an intensity of 300 mJ/cm² (illuminance of 20 mW/cm²).

(Peeling Development Treatment)

Paddle development was performed for 90 seconds in an aqueous solution (23° C.) of 0.4% by mass TMAH, thereby removing the exposed portion. Thereafter, the sample was washed with pure water (23° C.) for 90 seconds, and then dried at room temperature.

In this manner, a conductive silver nanowire pattern having a stripe pattern with line/space=50 μm/50 μm was formed. The obtained conductive member having undergone patterning was named a conductive member 1-1P.

(Composition of Positive Resist)

| | |
|---|---|
| Acrylic binder (A-1) | 11.0 parts by mass as solid contents |
| Photosensitizer (TAS-200 manufactured by Toyo Gosei CO. Ltd.) | 6.2 parts by mass |
| Crosslinking agent (EHPE-3150 manufactured by Daicel Corporation) | 5.2 parts by mass |
| Adhesion accelerator (KBM-403 manufactured by Shin-Etsu Chemical Co., Ltd) | 0.1 parts by mass |
| Solvent PGMEA | 45.0 parts by mass |
| Solvent MFG | 32.5 parts by mass |

PGMEA: propylene glycol monomethyl ether acetate
MFG: 1-methoxy-2-propanol
TAS-200:

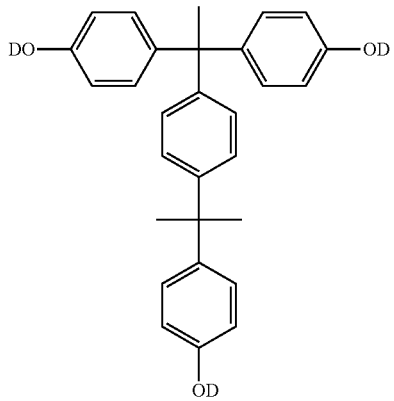

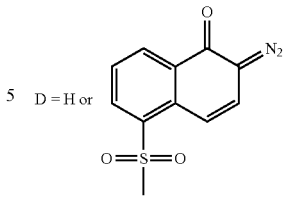

D = H or

<Synthesis of Binder (A-1)>

As monomer components constituting a copolymer, 7.79 g of methacrylic acid (MAA) and 37.21 g of benzyl methacrylate (BzMA) were used. Moreover, as a radical polymerization initiator, 0.5 g of azobisisobutyronitrile (AIBN) was used. These components were put in 55.00 g of a solvent propylene glycol monomethyl ether acetate (PGMEA) to cause a polymerization reaction, thereby obtaining a PGMEA solution (solid content concentration: 45% by mass) of a binder (A-1) represented by the following formula. Furthermore, the polymerization temperature was regulated within 60° C. to 100° C.

As a result of performing gel permeation chromatography (GPC), a weight average molecular weight (Mw) expressed in terms of polystyrene was measured to be 30,000, and a molecular weight distribution (Mw/Mn) was 2.21.

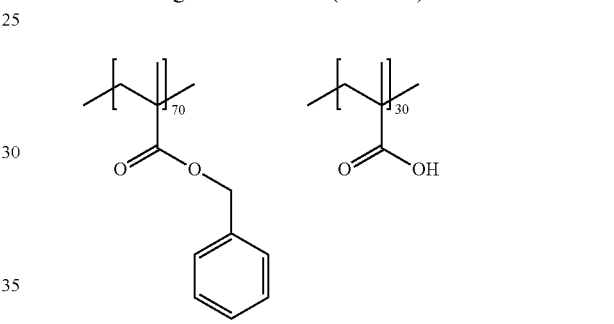

Conductive members 1-2P to 1-49P obtained by patterning the conductive members 1-2 to 1-49 were prepared by the same method as the method of preparing the conductive member 1-1P.

All of these conductive members having undergone patterning were observed with an optical microscope. As a result, it was confirmed that an excellent conductive pattern with line/space of about 50 μm/50 μm is formed in the conductive members.

Each of the conductive members was evaluated in terms of weather resistance (heat resistance and ozone resistance) in the following manner. Herein, a resistivity was measured by the method described in the [Resistivity of Conductive Member Having Undergone Patterning]. Regarding the conductivity, the conductive members were ranked based on the surface resistivity, and regarding weather resistance, they were ranked based on the fine line resistivity. The evaluation results are shown in Tables 4 and 5.

<Evaluation of Heat Resistance>

Each of the samples was subjected to the forced heating treatment (for 60 minutes at 200° C.) in the same manner as in the evaluation of heat resistance of Example 1. Moreover, the samples were ranked in the same manner as in Example 1, except that a ratio of resistivities before and after the forced heating treatment was taken as a rate of increase of resistivity, and the resistivity was measured by the method described in the [Resistivity of Conductive Member Having Undergone Patterning].

<Evaluation of Ozone Resistance>

Each of the samples was subjected to the same treatment as in evaluation of ozone resistance in Example 1. Moreover, the samples were ranked in the same manner as in Example 1, except that a rate of change of the surface resistivity before and after the treatment was calculated, and the resistivity was measured by the method described in the [Resistivity of Conductive Member Having Undergone Patterning].

TABLE 4

| Conductive material | Compound of Formula (1), (2), or (3) | | Compounds of Formulae (4) to (9) | | Compound that can be absorbed onto or coordinated with metal | | | Rank of conductivity | Rank of heat resistance | Rank of ozone resistance |
|---|---|---|---|---|---|---|---|---|---|---|
| | Compound | Added amount (mmol/g) | Compound | Added amount (mmol/g) | Compound | Added amount (mmol/g) | | | | |
| 1-1P | 1-3 | 0.5 | — | — | — | — | Present invention | 5 | 3 | 3 |
| 1-2P | — | — | — | — | — | — | Comparative example | 4 | 1 | 1 |
| 1-3P | 1-4 | 0.5 | — | — | — | — | Present invention | 5 | 4 | 3 |
| 1-4P | 1-5 | 0.5 | — | — | — | — | Present invention | 5 | 4 | 3 |
| 1-5P | 1-19 | 0.5 | — | — | — | — | Present invention | 5 | 4 | 4 |
| 1-6P | 1-20 | 0.5 | — | — | — | — | Present invention | 5 | 5 | 4 |
| 1-7P | 1-25 | 0.5 | — | — | — | — | Present invention | 5 | 5 | 4 |
| 1-8P | 1-27 | 0.5 | — | — | — | — | Present invention | 5 | 3 | 3 |
| 1-9P | 1-34 | 0.5 | — | — | — | — | Present invention | 5 | 3 | 3 |
| 1-10P | 2-2 | 0.5 | — | — | — | — | Present invention | 5 | 3 | 3 |
| 1-11P | 2-4 | 0.5 | — | — | — | — | Present invention | 4 | 3 | 3 |
| 1-12P | 2-6 | 0.5 | — | — | — | — | Present invention | 5 | 3 | 3 |
| 1-13P | 3-2 | 0.5 | — | — | — | — | Present invention | 4 | 3 | 3 |
| 1-14P | 3-4 | 0.5 | — | — | — | — | Present invention | 4 | 3 | 3 |
| 1-15P | 3-6 | 0.5 | — | — | — | — | Present invention | 4 | 4 | 3 |
| 1-16P | 1-25 | 0.004 | — | — | — | — | Present invention | 5 | 3 | 3 |
| 1-17P | 1-25 | 0.01 | — | — | — | — | Present invention | 5 | 3 | 3 |
| 1-18P | 1-25 | 0.055 | — | — | — | — | Present invention | 5 | 4 | 4 |
| 1-19P | 1-25 | 0.5 | — | — | — | — | Present invention | 5 | 4 | 4 |
| 1-20P | 1-25 | 2.5 | — | — | — | — | Present invention | 5 | 4 | 4 |
| 1-21P | 1-25 | 4.5 | — | — | — | — | Present invention | 5 | 4 | 4 |
| 1-22P | 1-25 | 9.0 | — | — | — | — | Present invention | 4 | 4 | 4 |
| 1-23P | 1-25 | 45 | — | — | — | — | Present invention | 4 | 4 | 3 |
| 1-24P | 1-26 | 60 | — | — | — | — | Present invention | 4 | 3 | 3 |
| 1-25P | 1-4 | 0.5 | 4-1 | 0.25 | — | — | Present invention | 5 | 5 | 5 |
| 1-26P | 2-2 | 0.5 | 4-1 | 0.25 | — | — | Present invention | 5 | 4 | 4 |
| 1-27P | 3-2 | 0.5 | 4-1 | 0.25 | — | — | Present invention | 4 | 4 | 4 |
| 1-28P | 1-4 | 0.5 | 5-2 | 0.25 | — | — | Present invention | 5 | 4 | 4 |
| 1-29P | 2-2 | 0.5 | 5-2 | 0.25 | — | — | Present invention | 5 | 5 | 3 |
| 1-30P | 1-4 | 0.5 | 7-7 | 0.25 | — | — | Present invention | 5 | 5 | 4 |
| 1-31P | 1-5 | 0.5 | — | — | A-1 | 0.25 | Present invention | 5 | 4 | 5 |
| 1-32P | 1-20 | 0.5 | — | — | A-1 | 0.25 | Present invention | 5 | 5 | 5 |
| 1-33P | 2-6 | 0.5 | — | — | A-1 | 0.25 | Present invention | 5 | 4 | 4 |

TABLE 5

| Conductive material | Compound of Formula (1), (2), or (3) | | Compounds of Formula (4) to (9) | | Compound that can be adsorbed onto or coordinated with metal | | | Rank of conductivity | Rank of heat resistance | Rank of ozone resistance |
|---|---|---|---|---|---|---|---|---|---|---|
| | Compound | Added amount (mmol/g) | Compound | Added amount (mmol/g) | Compound | Added amount (mmol/g) | | | | |
| 1-34P | 3-2 | 0.5 | — | — | A-1 | 0.25 | Present invention | 4 | 4 | 4 |
| 1-35P | 1-25 | 0.5 | — | — | A-1 | 8 | Present invention | 4 | 5 | 4 |
| 1-36P | 1-25 | 0.5 | — | — | A-1 | 16 | Present invention | 3 | 5 | 5 |
| 1-37P | 1-20 | 0.5 | — | — | A-2 | 0.25 | Present invention | 5 | 5 | 5 |
| 1-38P | 1-20 | 0.5 | — | — | A-3 | 0.25 | Present invention | 5 | 4 | 5 |
| 1-39P | 1-5 | 0.5 | — | — | A-4 | 0.25 | Present invention | 5 | 5 | 5 |
| 1-40P | 2-2 | 0.5 | — | — | A-4 | 0.25 | Present invention | 5 | 4 | 4 |
| 1-41P | 3-6 | 0.5 | — | — | A-4 | 0.25 | Present invention | 4 | 4 | 5 |
| 1-42P | — | — | — | — | A-1 | 0.25 | Comparative example | 5 | 3 | 3 |
| 1-43P | — | — | — | — | A-1 | 3 | Comparative example | 3 | 2 | 2 |

TABLE 5-continued

| Conductive material | Compound of Formula (1), (2), or (3) | | Compounds of Formula (4) to (9) | | Compound that can be adsorbed onto or coordinated with metal | | | Rank of conductivity | Rank of heat resistance | Rank of ozone resistance |
|---|---|---|---|---|---|---|---|---|---|---|
| | Compound | Added amount (mmol/g) | Compound | Added amount (mmol/g) | Compound | Added amount (mmol/g) | | | | |
| 1-44P | — | — | — | — | A-2 | 0.25 | Comparative example | 5 | 3 | 2 |
| 1-45P | — | — | — | — | A-3 | 0.25 | Comparative example | 5 | 3 | 2 |
| 1-46P | — | — | — | — | A-4 | 0.25 | Comparative example | 4 | 3 | 4 |
| 1-47P | C-1 | 0.5 | — | — | — | — | Comparative example | 3 | 1 | 2 |
| 1-48P | C-2 | 0.5 | — | — | — | — | Comparative example | 4 | 1 | 1 |
| 1-49P | C-3 | 0.5 | — | — | — | — | Comparative example | 4 | 1 | 2 |

The results listed in Tables 4 and 5 clearly show that similarly to Example 1, the weather resistance (heat resistance and ozone resistance) enhancing effect of the present invention is also obtained from the conductive members having undergone patterning.

Example 4 and Comparative Example 4

Conductive members 4-1 to 4-49 were prepared by the same method as the method of preparing the conductive members 1-1 to 1-49, except that in the method of preparing the conductive members 1-1 to 1-49 of Example 1, the PET substrate 101 was replaced with a glass substrate prepared in Preparation Example 2. These conductive members were evaluated in the same manner as in Example 1. As a result, it was found that all of the conductive members 4-1 and 4-3 to 4-41 of the present invention that contain the (b) component compound exhibit excellent weather resistance (heat resistance and ozone resistance), compared to the conductive member 4-2 that does not contain the (b) component compound.

Example 5 and Comparative Example 5

The conductive member 1-2 of a comparative example was dipped in an aqueous solution of the compound 1-20 or 1-25 for 5 minutes. Thereafter, the conductive member was washed with flowing water and dried by air blowing, thereby preparing conductive members 5-1 to 5-2 containing the (b) component compound in a conductive layer.

Moreover, a content of the (b) component compound in the conductive layer of each of the conductive members 5-1 and 5-2 was measured by pulverizing each of the conductive member with a freezer mill, performing solvent extraction, and conducting analysis by high performance liquid chromatography. These conductive members were evaluated in the same manner as in Example 1. The results are shown in Table 6.

In addition, Table 6 also shows evaluation results of conductive members 1-6 and 1-7 which were obtained by adding the compound 1-20 or the compound 1-25 beforehand to a coating solution of a conductive composition and then performing coating.

TABLE 6

| Conductive member | Compound of Formula (1), (2), or (3) | | | Rank of conductivity | Rank of total light transmittance | Optical characteristics Level of haze (%) | Rank of heat resistance | Rank of ozone resistance |
|---|---|---|---|---|---|---|---|---|
| | Compound | Added amount (mmol/g) | | | | | | |
| 1-2 | — | — | Comparative example | 4 | A | 1.05 | 1 | 1 |
| 5-1 | 1-20 | 0.5 Dipping | Present invention | 5 | A | 1.05 | 4 | 4 |
| 5-2 | 1-25 | 0.5 Dipping | Present invention | 5 | A | 1.05 | 4 | 4 |
| 1-6 | 1-20 | 0.5 Added in the form of coating solution | Present invention | 5 | A | 1.05 | 5 | 4 |
| 1-7 | 1-25 | 0.5 Added in the form of coating solution | Present invention | 5 | A | 1.05 | 5 | 4 |

From Table 6, it is understood that the effects of the present invention are excellently exerted even in the conductive members in which the (b) component compound is added to the conductive layer by dipping. Moreover, it is also understood that for the effects of the present invention, it is more preferable that the (b) component compound be added beforehand to the conductive layer coating solution and then coated.

Example 6 and Comparative Example 6

In the conductive members 1-2, 1-6 and 1-7, a composition for a soluble protective layer composed as below was coated onto the conductive layer, followed by drying, thereby forming a soluble protective layer having an average thickness of 0.8 μm. Moreover, patterning was performed on the conductive members in the same manner as in Example 3, thereby preparing conductive members 6-1P and 6-9P. These conductive members were evaluated in the same manner as in Example 1. The results are shown in Table 7.

—Preparation of Composition for Soluble Protective Layer—

| | |
|---|---|
| Polyvinyl alcohol (PVA, PVA205 (saponification rate = 88%); manufactured by KURARAY CO., LTD.) | 10 g |
| Deionized water | 90 g |
| Polyoxyethylene lauryl ether (surfactant) | 0.05 g |
| (b) Component compound of the present invention | type and amount described in Table 7. |

The above components were mixed together and stirred, thereby preparing the composition for a soluble protective layer.

ponent compound is contained in the soluble protective layer, the effects of the present invention are exerted. Accordingly, presumably, the (b) component compound of the present invention may exert its effect by moving to a photosensitive layer from the soluble protective layer. It is also understood that for the effects of the present invention, it is more preferable to add the (b) component compound to the conductive layer coating solution beforehand and then perform coating, or add the (b) component compound to both the conductive layer and the soluble protective layer.

Example 7

Preparation of Conductive Member Patterned by being Provided with Photoresist Layer —Preparation of Resist Composition (1)—

The following components were mixed together to form the following makeup, followed by stirring, thereby preparing a resist composition (1).

TABLE 7

| | Conductive layer | | Soluble protective layer | | | Rank of conductivity | Optical characteristics | | Rank of heat resistance | Rank of ozone resistance |
|---|---|---|---|---|---|---|---|---|---|---|
| Conductive member | Compound of Formula (1), (2), or (3) | Added amount (mmol/g) | Compound of Formula (1), (2), or (3) | Added amount (mmol/g) | | | Rank of total light transmittance | Level of haze (%) | | |
| 6-1P | — | — | — | — | Comparative example | 4 | A | 1.07 | 3 | 2 |
| 6-2P | 1-20 | 0.5 | — | — | Present invention | 5 | A | 1.06 | 5 | 5 |
| 6-3P | 1-25 | 0.5 | — | — | Present invention | 5 | A | 1.06 | 5 | 5 |
| 6-4P | — | — | 1-20 | 0.5 | Present invention | 4 | A | 1.07 | 5 | 4 |
| 6-5P | — | — | 1-25 | 0.5 | Present invention | 5 | A | 1.06 | 5 | 4 |
| 6-6P | 1-20 | 0.5 | 1-20 | 0.2 | Present invention | 5 | A | 1.06 | 5 | 5 |
| 6-7P | 1-20 | 0.5 | 1-25 | 0.2 | Present invention | 5 | A | 1.06 | 5 | 5 |
| 6-8P | 1-25 | 0.5 | 1-20 | 0.2 | Present invention | 5 | A | 1.06 | 5 | 5 |
| 6-9P | 1-25 | 0.5 | 1-25 | 0.2 | Present invention | 5 | A | 1.06 | 5 | 5 |

(Makeup of Resist Composition (1))

| | |
|---|---|
| Binder (A-1) synthesized in Example 3 | 3.80 parts by mass (solid content of 40.0% by mass, PGMEA solution) |
| KAYARAD DPHA (manufactured by Nippon Kayaku Co., Ltd) as a photosensitive compound | 1.59 parts by mass |
| IRGACURE 379 (manufactured by Ciba Specialty Chemicals Inc) as a photopolymerization initiator | 0.159 parts by mass |
| EHPE-3150 (manufactured by Daicel Corporation) as a crosslinking agent | 0.150 parts by mass |
| MEGAFAC F781F (DIC Corporation) | 0.002 parts by mass |
| PGMEA | 19.3 parts by mass |

From Table 7, it is understood that the present invention is effective even in the conductive member having the soluble protective layer, and when the (b) component compound of the present invention is contained in one of the conductive layer and soluble protective layer, the effects of the present invention are exerted. Even when the (b) com- —Resist Patterning Step—

For the conductive members 1-2, 1-6, and 1-7, the resist composition (1) obtained as above was coated onto a conductive layer by means of a bar coating method so as to yield a dry film thickness of 5 μm, and the conductive members were dried in an oven at 150° C. for 5 minutes. Exposure was performed by emitting an i-ray (365 nm) of a high-pressure mercury lamp at an intensity of 400 mJ/cm$^2$ (illuminance of 50 mW/cm$^2$) to the substrate through an exposure mask in a nitrogen atmosphere.

The substrate having undergone exposure was subjected to shower exposure for 60 seconds by using an aqueous solution of 1% sodium hydroxide at 35° C. The shower pressure was 0.08 MPa, and it was taken 30 seconds until a stripe pattern appeared. The resultant was rinsed with pure water by shower and then dried for 1 minute at 50° C., thereby preparing conductive members 7-1R, 7-2R, and 7-3R having a resist pattern.

Moreover, as the exposure mask, an exposure mask which can form a solid exposed portion, an unexposed portion, and a fine line pattern (L/S=300/300 µm, an electrode length of 30 mm) was used.

—Etching Step—

The conductive members 7-1R, 7-2R, and 7-3R having a resist pattern were subjected to etching treatment by being dipped in an etching solution, which was obtained by mixing a CP-48S-A solution, a CP-48S-B solution (all manufactured by FUJIFILM Corporation, bleach fixer for color paper), and pure water together at a mass ratio of 1:1:6 and had a temperature regulated to be 35° C., for 2 minutes. After the samples were rinsed with pure water by shower, water on the surface of the samples was blown away by an air knife, and the samples were dried for 5 minutes at 60° C.

—Resist Peeling Step—

The etched substrate was subjected shower development for 75 seconds by using an aqueous solution of 2.5% tetramethyl ammonium hydroxide kept at 35° C. The shower pressure was 3.0 MPa. After the samples were rinsed with pure water by shower, water on the surface of the samples was blown away by an air knife, and the samples were dried for 5 minutes at 60° C., thereby preparing patterned conductive members 7-1P, 7-2P, and 7-3P. Each of the obtained conductive members was evaluated in terms of the surface resistivity and optical characteristics (total light transmittance and level of haze) in the same manner as in Example 3. The results are shown in Table 8.

Techno-Times), "Technology and Development of Touch Panel" supervised by Yuji Mitani, CMC Plublishing Co., Ltd. (published in December, 2004), "FPD International 2009 Forum T-11 Lecture Textbook", "Cypress Semiconductor Corporation Application Note AN2292", and the like.

It was found that when the touch panel prepared as above is used, it is possible to produce a touch panel which has improved light transmittance and excellent visibility, makes it possible to input letters and the like by at least one of the bare hands, hands with gloves, and indicator due to the improved conductivity, and excellently responds to screen manipulation.

What is claimed is:

1. A conductive composition comprising at least:
   (a) conductive metal fibers having an average minor-axis length from 1 nm to 150 nm; and
   (b) at least one compound selected from a compound represented by the following Formula (1), a compound represented by the following Formula (2), and a compound having a partial structure represented by the following Formula (3),

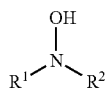

Formula (1)

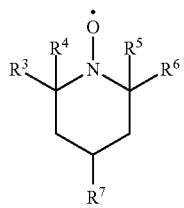

Formula (2)

TABLE 8

| Conductive member | Conductive layer Compound | Added amount (mmol/g) | | Rank of conductivity | Optical characteristics Rank of total light transmittance | Level of haze (%) | Rank of heat resistance | Rank of ozone resistance |
|---|---|---|---|---|---|---|---|---|
| 7-1P | — | — | Comparative example | 3 | A | 1.15 | 2 | 2 |
| 7-2P | 1-20 | 0.5 | Present invention | 5 | A | 1.05 | 5 | 4 |
| 7-3P | 1-25 | 0.5 | Present invention | 5 | A | 1.05 | 5 | 4 |

From Table 8, it is understood that the conductive members patterned by a resist tend to deteriorate in terms of conductivity or haze, but the present invention is particularly effective for improving such problems.

Example 8

Preparation of Touch Panel

By using the conductive member 1-7 of Example 1, a touch panel was prepared by the methods described in "The Latest Touch Panel Technology" (published in Jul. 6, 2009, -continued

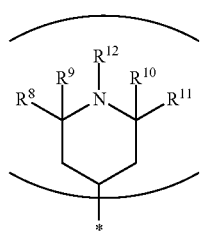

Formula (3)

in Formula (1), each of $R^1$ and $R^2$ independently represents a hydrogen atom, an alkyl group, an alkenyl group, an aryl group, an acyl group, an aryloxycarbonyl group, an alkoxycarbonyl group, or a carbamoyl group, and the acyl group is a formyl group, a substituted or unsubstituted alkylcarbonyl group having 2 to 30 carbon atoms, or a substituted or unsubstituted arylcarbonyl group having 7 to 30 carbon atoms, in Formula (2), each of $R^3$, $R^4$, $R^5$, and $R^6$ independently represents an alkyl group having 1 to 4 carbon atoms, $R^7$ represents a hydrogen atom or a substituent, and a superscript dot represents a free radical, in Formula (3), each of $R^8$, $R^9$, $R^{10}$, and $R^{11}$ independently represents an alkyl group having 1 to 4 carbon atoms, and $R^{12}$ represents an alkyl group, an alkoxy group, or an acyl group, and in Formula (3), * represents a bonding site.

2. The conductive composition according to claim 1, further comprising (c) a polymerizable compound that can form a matrix.

3. The conductive composition according to claim 2, wherein the (c) polymerizable compound that can form a matrix is a non-photosensitive compound.

4. The conductive composition according to claim 3, wherein the (c) polymerizable compound that can form a matrix is a compound that can form a cured sol-gel substance.

5. The conductive composition according to claim 2, wherein a ratio of content of the (c) polymerizable compound that can form a matrix to the (a) conductive metal fibers ((c)/(a)) is 0.001/1 to 100/1 in terms of a mass ratio.

6. The conductive composition according to claim 1, wherein a content of (b) at least one compound selected from a compound represented by Formula (1), a compound represented by Formula (2), and a compound having a partial structure represented by Formula (3) is from 0.005 mmol to 50 mmol per 1 g of the (a) conductive metal fibers.

7. The conductive composition according to claim 1, wherein a molecular weight of the (b) at least one compound selected from a compound represented by Formula (1), a compound represented by Formula (2), and a compound having a partial structure represented by Formula (3) is from 140 to 5,000.

8. The conductive composition according to claim 1, wherein at least one of $R^1$ and $R^2$ in the Formula (1) is an alkyl group, an alkenyl group, an aryl group, an acyl group, an aryloxycarbonyl group, an alkoxycarbonyl group, or a carbamoyl group, and the acyl group is a formyl group, a substituted or unsubstituted alkylcarbonyl group having 2 to 30 carbon atoms, or a substituted or unsubstituted arylcarbonyl group having 7 to 30 carbon atoms.

9. The conductive composition according to claim 8, wherein at least one of $R^1$ and $R^2$ in the Formula (1) is an alkyl group, an alkenyl group, or an aryl group substituted with at least one group selected from a carboxyl group and an alkali metal salt thereof, a sulfo group and an alkali metal salt thereof, a hydroxyl group, an alkoxy group, an alkoxycarbonyl group, and a carbamoyl group.

10. The conductive composition according to claim 1, further comprising at least one kind of compound represented by the following Formulae (4) to (9),

in Formula (4), each of $R^{41}$ and $R^{42}$ independently represents an alkyl group, an aryl group, an alkoxy group, an aryloxy group, or a halogen atom, and $R^{43}$ represents an alkyl group or an aryl group, at least two of the $R^{41}$, $R^{42}$, and $R^{43}$ may be linked to each other through an organic group having a valency of 2 or higher or through a single bond, moreover, the Formula (4) may include a structure that plural compounds represented by Formula (4) are linked to each other through an organic group having a valency of 2 or higher or through a single bond, in Formula (5), each of $R^{51}$ and $R^{52}$ independently represents an alkyl group, $R^{51}$ and $R^{52}$ may be linked to each other through an organic group having a valency of 2 or higher or through a single bond, moreover, the Formula (5) may include a structure that plural compounds represented by Formula (5) are linked to each other through an organic group having a valency of 2 or higher or through a single bond, in Formula (6), $V_{61}$ represents a hydrogen atom or a substituent, in Formula (7), $V_{71}$ represents a hydrogen atom or a substituent, and each of $R_{71}$ and $R_{72}$ independently represents a hydrogen atom or a group which can be substituted with a nitrogen atom, in Formula (8), $V_{81}$ represents a hydrogen atom or a substituent, and each of $R_{81}$ and $R_{82}$ independently represents a hydrogen atom or a group which can be substituted with a nitrogen atom, in Formula (9), $V_{91}$ represents a hydrogen atom or a substituent, each of $R_{91}$, $R_{92}$, and $R_{93}$ independently represents a hydrogen atom or a group which can be substituted with a nitrogen atom.

11. The conductive composition according to claim 8, further comprising at least one kind of compound represented by the following Formulae (4) to (9),

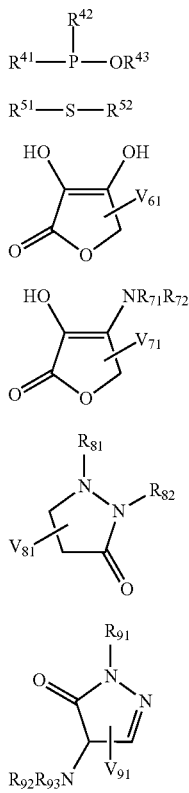

in Formula (4), each of $R^{41}$ and $R^{42}$ independently represents an alkyl group, an aryl group, an alkoxy group, an aryloxy group, or a halogen atom, and $R^{43}$ represents an alkyl group or an aryl group, at least two of the $R^{41}$, $R^{42}$, and $R^{43}$ may be linked to each other through an organic group having a valency of 2 or higher or through a single bond, moreover, the Formula (4) may include a structure that plural compounds represented by Formula (4) are linked to each other through an organic group having a valency of 2 or higher or through a single bond, in Formula (5), each of $R^{51}$ and $R^{52}$ independently represents an alkyl group, $R^{51}$ and $R^{52}$ may be linked to each other through an organic group having a valency of 2 or higher or through a single bond, moreover, the Formula (5) may include a structure that plural compounds represented by Formula (5) are linked to each other through an organic group having a valency of 2 or higher or through a single bond, in Formula (6), $V_{61}$ represents a hydrogen atom or a substituent, in Formula (7), $V_{71}$ represents a hydrogen atom or a substituent, and each of $R_{71}$ and $R_{72}$ independently represents a hydrogen atom or a group which can be substituted with a nitrogen atom, in Formula (8), $V_{81}$ represents a hydrogen atom or a substituent, and each of $R_{81}$ and $R_{82}$ independently represents a hydrogen atom or a group which can be substituted with a nitrogen atom, in Formula (9), $V_{91}$ represents a hydrogen atom or a substituent, each of $R_{91}$, $R_{92}$, and $R_{93}$ independently represents a hydrogen atom or a group which can be substituted with a nitrogen atom.

12. The conductive composition according to claim 1, wherein the conductive metal fibers preferably contain silver in an amount from 50 mol % to 100 mol %.

13. The conductive composition according to claim 1, wherein an average minor-axis length of the conductive metal fibers is from 1 nm to 30 nm.

14. A conductive member comprising:
a substrate; and
a conductive layer which is disposed on the substrate and formed of the conductive composition according to claim 1.

15. The conductive member according to claim 14, further comprising, on the conductive layer, a soluble protective layer containing at least a water-soluble polymer.

16. The conductive member according to claim 14, wherein a surface resistivity of the conductive layer is from 1 Ω/square to 1,000 Ω/square.

17. The conductive member according to claim 14, wherein the conductive layer has a conductive region and a non-conductive region.

18. The conductive member according to claim 14, further comprising, between the substrate and the conductive layer, at least one intermediate layer.

19. A touch panel comprising the conductive member according to claim 14.

20. A solar cell comprising the conductive member according to claim 14.

21. A conductive member production method comprising a conductive layer formation step of forming a conductive layer by using the conductive composition according to claim 1 on a substrate,
wherein the conductive composition contains at least (a) conductive metal fibers having an average minor-axis length from 1 nm to 150 nm and (b) at least one compound selected from a compound represented by the following Formula (1), a compound represented by the following Formula (2), and a compound having a partial structure represented by the following Formula (3), Formula (1)

Formula (2)

Formula (3)
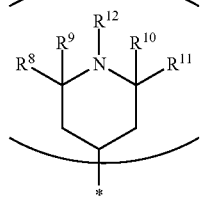

in Formula (1), each of R¹ and R² independently represents a hydrogen atom, an alkyl group, an alkenyl group, an aryl group, an acyl group, an aryloxycarbonyl group, an alkoxycarbonyl group, or a carbamoyl group, and the acyl group is a formyl group, a substituted or unsubstituted alkylcarbonyl group having 2 to 30 carbon atoms, or a substituted or unsubstituted arylcarbonyl group having 7 to 30 carbon atoms, in Formula (2), each of R³, R⁴, R⁵, and R⁶ independently represents an alkyl group having 1 to 4 carbon atoms, R⁷ represents a hydrogen atom or a substituent, and a superscript dot represents a free radical, in Formula (3), each of R⁸, R⁹, R¹⁰, and R¹¹ independently represents an alkyl group having 1 to 4 carbon atoms, and R¹² represents an alkyl group, an alkoxy group, or an acyl group, and in Formula (3), * represents a bonding site.

22. The conductive member production method according to claim 21, wherein in the conductive layer formation step, the conductive composition, which contains the (a) conductive metal fibers having an average minor-axis length from 1 nm to 150 nm and the (b) at least one compound selected from a compound represented by Formula (1), a compound represented by Formula (2), and a compound having a partial structure represented by Formula (3), is applied onto the substrate, and then (c) a matrix is applied onto the substrate so as to form a conductive layer containing the component (a), the component (b), and the component (c).

23. The conductive member production method according to claim 21, wherein in the conductive layer formation step, a conductive composition, which contains the (a) conductive metal fibers having an average minor-axis length from 1 nm to 150 nm, the (b) at least one compound selected from a compound represented by Formula (1), a compound represented by Formula (2), and a compound having a partial structure represented by Formula (3), and the (c) matrix, is applied onto the substrate so as to form a conductive layer containing the component (a), the component (b), and the component (c).

24. A conductive member production method, wherein (a) conductive metal fibers having an average minor-axis length from 1 nm to 150 nm are applied onto a substrate, and then a composition, which contains (b) at least one compound selected from a compound represented by the following Formula (1), a compound represented by the following Formula (2), and a compound having a partial structure represented by Formula (3), and (c) a matrix, is applied onto the substrate so as to form a conductive layer containing the component (a), the component (b), and the component (c),

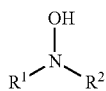

Formula (1)

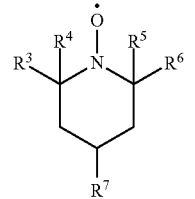

Formula (2)

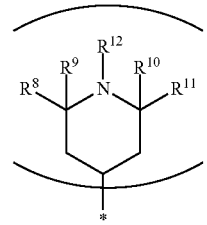

Formula (3)

in Formula (1), each of R¹ and R² independently represents a hydrogen atom, an alkyl group, an alkenyl group, an aryl group, an acyl group, an aryloxycarbonyl group, an alkoxycarbonyl group, or a carbamoyl group, and the acyl group is a formyl group, a substituted or unsubstituted alkylcarbonyl group having 2 to 30 carbon atoms, or a substituted or unsubstituted arylcarbonyl group having 7 to 30 carbon atoms, in Formula (2), each of R³, R⁴, R⁵, and R⁶ independently represents an alkyl group having 1 to 4 carbon atoms, R⁷ represents a hydrogen atom or a substituent, and a superscript dot represents a free radical, in Formula (3), each of R⁸, R⁹, R¹⁰, and R¹¹ independently represents an alkyl group having 1 to 4 carbon atoms, and R¹² represents an alkyl group, an alkoxy group, or an acyl group, and in Formula (3), * represents a bonding site.

25. A conductive member production method for producing a conductive member having a patterned conductive layer, the method comprising at least:

providing a photoresist layer to the conductive member according to claim 14 that has the substrate and the conductive layer;

forming a photoresist layer in the form of a pattern by exposing the photoresist layer to light in the form of a pattern and developing the photoresist layer; and etching the conductive layer through the photoresist layer in the form of a pattern.

26. The conductive composition according to claim 1, wherein the at least one compound (b) is selected from a compound represented by Formula (1) and a compound represented by Formula (2):

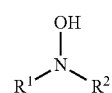

Formula (1)

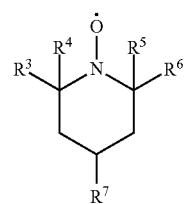

Formula (2)

in Formula (1), each of $R^1$ and $R^2$ independently represents a hydrogen atom, an alkyl group, an alkenyl group, an aryl group, an acyl group, an aryloxycarbonyl group, an alkoxycarbonyl group, or a carbamoyl group, and the acyl group is a formyl group, a substituted or unsubstituted alkylcarbonyl group having 2 to 30 carbon atoms, or a substituted or unsubstituted arylcarbonyl group having 7 to 30 carbon atoms, and in Formula (2), each of $R^3$, $R^4$, $R^5$, and $R^6$ independently represents an alkyl group having 1 to 4 carbon atoms, and $R^7$ represents a hydrogen atom or a substituent, and a superscript dot represents a free radical.

27. The conductive composition according to claim 1, wherein the at least one compound (b) is selected from a compound represented by Formula (1) and a compound represented by Formula (2):

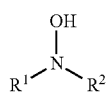

Formula (1)

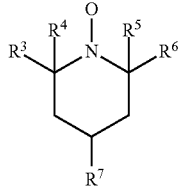

Formula (2)

in Formula (1), each of $R^1$ and $R^2$ independently represents a hydrogen atom, an alkyl group, an alkenyl group, an aryl group, an aryloxycarbonyl group, an alkoxycarbonyl group, or a carbamoyl group, and in Formula (2), each of $R^3$, $R^4$, $R^5$, and $R^6$ independently represents an alkyl group having 1 to 4 carbon atoms, and $R^7$ represents a hydrogen atom or a substituent, and a superscript dot represents a free radical.

* * * * *